US010797061B2

(12) United States Patent
Nishida et al.

(10) Patent No.: US 10,797,061 B2
(45) Date of Patent: Oct. 6, 2020

(54) THREE-DIMENSIONAL MEMORY DEVICE HAVING STRESSED VERTICAL SEMICONDUCTOR CHANNELS AND METHOD OF MAKING THE SAME

(71) Applicant: SANDISK TECHNOLOGIES LLC, Plano, TX (US)

(72) Inventors: Akio Nishida, Yokkaichi (JP); Toshihiro Iizuka, Yokkaichi (JP); Rahul Sharangpani, Fremont, CA (US); Raghuveer S. Makala, Campbell, CA (US); Adarsh Rajashekhar, Santa Clara, CA (US); Fei Zhou, San Jose, CA (US); Srikanth Ranganathan, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/221,942

(22) Filed: Dec. 17, 2018

(65) Prior Publication Data
US 2020/0194446 A1    Jun. 18, 2020

(51) Int. Cl.
*H01L 27/11582* (2017.01)
*H01L 27/11556* (2017.01)
(Continued)

(52) U.S. Cl.
CPC ...... *H01L 27/11556* (2013.01); *H01L 21/324* (2013.01); *H01L 21/8239* (2013.01);
(Continued)

(58) Field of Classification Search
CPC ..... H01L 21/823418; H01L 21/823425; H01L 21/823487; H01L 21/8239;
(Continued)

(56) References Cited

U.S. PATENT DOCUMENTS 5,915,167 A    6/1999 Leedy
6,274,490 B1    8/2001 Chyan et al.
(Continued)

OTHER PUBLICATIONS

Sharangpani, R. et al., "Three-Dimensional Memory Device Having Stressed Vertical Semiconductor Channels and Method of Making the Same," U.S. Appl. No. 16/221,894, filed Dec. 17, 2018.
(Continued)

*Primary Examiner* — Stephen W Smoot
(74) *Attorney, Agent, or Firm* — The Marbury Law Group PLLC

(57) ABSTRACT

Three-dimensional memory devices include structures that induce a vertical tensile stress in vertical semiconductor channels to enhance charge carrier mobility. Vertical tensile stress may be induced by a laterally compressive stress applied by stressor pillar structure. The stressor pillar structures can include a stressor material such as a dielectric metal oxide material, silicon nitride, thermal silicon oxide or a semiconductor material having a greater lattice constant than that of the channel. Vertical tensile stress may be induced by a compressive stress applied by electrically conductive layers that laterally surround the vertical semiconductor channel, or by a stress memorization technique that captures a compressive stress from sacrificial material layers. Vertical tensile stress can be generated by a source-level pinning layer that prevents vertical expansion of the vertical semiconductor channel. Vertical tensile stress can be induced by using a layer stack including polysilicon and a silicon-germanium alloy for the vertical semiconductor channel.

8 Claims, 73 Drawing Sheets

(51) Int. Cl.
*H01L 27/11524* (2017.01)
*H01L 27/1157* (2017.01)
*H01L 27/11519* (2017.01)
*H01L 29/08* (2006.01)
*H01L 29/10* (2006.01)
*H01L 21/324* (2006.01)
*H01L 27/11565* (2017.01)
*H01L 21/8239* (2006.01)
*H01L 21/8234* (2006.01)
H01L 27/11573 (2017.01)
H01L 27/11529 (2017.01)

(52) U.S. Cl.
CPC ............... *H01L 21/823418* (2013.01); *H01L 21/823487* (2013.01); *H01L 27/1157* (2013.01); *H01L 27/11519* (2013.01); *H01L 27/11524* (2013.01); *H01L 27/11565* (2013.01); *H01L 27/11582* (2013.01); *H01L 29/0847* (2013.01); *H01L 29/1037* (2013.01); H01L 27/11529 (2013.01); H01L 27/11573 (2013.01)

(58) Field of Classification Search
CPC ......... H01L 27/11524; H01L 27/11556; H01L 27/1157; H01L 27/11582; H01L 29/0847; H01L 29/1037
See application file for complete search history.

(56) References Cited

U.S. PATENT DOCUMENTS

| | | | |
|---|---|---|---|
| 6,372,569 B1 | 4/2002 | Lee et al. | |
| 6,677,213 B1 | 1/2004 | Ramkumar et al. | |
| 6,777,274 B2 | 8/2004 | Moon et al. | |
| 6,833,306 B2 | 12/2004 | Lyding et al. | |
| 6,881,994 B2 | 4/2005 | Lee et al. | |
| 7,005,350 B2 | 2/2006 | Walker et al. | |
| 7,012,299 B2 | 3/2006 | Mahajani et al. | |
| 7,202,119 B2 | 4/2007 | Yamazaki et al. | |
| 8,187,936 B2 | 5/2012 | Alsmeier et al. | |
| 8,829,593 B2 | 9/2014 | Sekine et al. | |
| 8,884,357 B2 | 11/2014 | Wang et al. | |
| 8,946,023 B2 | 2/2015 | Makala et al. | |
| 9,023,719 B2 | 5/2015 | Pachamuthu et al. | |
| 9,136,130 B1 | 9/2015 | Wada et al. | |
| 9,177,966 B1 | 11/2015 | Rabkin et al. | |
| 9,230,980 B2 | 1/2016 | Rabkin et al. | |
| 9,230,987 B2 | 1/2016 | Pachamuthu et al. | |
| 9,305,932 B2 | 4/2016 | Kanakamedala et al. | |
| 9,331,093 B2 | 5/2016 | Rabkin et al. | |
| 9,356,031 B2 | 5/2016 | Lee et al. | |
| 9,425,299 B1 | 8/2016 | Rabkin et al. | |
| 9,449,980 B2 | 9/2016 | Rabkin | |
| 9,449,983 B2 | 9/2016 | Yada et al. | |
| 9,460,931 B2 | 10/2016 | Pachamuthu et al. | |
| 9,478,495 B1 | 10/2016 | Pachamuthu et al. | |
| 9,502,471 B1 | 11/2016 | Lu et al. | |
| 9,570,463 B1 | 2/2017 | Zhang et al. | |
| 9,576,975 B2 | 2/2017 | Zhang et al. | |
| 9,627,395 B2 | 4/2017 | Zhang et al. | |
| 9,627,403 B2 | 4/2017 | Liu et al. | |
| 9,691,884 B2 | 6/2017 | Makala et al. | |
| 9,698,153 B2 | 7/2017 | Liu et al. | |
| 9,728,551 B1 | 8/2017 | Lu et al. | |
| 9,780,108 B2 | 10/2017 | Rabkin et al. | |
| 9,853,043 B2 | 12/2017 | Lu et al. | |
| 9,876,025 B2 | 1/2018 | Rabkin et al. | |
| 9,941,295 B2 | 4/2018 | Rabkin et al. | |
| 10,008,570 B2 | 6/2018 | Yu et al. | |
| 10,121,794 B2 | 11/2018 | Gunji-Yoneoka et al. | |
| 10,553,599 B1* | 2/2020 | Chen | H01L 27/11519 |
| 10,559,588 B2* | 2/2020 | Dong | H01L 29/2003 |
| 2003/0047755 A1 | 3/2003 | Lee et al. | |
| 2003/0122204 A1 | 7/2003 | Nomoto et al. | |
| 2003/0155582 A1 | 8/2003 | Mahajani et al. | |
| 2003/0219933 A1 | 11/2003 | Yamauchi et al. | |
| 2004/0041192 A1 | 3/2004 | Baker | |
| 2004/0063286 A1 | 4/2004 | Kim et al. | |
| 2004/0125629 A1 | 7/2004 | Scheuerlein et al. | |
| 2004/0251488 A1 | 12/2004 | Fujiwara et al. | |
| 2005/0062098 A1 | 3/2005 | Mahajani et al. | |
| 2008/0012065 A1 | 1/2008 | Kumar | |
| 2009/0321855 A1 | 12/2009 | Ashutosh et al. | |
| 2010/0109071 A1 | 5/2010 | Tanaka et al. | |
| 2011/0045657 A1 | 2/2011 | Kim et al. | |
| 2011/0287612 A1 | 11/2011 | Lee et al. | |
| 2012/0023894 A1 | 2/2012 | Martin | |
| 2012/0068247 A1 | 3/2012 | Lee et al. | |
| 2012/0276702 A1 | 11/2012 | Yang et al. | |
| 2013/0009236 A1 | 1/2013 | Lee et al. | |
| 2013/0089974 A1 | 4/2013 | Lee et al. | |
| 2013/0134492 A1 | 5/2013 | Yang et al. | |
| 2014/0225160 A1 | 8/2014 | Clifton et al. | |
| 2014/0225181 A1 | 8/2014 | Makala et al. | |
| 2014/0264525 A1 | 9/2014 | Takahashi et al. | |
| 2015/0129954 A1 | 5/2015 | Kim et al. | |
| 2015/0179660 A1 | 6/2015 | Yada et al. | |
| 2016/0049421 A1 | 2/2016 | Zhang et al. | |
| 2016/0099250 A1 | 4/2016 | Rabkin et al. | |
| 2016/0118391 A1 | 4/2016 | Zhao et al. | |
| 2016/0141294 A1 | 5/2016 | Peri et al. | |
| 2016/0181264 A1 | 6/2016 | Miyamoto et al. | |
| 2016/0260733 A1* | 9/2016 | Lue | H01L 27/11582 |
| 2016/0358933 A1 | 12/2016 | Rabkin et al. | |
| 2017/0062454 A1 | 3/2017 | Lu et al. | |
| 2017/0110464 A1 | 4/2017 | Rabkin et al. | |
| 2017/0110470 A1 | 4/2017 | Rabkin et al. | |
| 2017/0162591 A1* | 6/2017 | Choi | H01L 27/11582 |
| 2017/0229472 A1 | 8/2017 | Lu et al. | |
| 2017/0338243 A1* | 11/2017 | Sohn | H01L 27/11524 |
| 2017/0365613 A1 | 12/2017 | Gunji-Yoneoka et al. | |
| 2018/0122906 A1 | 5/2018 | Yu et al. | |
| 2019/0252405 A1* | 8/2019 | Tsutsumi | G11C 16/0466 |
| 2019/0326313 A1* | 10/2019 | Cui | H01L 27/11519 |

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).

Petti, L. et al., "Metal Oxide Semiconductor Thin-Film Transistors for Flexible Electronics," http://sro.sussex.ac.uk/61869/, Applied Physics Reviews, vol. 3, No. 2, pp. 1-57, (2016).

Billah, M.M. et al., "Effect of Tensile and Compressive Bending Stress on Electrical Performance of Flexible a-IGZO TFTs," IEEE Electron Device Letters, vol. 38, No. 7, pp. 890-893, (2017).

Ortolland, C. et al., "Stress Memorization Technique-Fundamental Understanding and Low-Cost Integration for Advanced CMOS Technology Using a Nonselective Process," IEEE Transactions on Electron Devices, vol. 56, No. 8, pp. 1690-1697, (.2009).

Lee, W. et al., "Mobility enhancement of strained Si transistors by transfer printing on plastic substrates," NPG Asia Materials (2016), No. 8, e256; doi:10.1038/am.2016.31, pp. 1-7, (2016).

MacKenzie, K.D. et al., "Stress Control of Si-Based PECVD Dielectrics," Invited Paper Presented at 207th Electrochemical Society Meeting, Quebec City Canada, May 2005, Proc. Symp. Silicon Nitride and Silicon Dioxide Thin Insulating Films & Other Emerging Dielectrics VIII, PV2005-01, pp. 148-159, (2005).

Toledano-Luque, M. et al., "Quantitative and Predictive Model of Reading Current Variability in Deeply Scaled Vertical Poly-Sci Channel for 3D Memories," IEEE, IEDM 12-203 to 12-206 and 9.2.1 to 9.2.4, (2012).

Chen, T.S. et al., "Performance Improvement of SONOS Memory by Bandgap Engineering of Charge-Trapping Layer," IEEE Electron Device Letters, vol. 25, No. 4, pp. 205-207, (2004).

Wu, K.H. et al., "SONOS Device With Tapered Bandgap Nitride Layer," IEEE Transactions on Electron Devices, vol. 52, No. 5, pp. 987-992, (2005).

(56) References Cited

OTHER PUBLICATIONS

Wu, K.H. et al., "PhenomenalSONOS Performance for Next-Generation Flash Memories," Semiconductor Lab, Chung-Cheng Institute of Technology, National Defense University, Taiwan and National Nano-Device Lab Taiwan, pp. 35-40.

Evtukh, A.A. et al., "The Multilayer Silicon Nitride Films as a Media for Charge Storagein MNOS Structures," IEEE *Xplore* 2.0, Nonvolatile Memory Technology Conference, 1996, Sixth Biennial IEEE International, Jun. 24-26, 1996, Abstract Only.

Johnson, N. M. et al, "Deuterium Passivation of Grain-Boundary Dangling Bonds in Silicon Thin Film", *Applied Physics Letters,* vol. 40, pp. 882-884, (1982).

Choi, S. et al., "High-Pressure Deuterium Annealing for Improving the Reliability Characteristics of SONOS Nonvolatile Memory Devices", *Applied Physics Letters,* vol. 85, pp. 6415-6417, (2004).

Chang, M. et al., "Impact of High-Pressure Deuterium Oxide Annealing on the Blocking Efficiency and Interface Quality of MANOS-Type Flash Memory Devices", *Applied Physics Letters,* vol. 91, p. 192111, (2007).

Hammond, M. L., "Silicon Epitaxy by Chemical Vapor Deposition," pp. 45-106 in Handbook of Thin-Film Deposition Processes and Techniques Principles, Methods, Equipment and Applications Second Edition Edited by Krishna Seshan (2002).

Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).

Bu, J. et al., "Design Considerations in Scaled SONOS Nonvolatile Memory Devices," Solid State Electronics, Elsevier Science Publishers, vol. 45, No. 1, pp. 113-120, XP004313662, (2001).

Yelundur, et al., "Beneficial Impact of Low Frequency PECVD SIN X:H-Induced Hydrogenation in High-Efficiency String Ribbon Silicon Solar Cells," Nineteenth European Photovoltaic Solar Energy Conference: Proceedings of the International Conference Held in Paris, France, 4 sheets, (2004).

U.S. Appl. No. 15/626,444, filed Jun. 19, 2017, SanDisk Technologies LLC.

U.S. Appl. No. 15/632,983, filed Jun. 26, 2017, SanDisk Technologies LLC.

U.S. Appl. No. 15/951,916, filed Apr. 12, 2018, SanDisk Technologies LLC.

U.S. Appl. No. 15/982,266, filed May 17, 2018, SanDisk Technologies LLC.

U.S. Appl. No. 16/021,899, filed Jun. 28, 2018, SanDisk Technologies LLC.

U.S. Appl. No. 16/024,048, filed Jun. 29, 2018, SanDisk Technologies LLC.

U.S. Appl. No. 16/200,115, filed Nov. 26, 2018, SanDisk Technologies LLC.

Notification of Transmittal of the International Search Report and Written Opinion of the International Search Authority for International Patent Application No. PCT/US2019/048170, dated Dec. 2, 2019, 14 pages.

\* cited by examiner

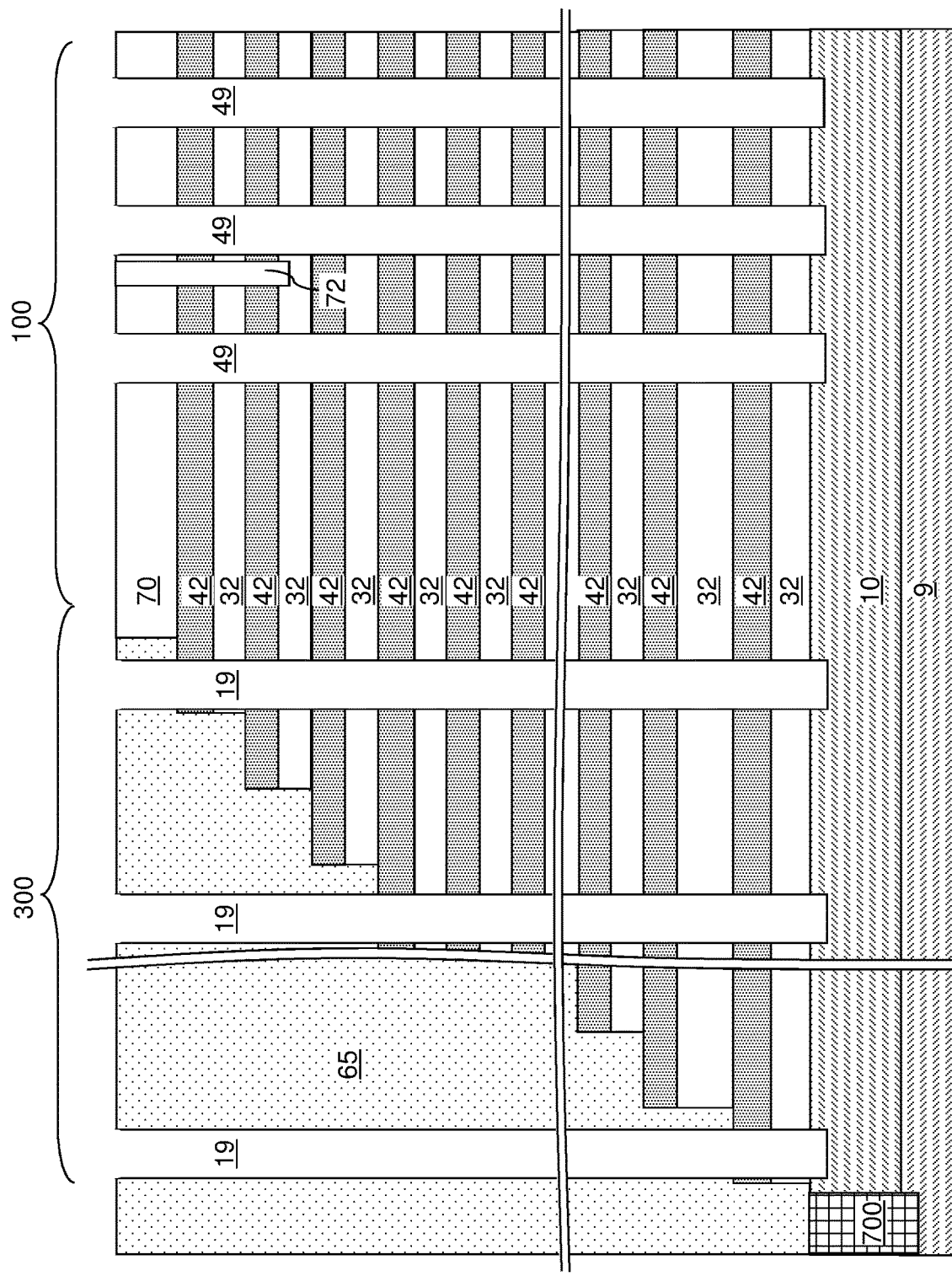

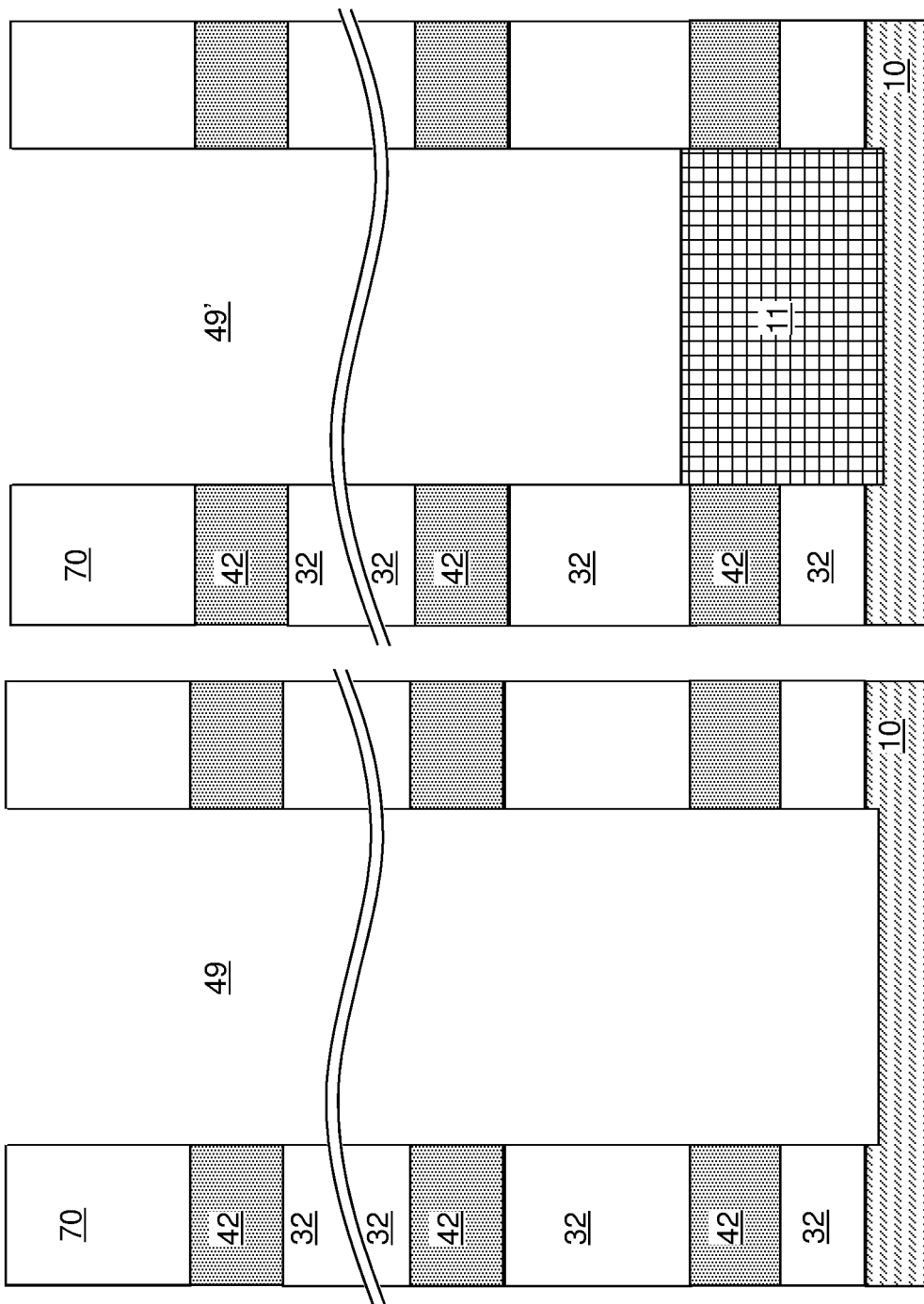

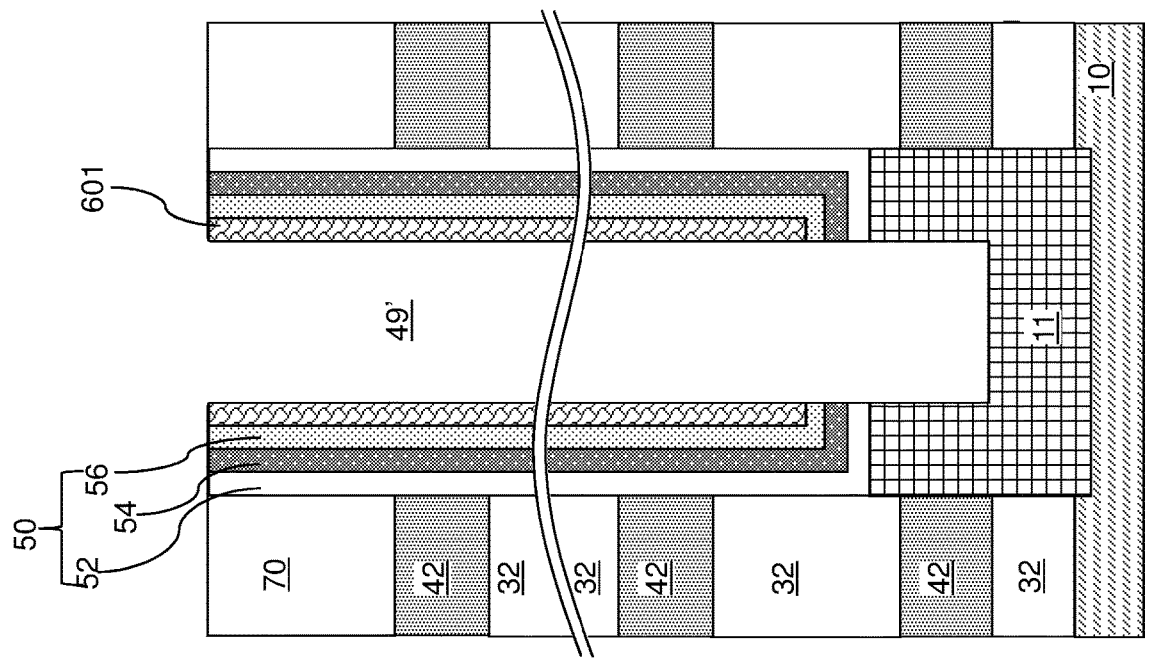
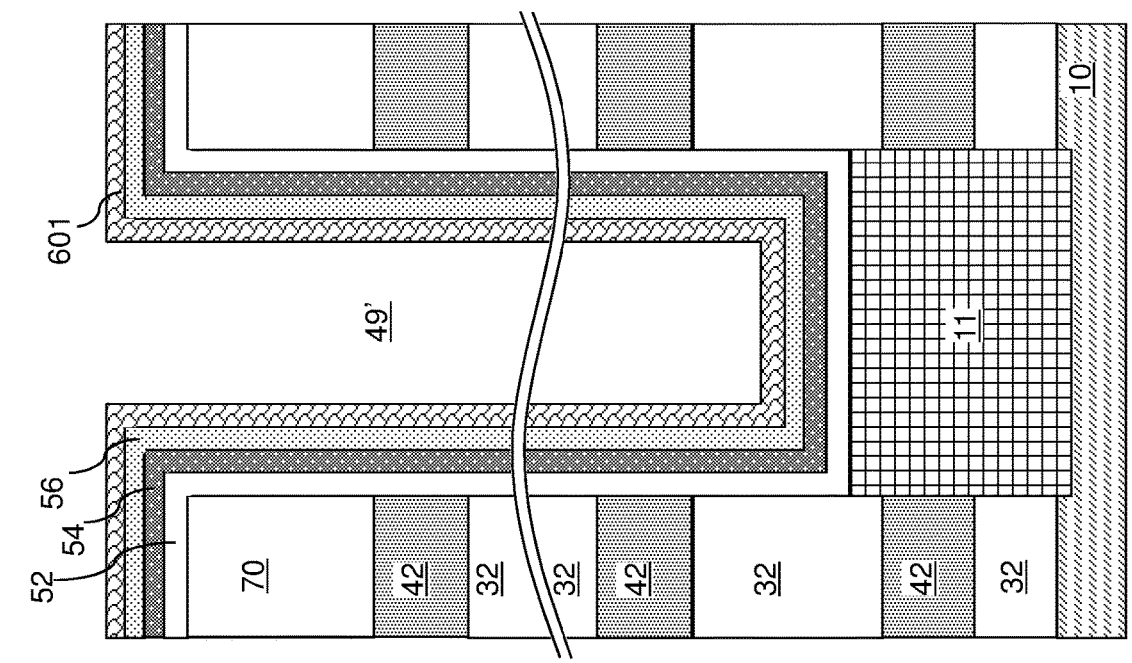

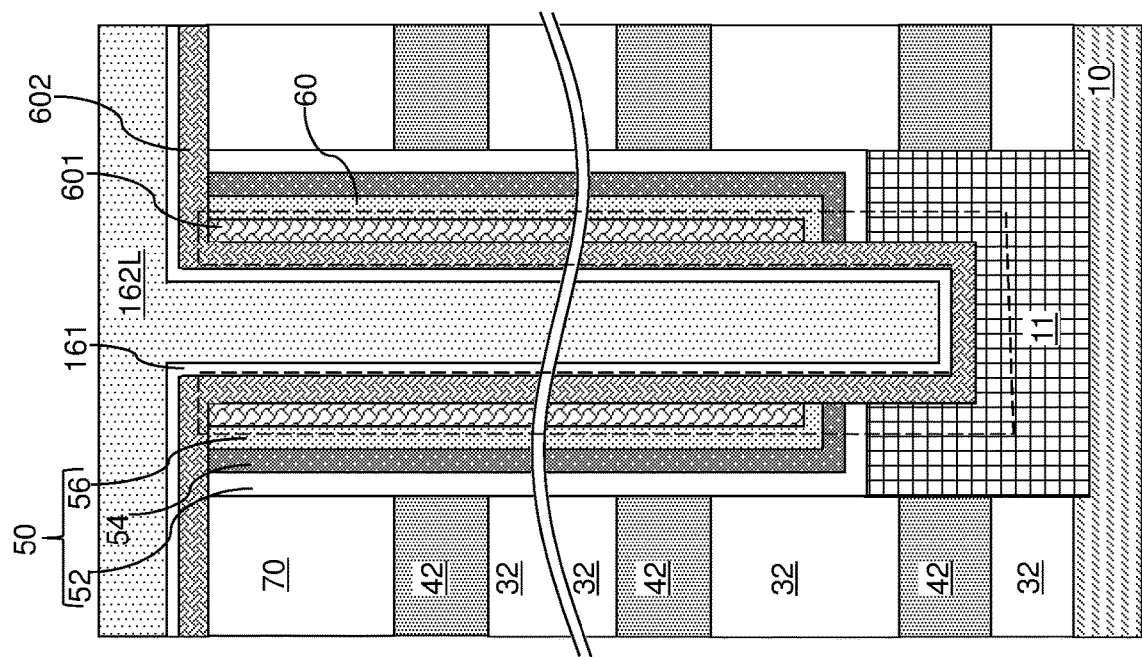
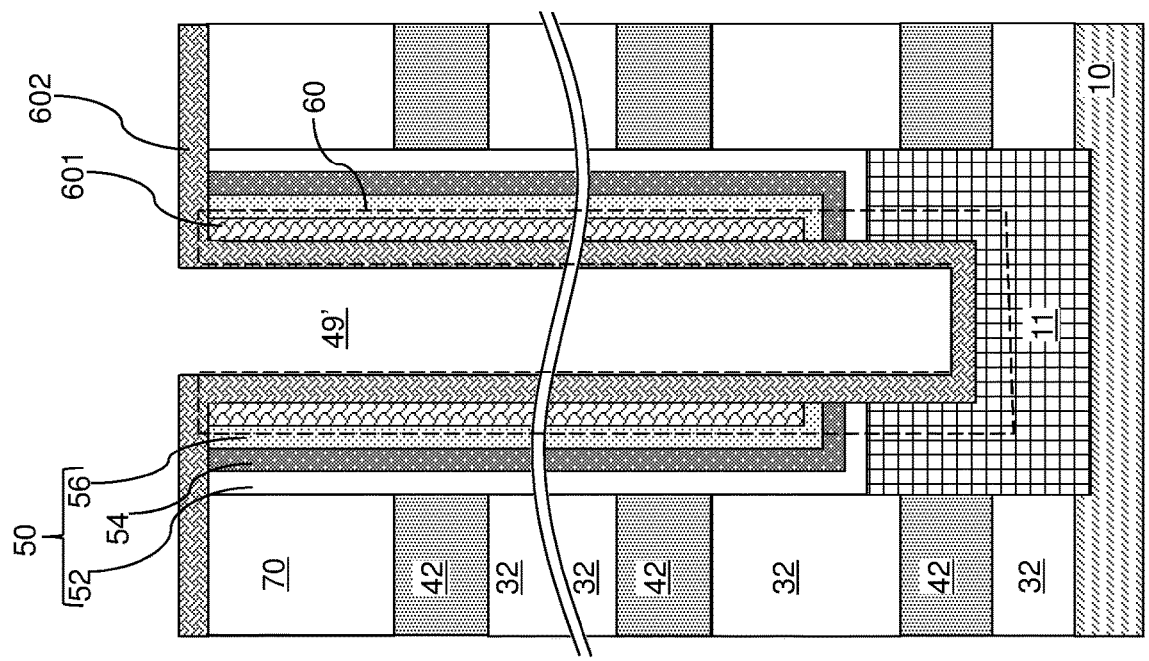

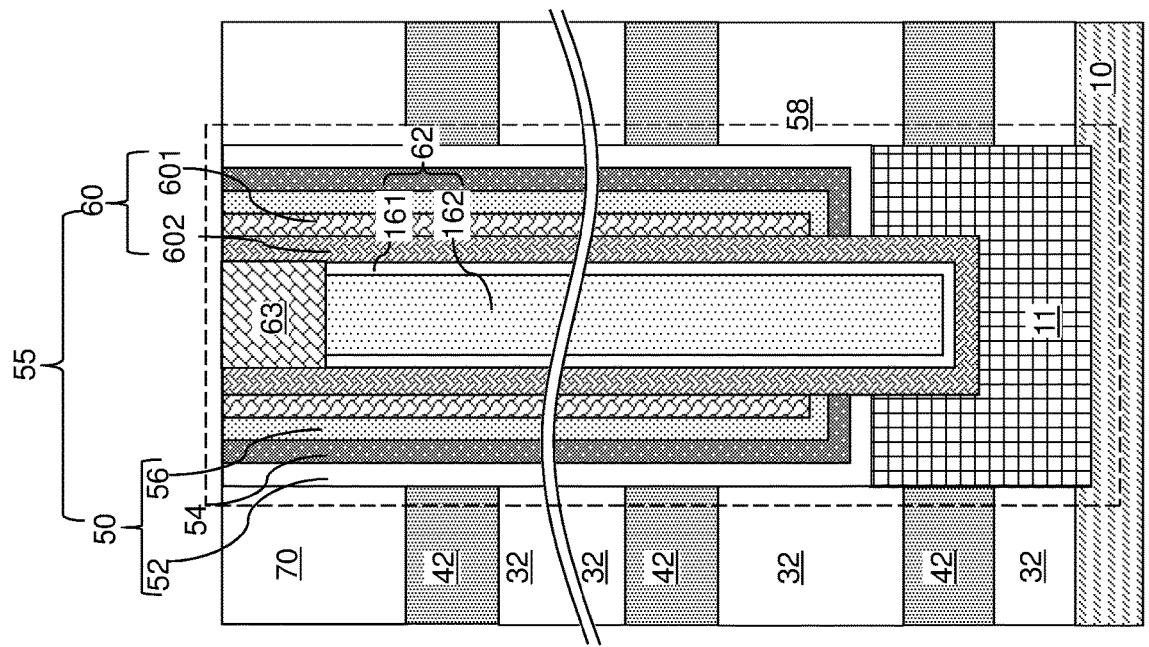
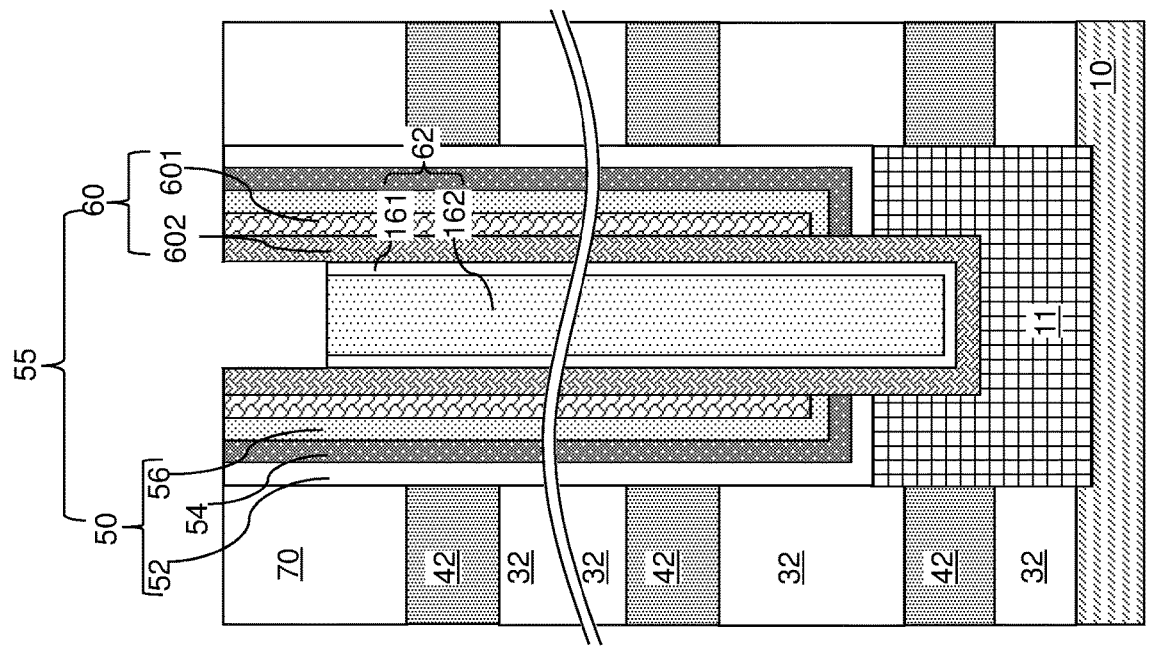

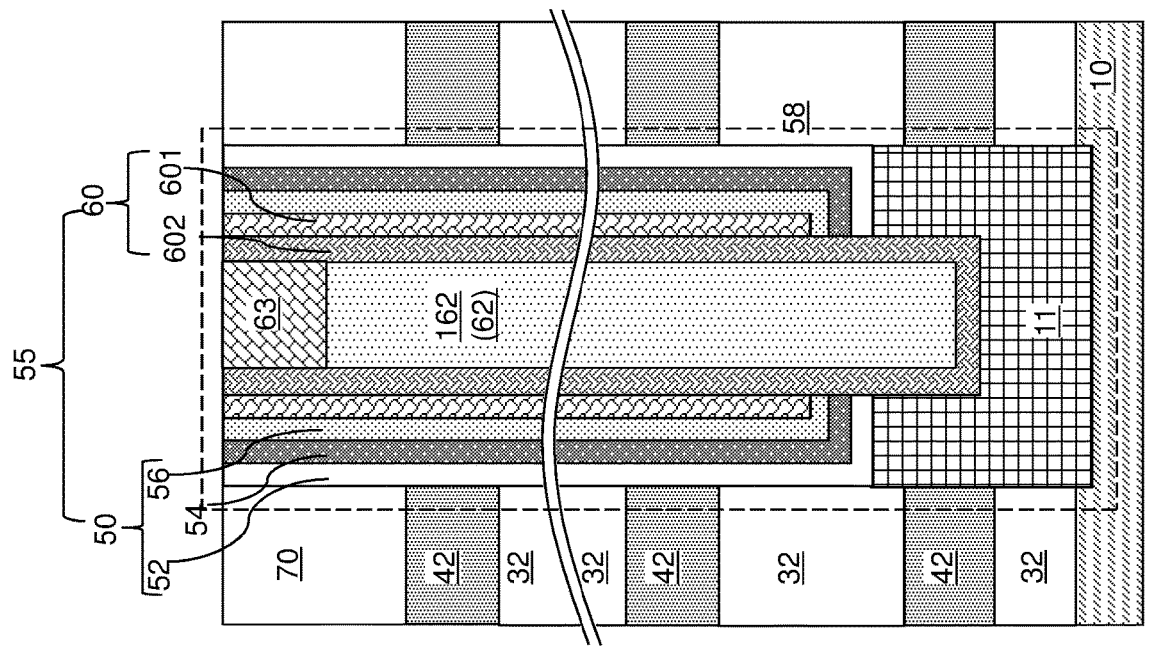
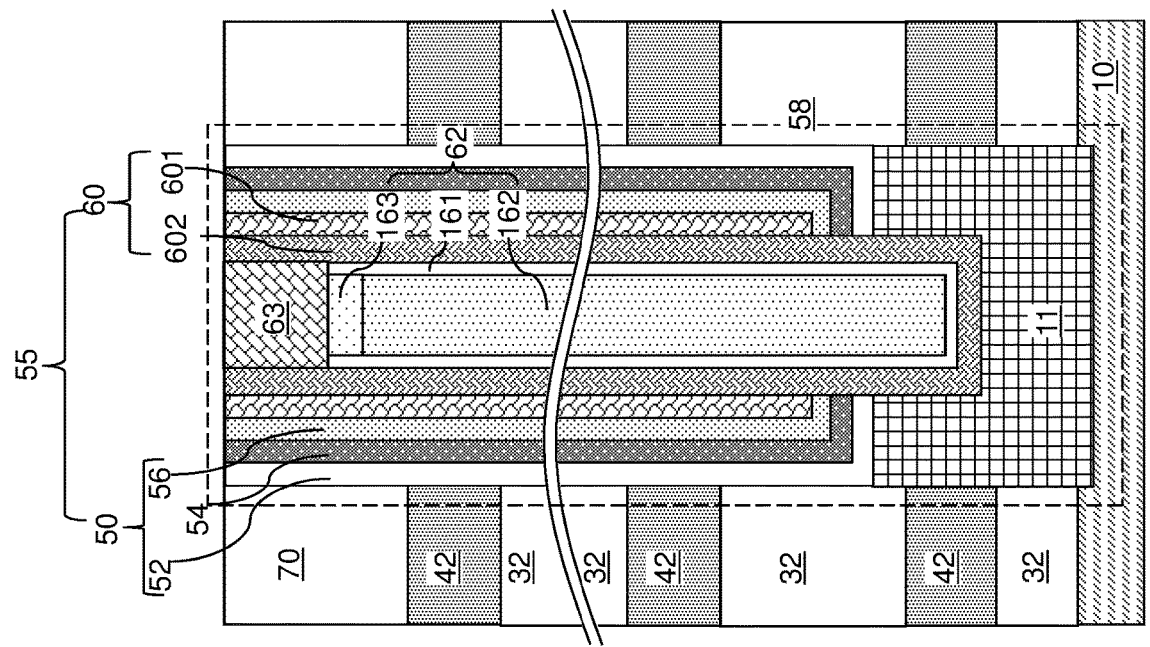

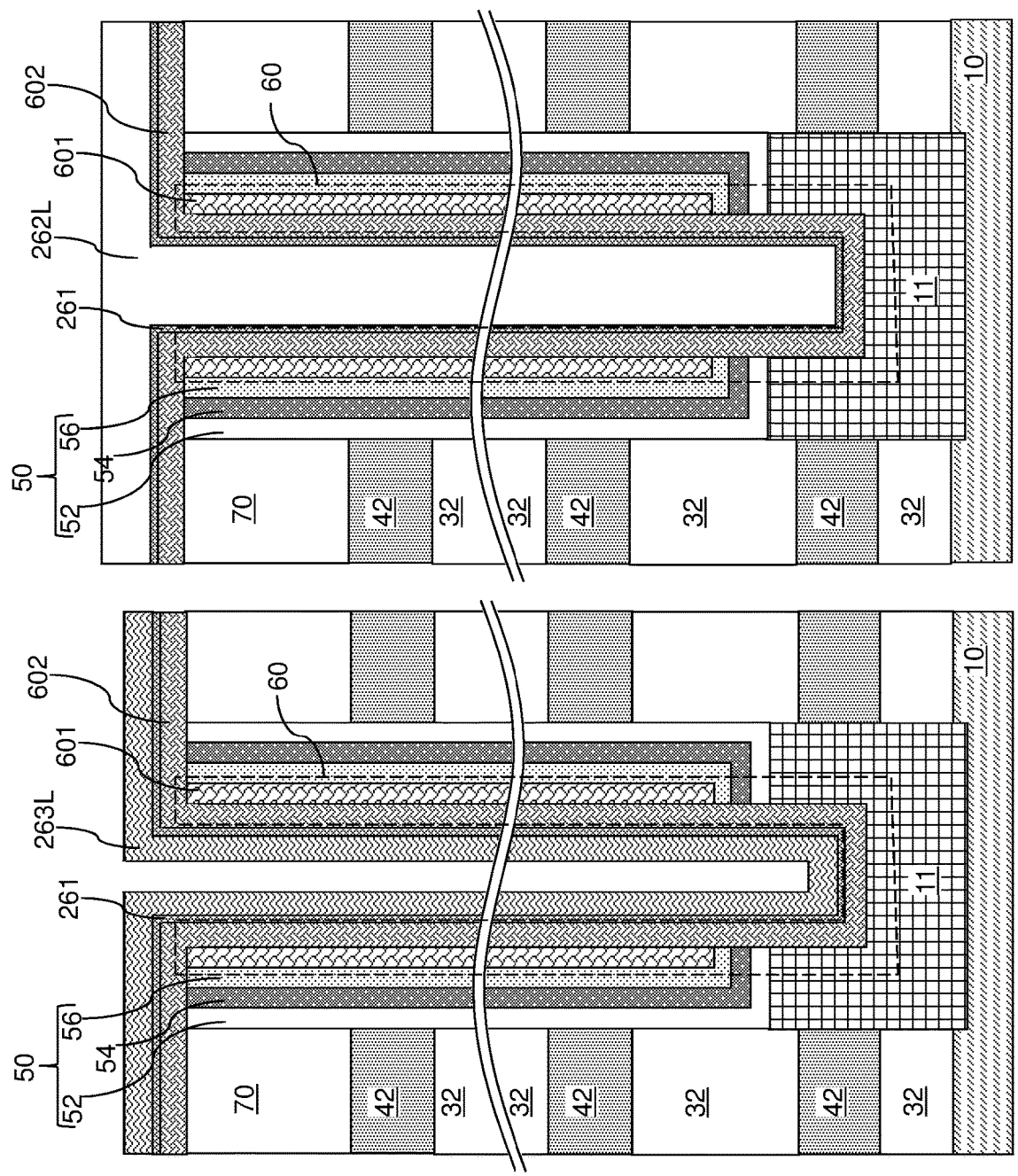

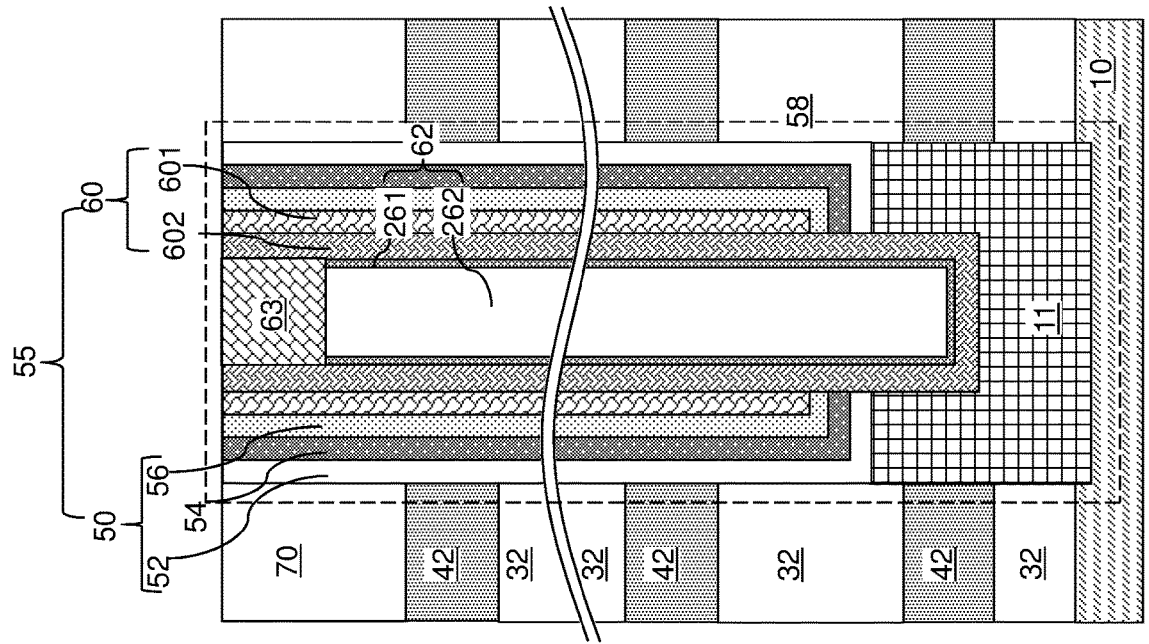
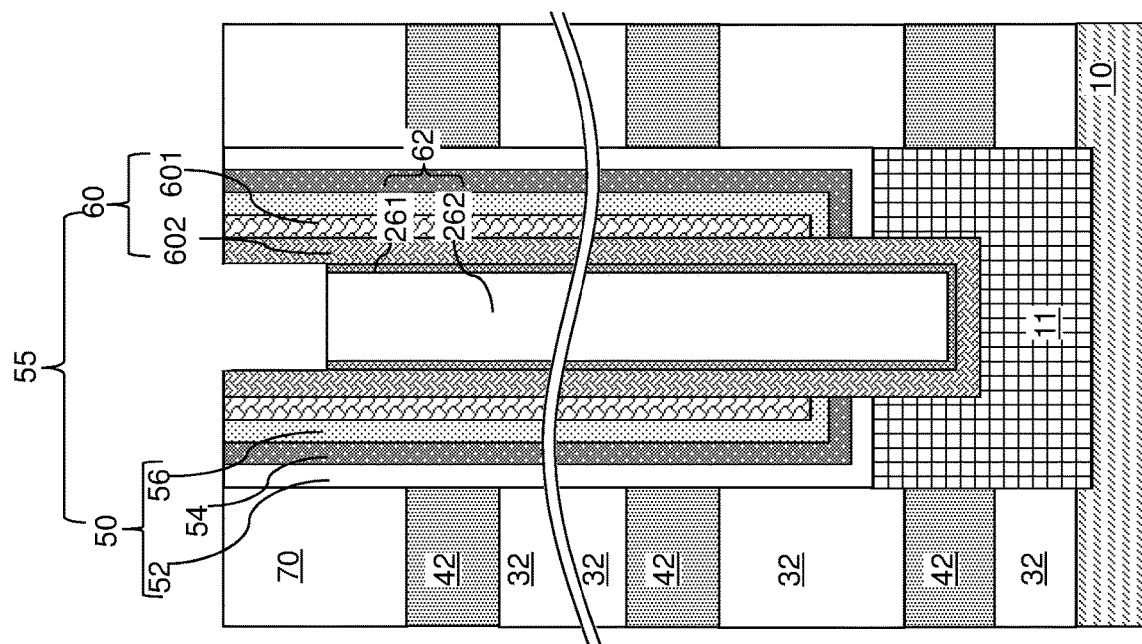

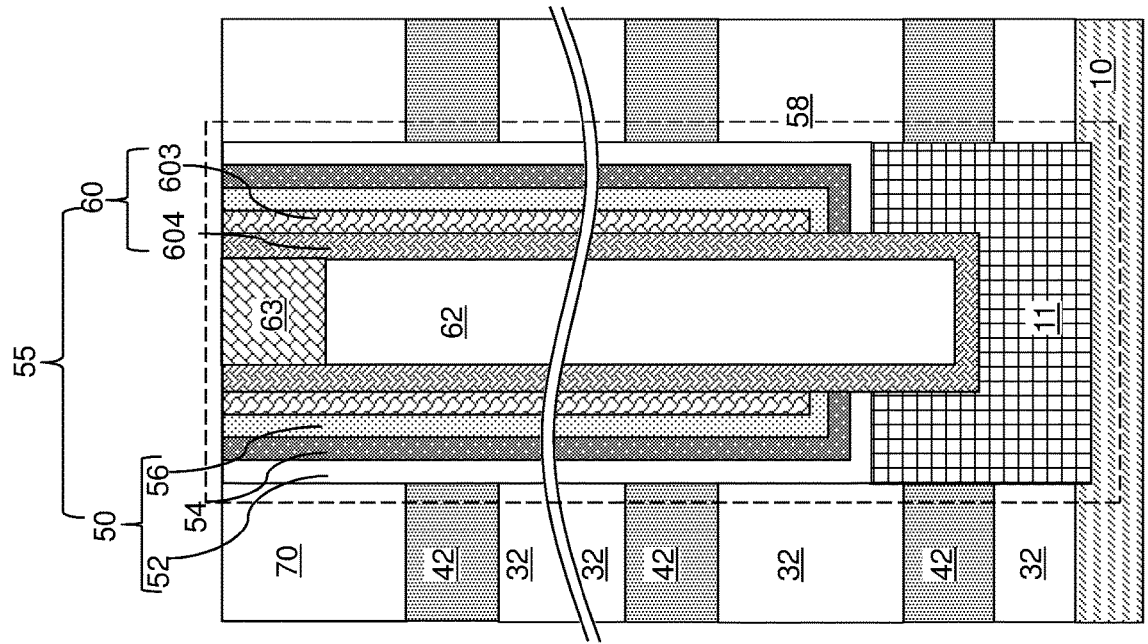
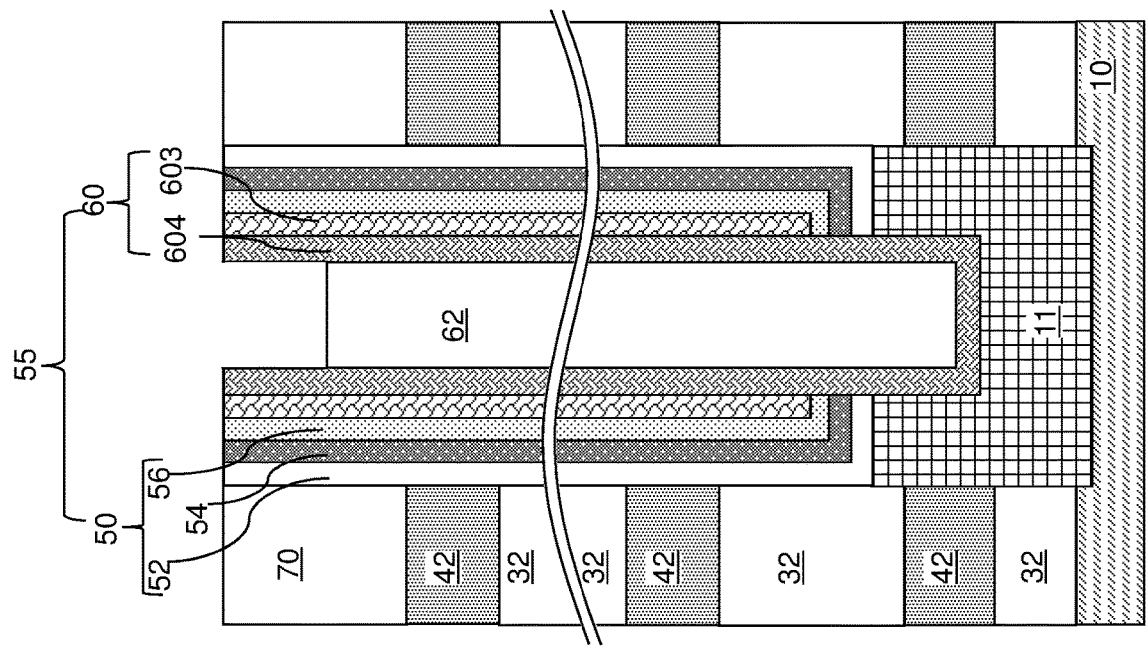
FIG. 9D
FIG. 9C

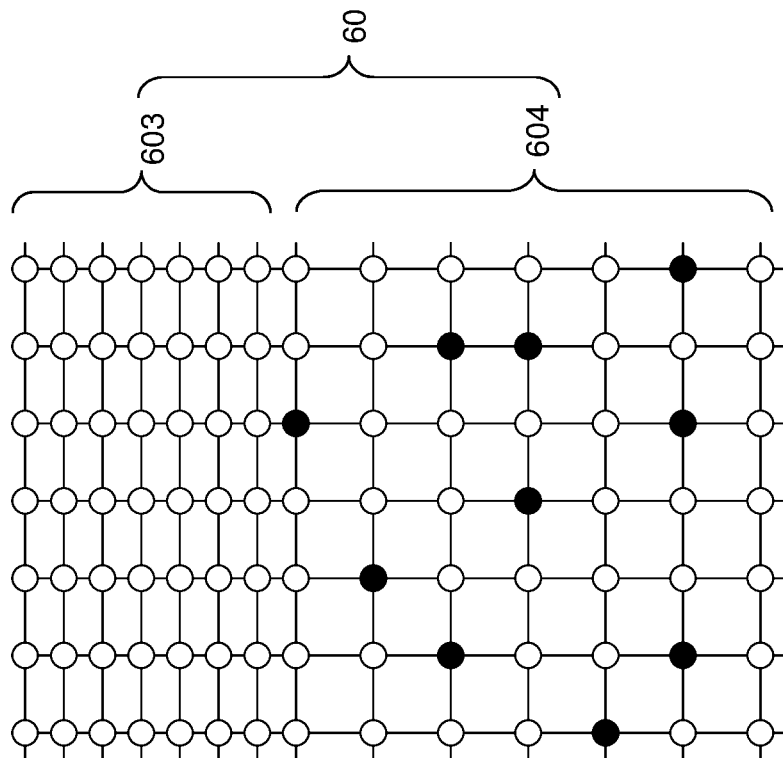
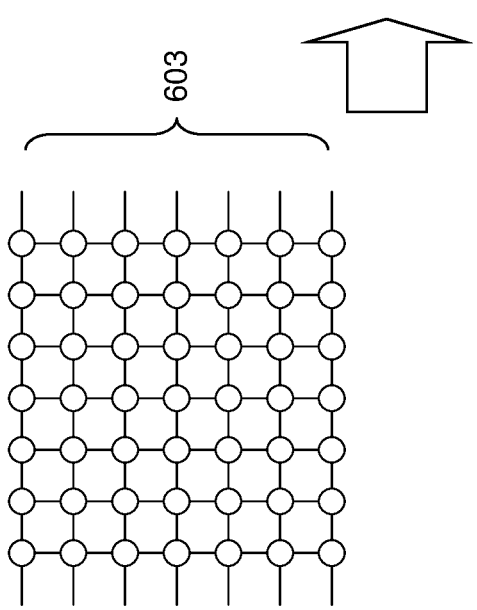
FIG. 9E

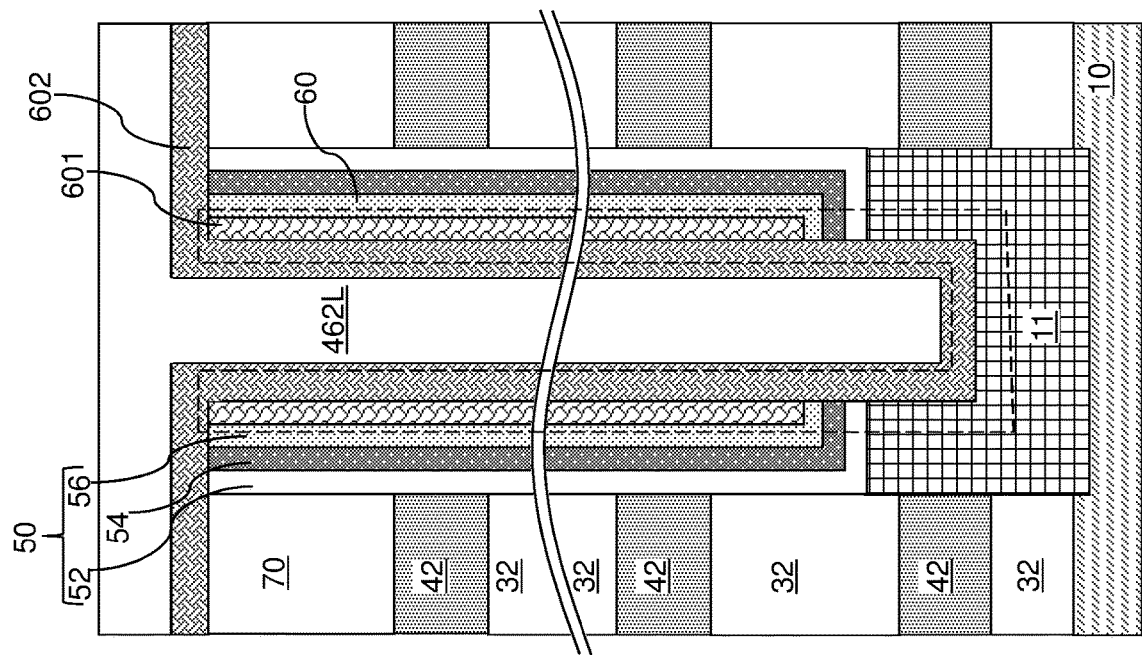
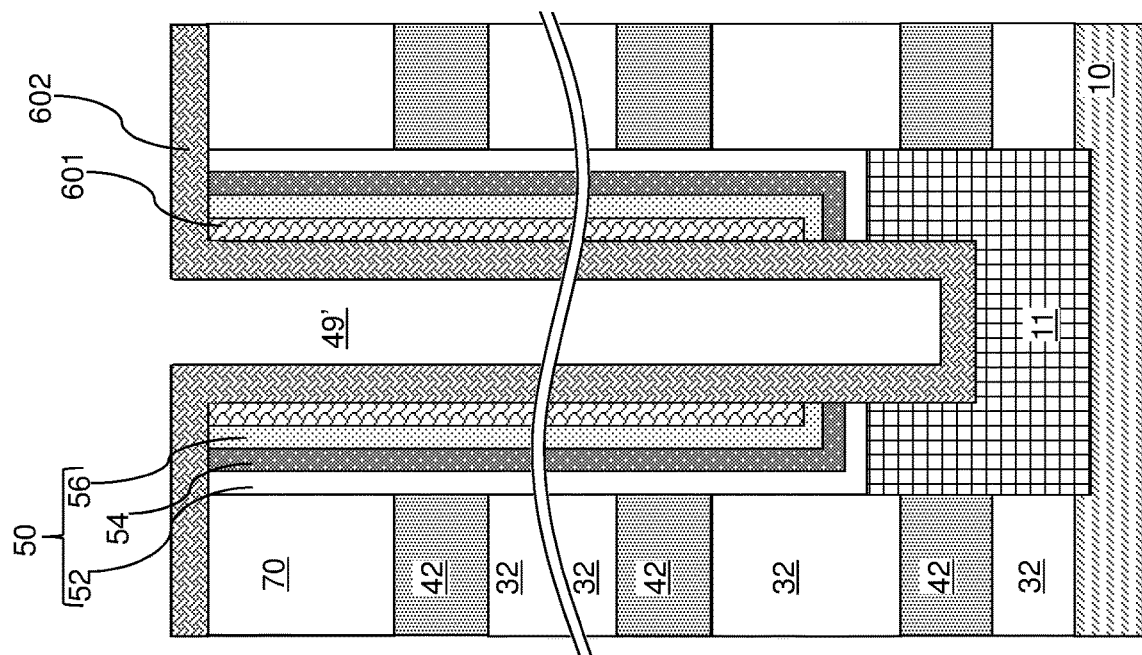

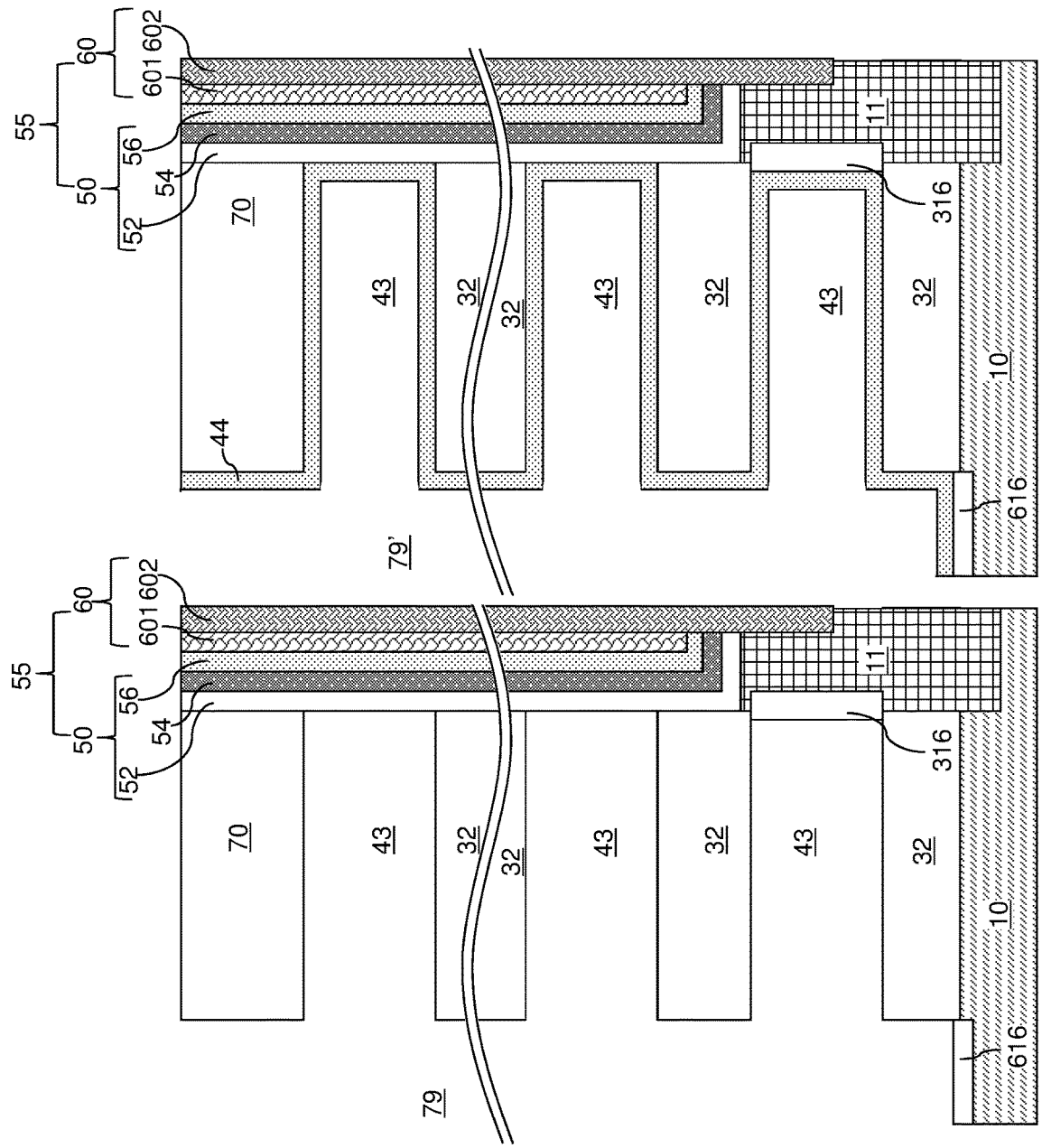

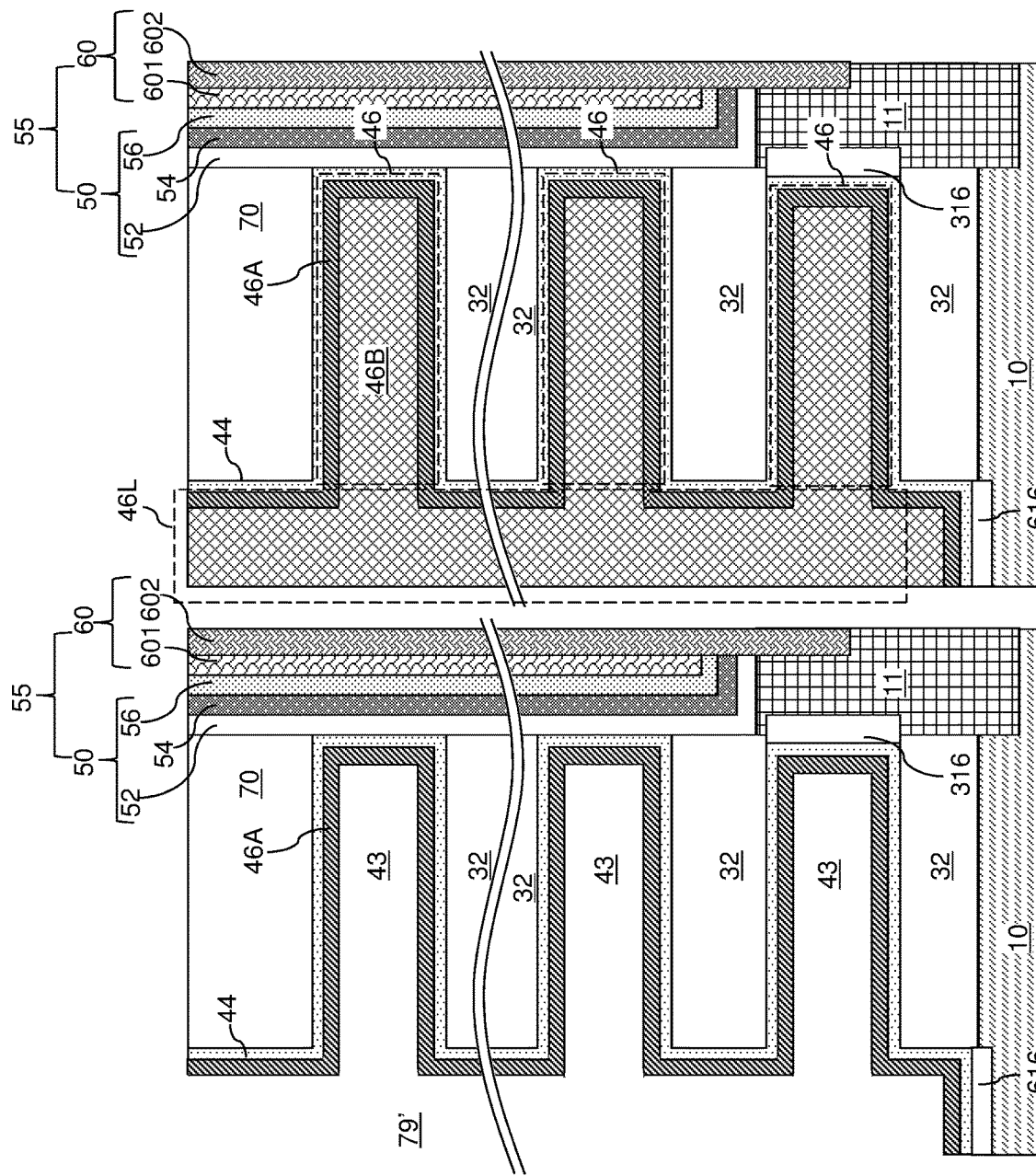

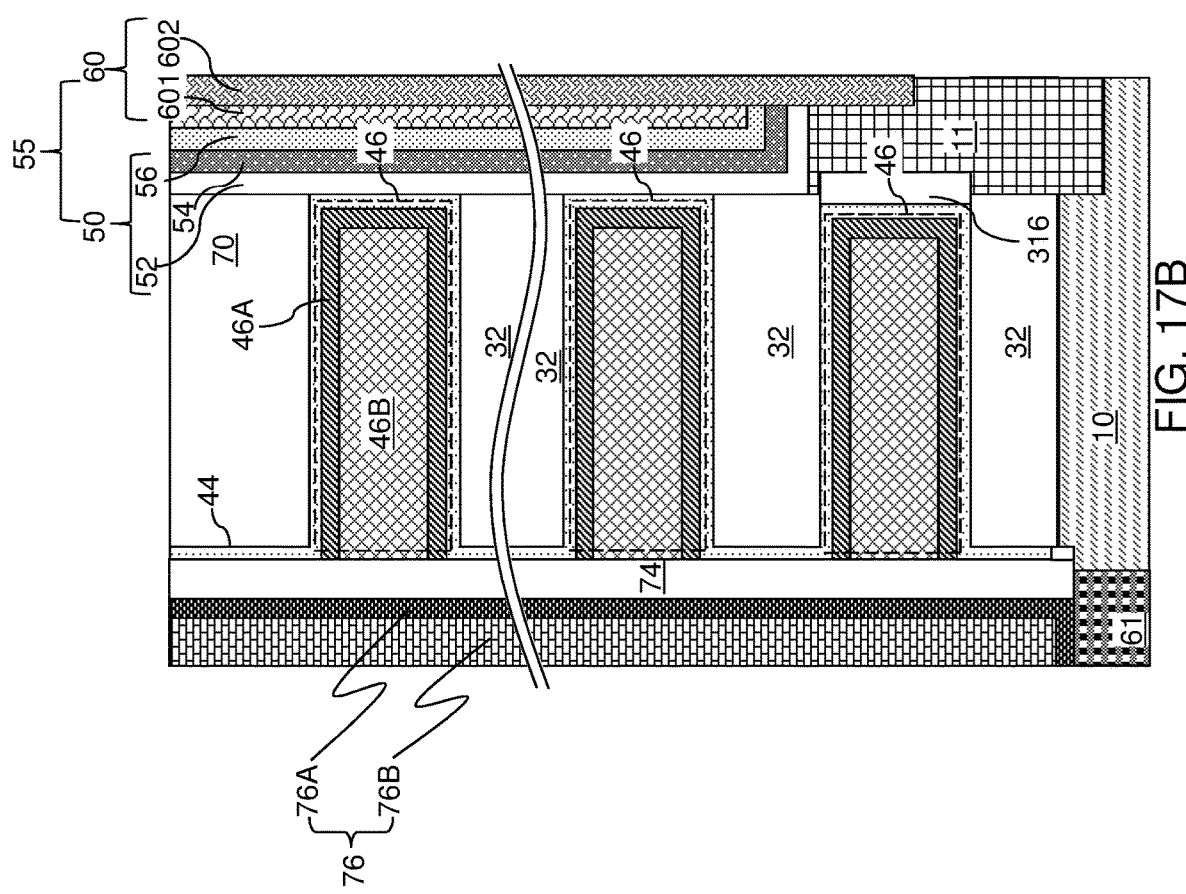

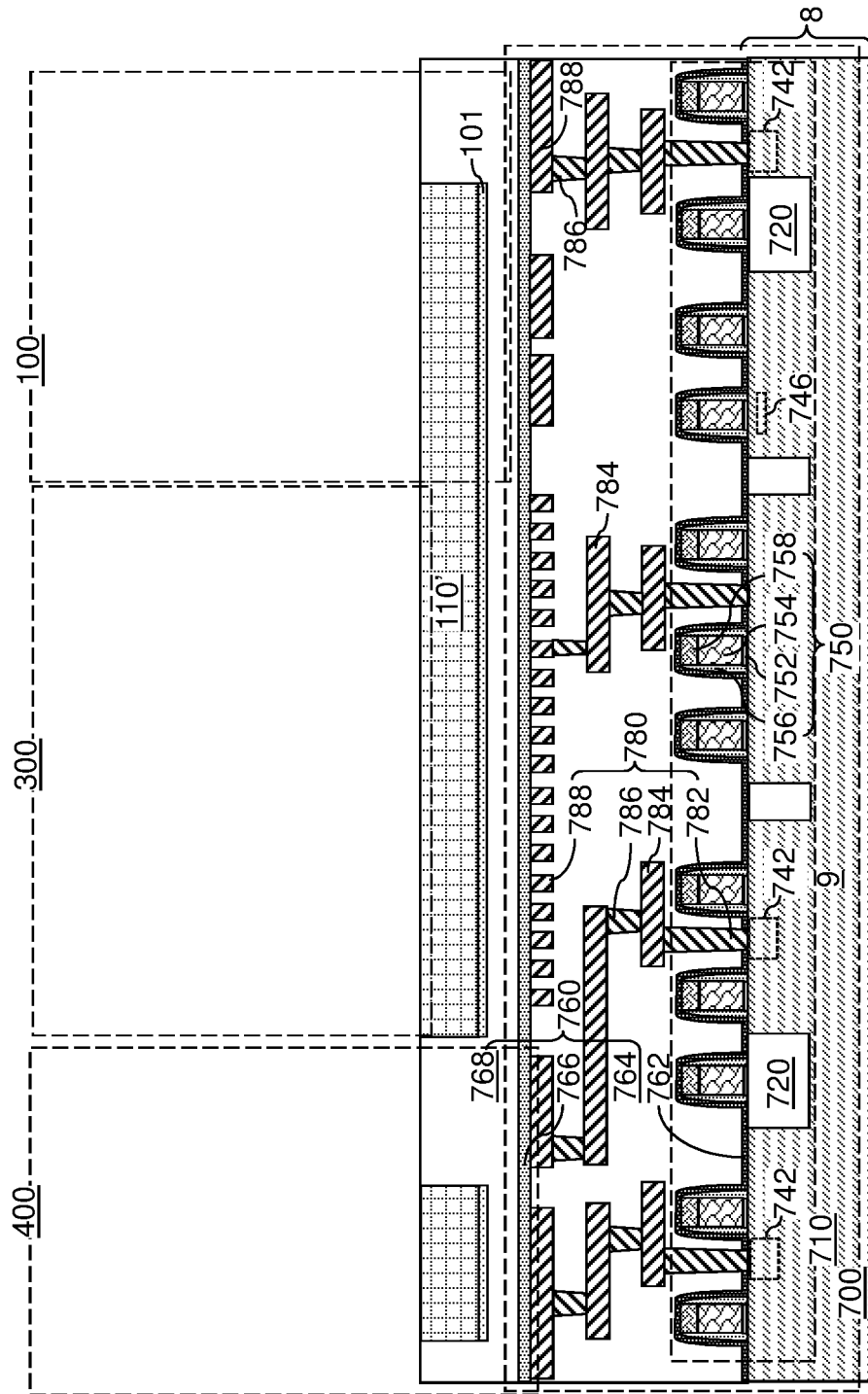

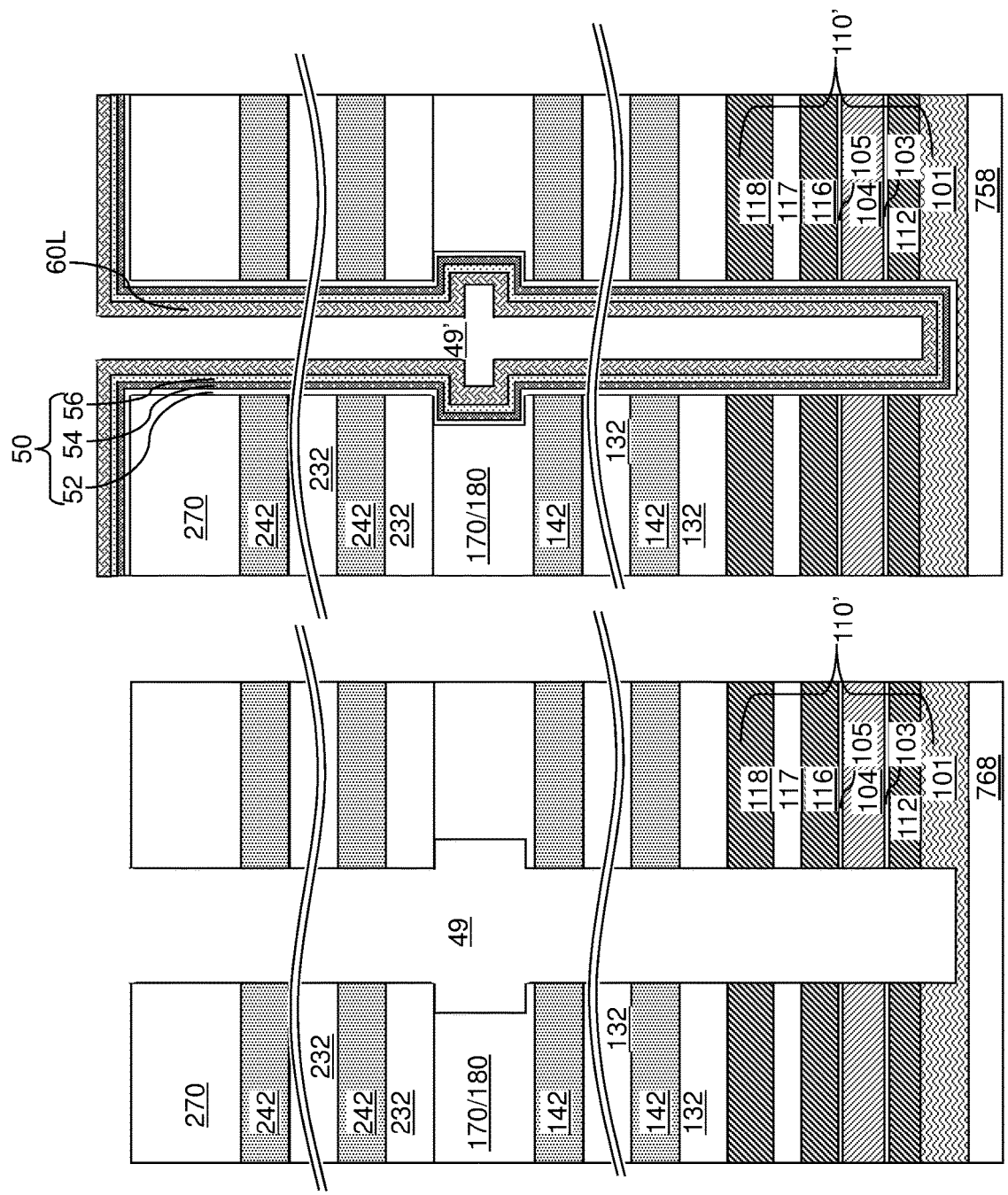

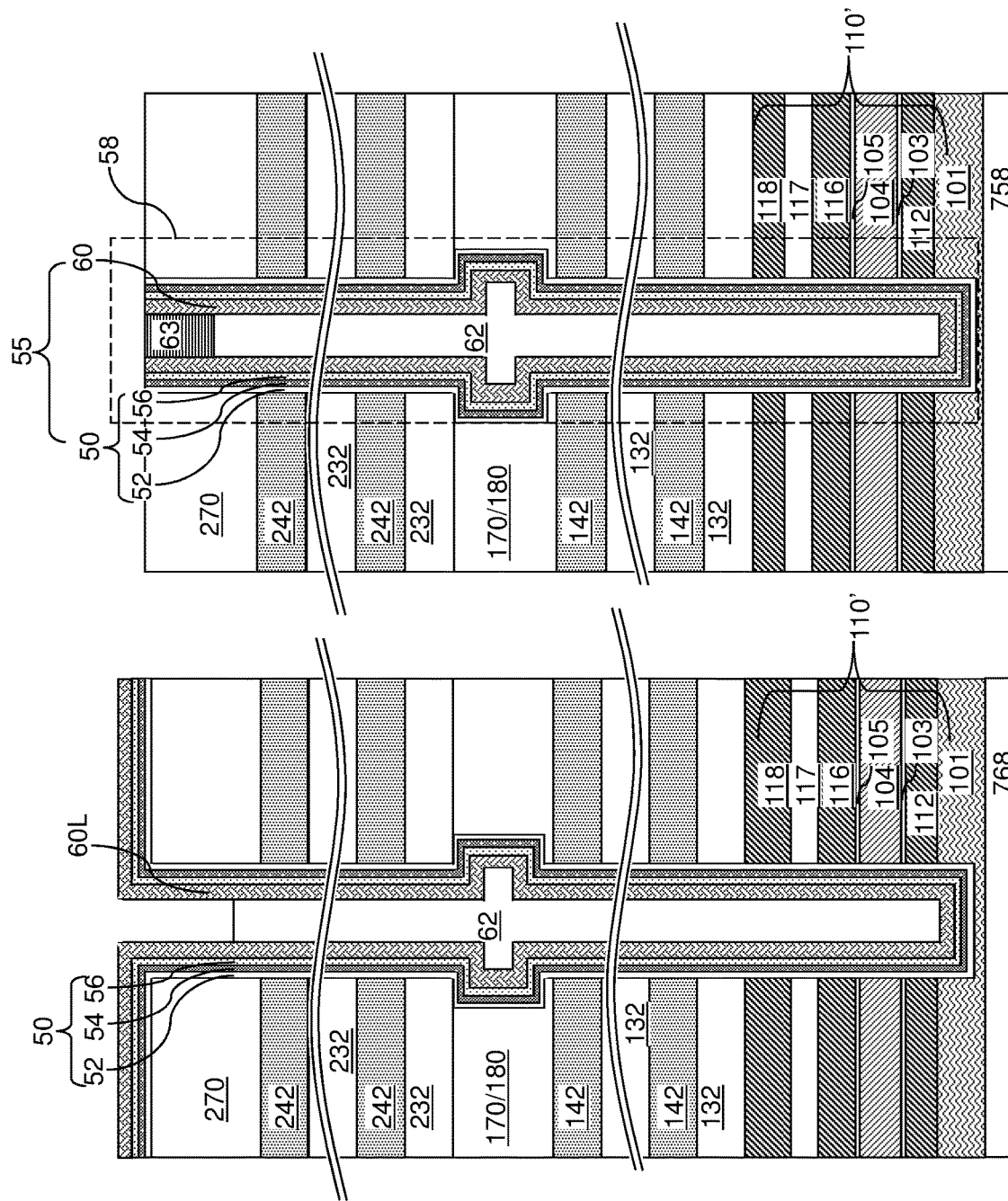

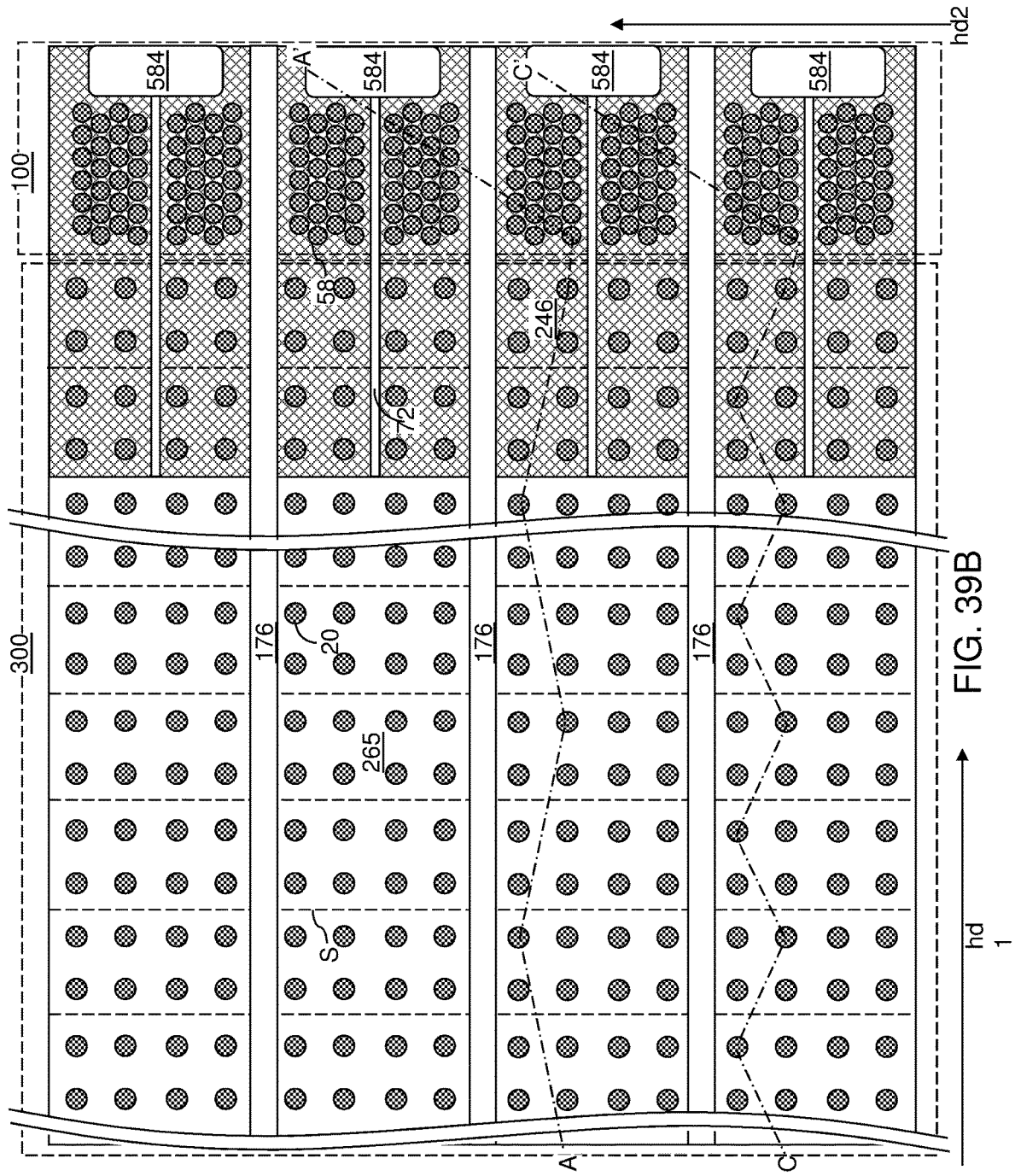

THREE-DIMENSIONAL MEMORY DEVICE HAVING STRESSED VERTICAL SEMICONDUCTOR CHANNELS AND METHOD OF MAKING THE SAME

FIELD

The present disclosure relates generally to the field of semiconductor devices, and particular to three-dimensional memory devices using stressed vertical semiconductor channels and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; a memory stack structure vertically extending through the alternating stack, wherein the memory stack structure comprises a memory film that contains a vertical stack of memory elements located at levels of the electrically conductive layers, and a vertical semiconductor channel that contacts the memory film; and a stressor pillar structure located on a side of the vertical semiconductor channel. The stressor pillar structure applies a vertical tensile stress to the vertical semiconductor channels; a lateral extent of the stressor pillar structure is defined by at least one substantially vertical dielectric sidewall surface that provides a closed periphery around the stressor pillar structure; the stressor pillar structure consists essentially of a stressor material and does not include any solid or liquid material therein other than the stressor material; and the stressor material is selected from a dielectric metal oxide material, silicon nitride deposited under stress, thermal silicon oxide or a semiconductor material having a greater lattice constant than that of the vertical semiconductor channel.

According to another aspect of the present disclosure, a method of forming a three-dimensional memory device is provided, which comprises: forming an alternating stack of insulating layers and spacer material layers over a substrate, wherein the spacer material layers are formed as, or are subsequently replaced by, electrically conductive layers; forming a memory stack structure vertically through the alternating stack, wherein the memory stack structure comprises a memory film that contains a vertical stack of memory elements located at levels of the spacer material layers, and a vertical semiconductor channel that contacts the memory film; and forming a stressor pillar structure on a side of the vertical semiconductor channel. The stressor pillar structure applies a vertical tensile stress to the vertical semiconductor channels; a lateral extent of the stressor pillar structure is defined by at least one substantially vertical dielectric sidewall surface that provides a closed periphery around the stressor pillar structure; the stressor pillar structure consists essentially of a stressor material and does not include any solid or liquid material therein other than the stressor material; and the stressor material is selected from a dielectric metal oxide material, silicon nitride deposited under stress, thermal silicon oxide or a semiconductor material having a greater lattice constant than that of the vertical semiconductor channel.

According to another aspect of the present disclosure, a method of forming a three-dimensional memory device is provided, which comprises: forming an alternating stack of insulating layers and sacrificial material layers over a substrate; forming a memory opening through the alternating stack; forming a memory stack structure in the memory opening, wherein the memory stack structure comprises a memory film that contains a vertical stack of memory elements located at levels of the sacrificial material layers, and a vertical semiconductor channel that contacts the memory film; replacing the sacrificial material layers with electrically conductive layers; and radially applying a lateral compressive stress to the memory stack structure. The lateral compressive stress induces a tensile stress in the vertical semiconductor channel along a vertical direction. The lateral compressive stress applied to the memory stack structure is provided by: forming backside recesses by removing the sacrificial material layers and depositing a compressive-stress-generating conductive material within the backside recesses; or using a compressive-stress-generating sacrificial material for the sacrificial material layers to provide the lateral compressive stress and by memorizing the lateral compressive stress applied to the memory stack structure by a rapid thermal anneal (RTA) process prior to replacement of the sacrificial material layers with the electrically conductive layers.

According to another aspect of the present disclosure, a three-dimensional memory device is provided, which comprises: an alternating stack of insulating layers and electrically conductive layers located over a substrate; a memory stack structure vertically extending through the alternating stack, wherein the memory stack structure comprises a memory film that contains a vertical stack of memory elements located at levels of the electrically conductive layers, and a vertical semiconductor channel that contacts the memory film; a source contact layer underlying the alternating stack and laterally surrounding, and contacting a sidewall of, the vertical semiconductor channel; and a dielectric fill material layer underlying the source contact layer and including a dielectric fill material having a Young's modulus that is less than 70% of a Young's modulus of a material of the source contact layer.

According to another aspect of the present disclosure, a method of forming a three-dimensional memory device is provided, which comprises: forming a planar sacrificial material layer and in-process source-level material layers over a substrate, wherein the in-process source-level material layers include a source-level sacrificial layer; forming an alternating stack of insulating layers and spacer material layers over the in-process source-level material layers, wherein the spacer material layers are formed as, or are subsequently replaced with, electrically conductive layers; forming a memory stack structure vertically extending through the alternating stack, wherein the memory stack structure comprises a memory film that contains a vertical stack of memory elements located at levels of the spacer material layers, and a vertical semiconductor channel that contacts the memory film; replacing the source-level sacrificial layer and an annular portion of the memory film with a source contact layer, wherein the source contact layer surrounds, and contacts a sidewall of, the vertical semiconductor channel; and replacing the planar sacrificial material layer within a dielectric fill material layer including a dielectric fill material having a Young's modulus that is less than 70% of a Young's modulus of a material of the source contact layer.

According to another aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming a memory opening extending through the alternating stack; forming a memory film on a sidewall of the memory opening, wherein the memory film comprises a vertical stack of memory elements located at levels of the spacer material layers; forming a first semiconductor channel layer on an inner sidewall of the memory film, wherein the first vertical semiconductor layer comprises silicon at an atomic concentration greater than 98% and is free of germanium or includes germanium at an atomic concentration less than 2%; and forming a second semiconductor channel layer on an inner sidewall of the first semiconductor channel layer, wherein the second semiconductor channel layer comprises a silicon-germanium alloy including germanium at an atomic concentration in a range from 3% to 50%.

BRIEF DESCRIPTION OF THE DRAWINGS

FIG. 4A is a schematic vertical cross-sectional view of the first exemplary structure after formation of memory openings and support openings according to an embodiment of the present disclosure.

FIGS. 5A-5H are sequential schematic vertical cross-sectional views of a memory opening within the first exemplary structure during formation of a memory opening fill structure in a first configuration according to an embodiment of the present disclosure.

FIG. 5I is a schematic vertical cross-sectional view of a memory opening fill structure in a derivative of the first configuration according to an embodiment of the present disclosure.

FIG. 6 is a schematic vertical cross-sectional view of a memory opening fill structure in a second configuration according to an embodiment of the present disclosure.

FIGS. 7A-7D are sequential schematic vertical cross-sectional views of a memory opening within the first exemplary structure during formation of a memory opening fill structure in a third configuration according to an embodiment of the present disclosure.

FIGS. 9A-9D are sequential schematic vertical cross-sectional views of a memory opening within the first exemplary structure during formation of a memory opening fill structure in a fifth configuration according to an embodiment of the present disclosure.

FIG. 9E schematically illustrates a mechanism by which a first semiconductor channel layer is subjected to a vertical tensile stress according to an embodiment of the present disclosure.

FIGS. 10A-10D are sequential schematic vertical cross-sectional views of a memory opening within the first exemplary structure during formation of a memory opening fill structure in a sixth configuration according to an embodiment of the present disclosure.

FIGS. 14A-14D are sequential vertical cross-sectional views of a region of the first exemplary structure during formation of electrically conductive layers according to an embodiment of the present disclosure.

FIG. 17B is a magnified view of a region of the first exemplary structure of FIG. 17A.

FIG. 21A is a vertical cross-sectional view of a fourth exemplary structure after formation of semiconductor devices, lower level dielectric layers, lower metal interconnect structures, and in-process source level material layers on a semiconductor substrate according to a first embodiment of the present disclosure.

FIGS. 29A-29D illustrate sequential vertical cross-sectional views of a memory openings during formation of a memory opening fill structure according to an embodiment of the present disclosure.

FIG. 39B is a horizontal cross-sectional view of the fourth exemplary structure along the horizontal plane B-B' of FIG. 39A. The hinged vertical plane A-A' corresponds to the plane of the vertical cross-sectional view of FIG. 39A.

DETAILED DESCRIPTION

Figure 1:
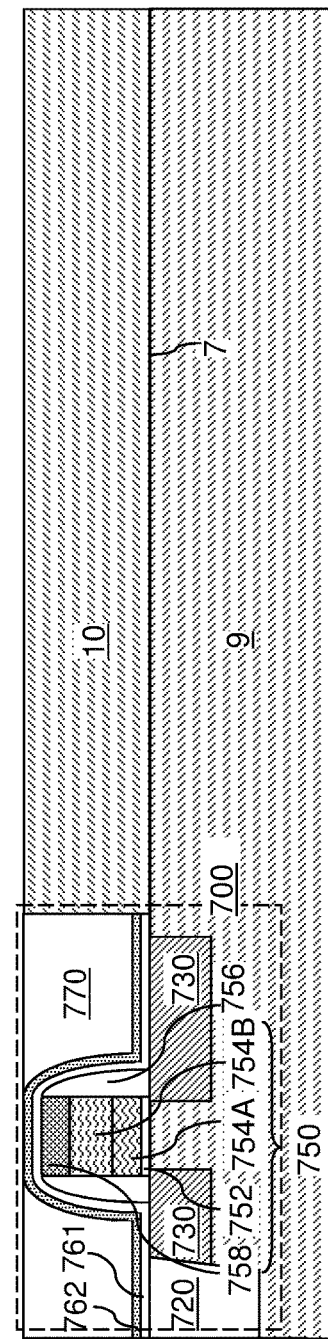
FIG. 1 is a schematic vertical cross-sectional view of a first exemplary structure after formation of at least one peripheral device, and a semiconductor material layer according to an embodiment of the present disclosure.

As discussed above, the present disclosure is directed to three-dimensional memory devices using stressed vertical semiconductor channels providing enhanced charge carrier mobility and methods of manufacturing the same, the various aspects of which are described below. The embodiments of the disclosure can be used to form various structures including a multilevel memory structure, non-limiting examples of which include semiconductor devices such as three-dimensional monolithic memory array devices comprising a plurality of NAND memory strings. In three-dimensional monolithic memory array devices, an array of vertical NAND strings vertically extends through an alternating stack of insulating layers and electrically conductive layers that function as word lines. One end of each vertical NAND string is connected to a source line, and another end of each vertical NAND string is connected to a respective drain region, which is connected to a respective bit line. As the total number of word lines increases in the three-dimensional memory device, the vertical semiconductor channels of the vertical NAND strings become longer, thereby decreasing the on-current for the vertical semiconductor channels. Increasing the on-current of the vertical semiconductor channels permits vertically scaling of the three-dimensional memory devices and stacking a greater number of word lines. By using stressed vertical semiconductor channels, enhanced charge carrier mobility can be provided, thereby improving performance of three-dimensional memory devices according to various embodiments.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices according to various embodiments of the present disclosure include a monolithic three-dimensional NAND string memory device, and can be fabricated using the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be used, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 710 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure 750, each of which can include a gate dielectric 752, a gate electrode 754, and a gate cap dielectric 758. The gate electrode 754 may include a stack of a first gate electrode portion 754A and a second gate electrode portion 754B. At least one dielectric gate spacer 756 can be formed around the at least one gate structure 750 by depositing and anisotropically etching a dielectric liner. Active regions 730 can be formed in upper portions of the substrate semiconductor layer 9, for example, by introducing electrical dopants using the at least one gate structure 750 as masking structures. Additional masks may be used as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 710 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be used for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 710 is herein referred to as a peripheral device region 700. The region in which a memory array is subsequently formed is herein referred to as a memory array region 100. A staircase region 300 for subsequently forming stepped terraces of electrically conductive layers can be provided between the memory array region 100 and the peripheral device region 700.

Figure 2:
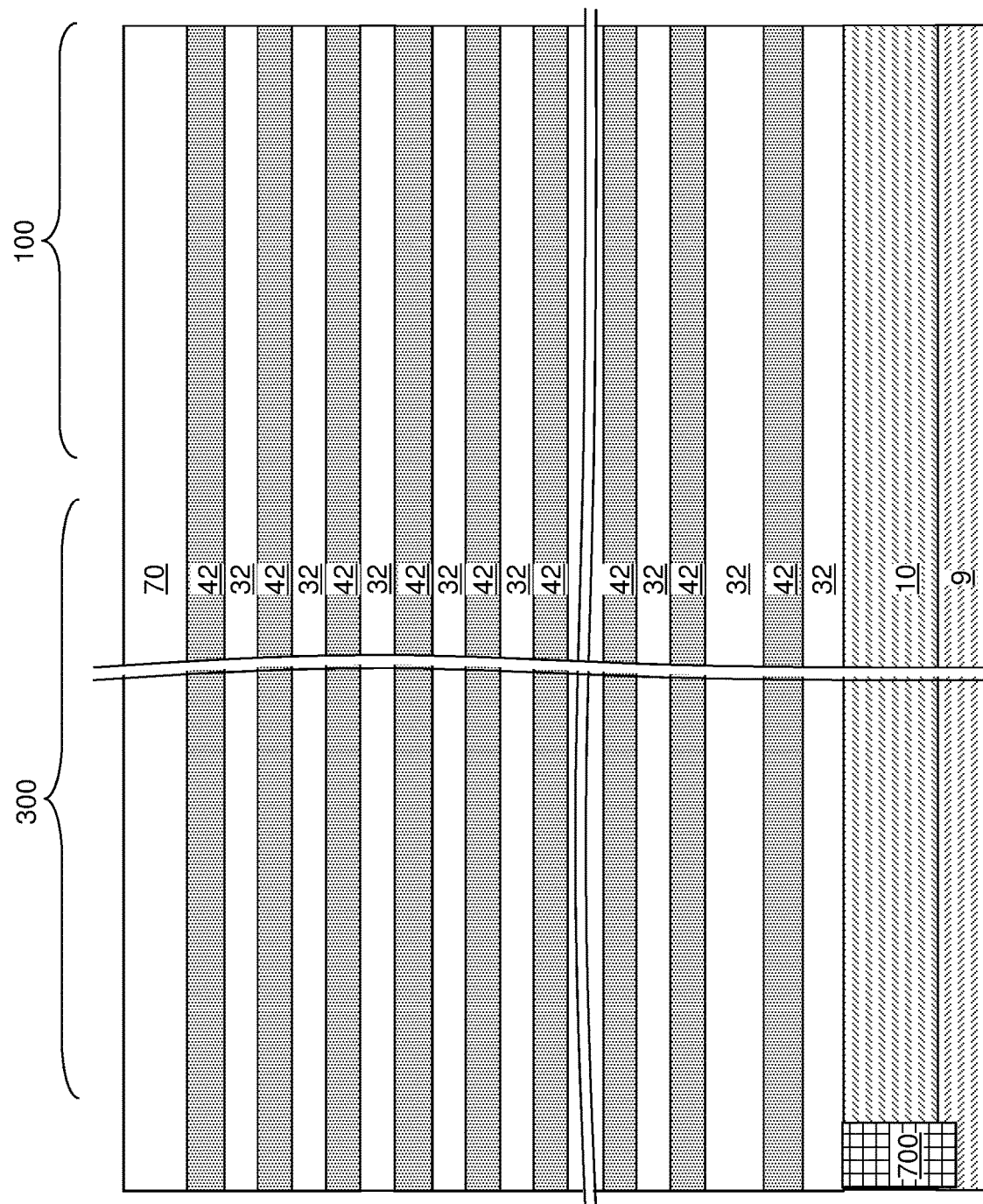
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer.

Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, other embodiments form the sacrificial material layers as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
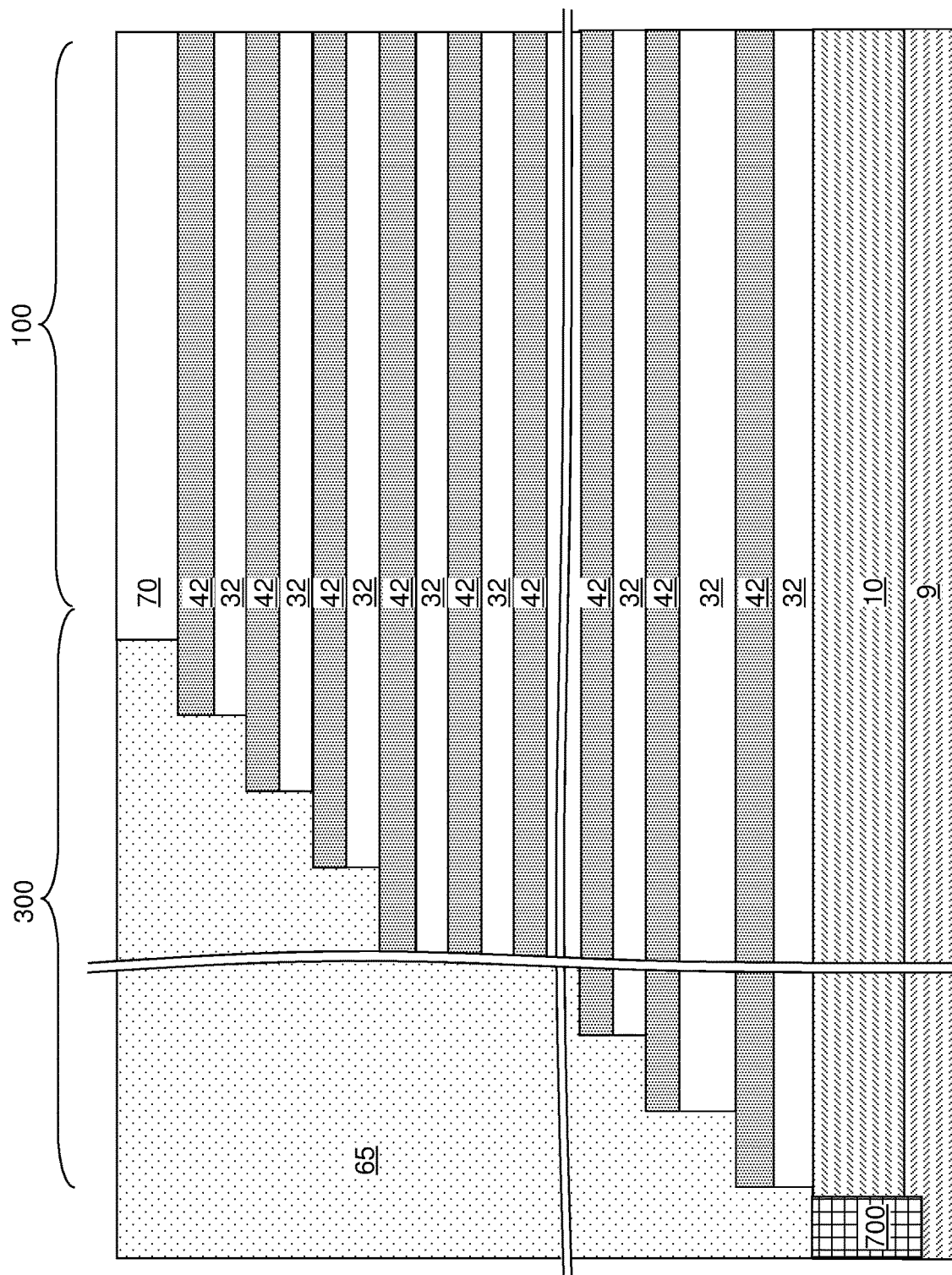
FIG. 3 is a schematic vertical cross-sectional view of the first exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 700 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs.

Each column of staircase can be vertically offset one from another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets between the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4B:
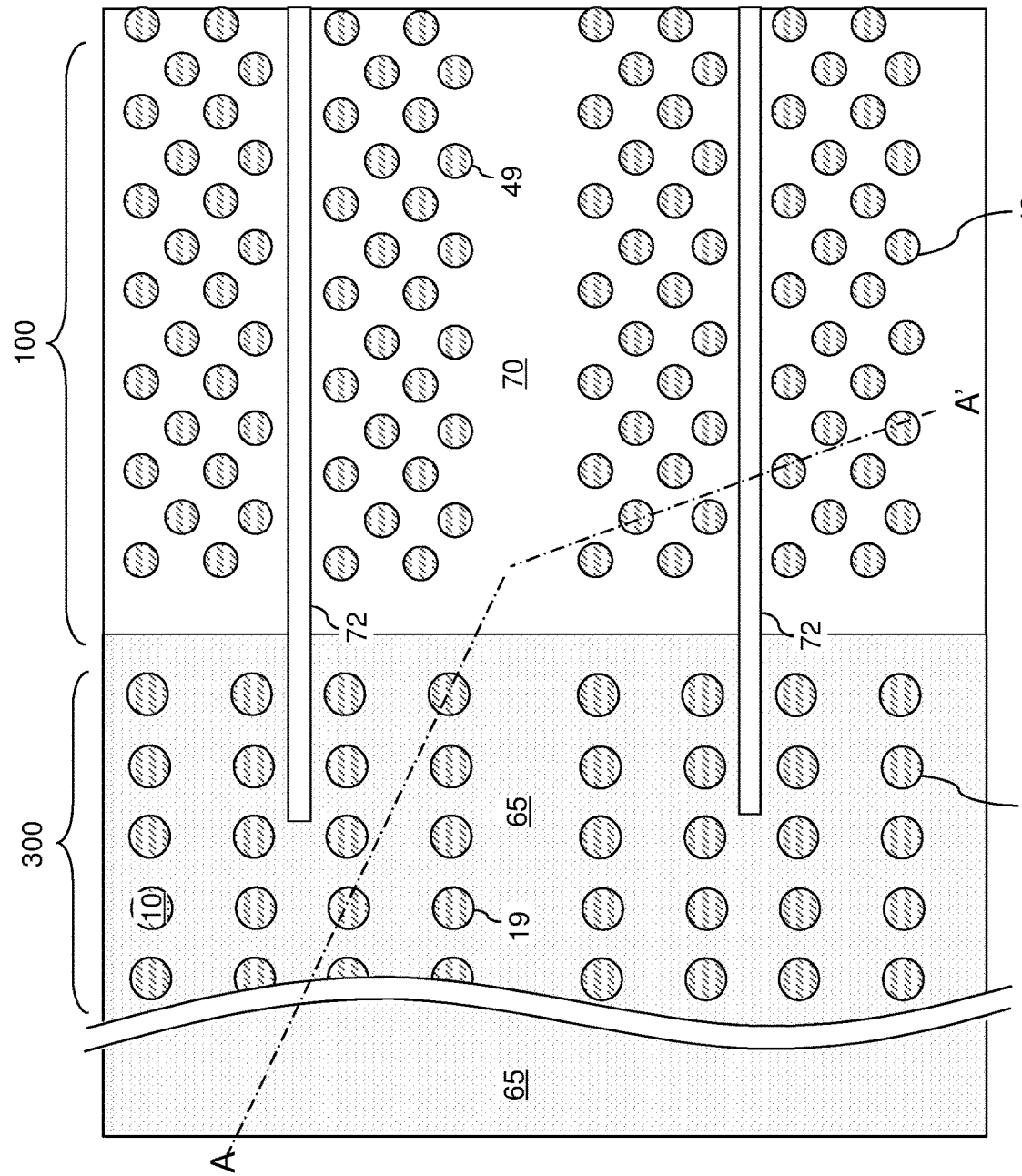
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the first exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, other embodiments replace the charge storage layer 54 with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602. Each set of a first semiconductor channel layer 601 and a vertically extending portions of the second semiconductor channel layer 602 located in a memory opening 49 constitutes a vertical semiconductor channel 60.

Referring to FIG. 5F, a silicon oxide liner 161 can be formed on each vertical semiconductor channel 60. The silicon oxide liner 161 can passivate surface states of the inner sidewalls of the vertical semiconductor channels 60 and enhance the mobility of charge carriers in the vertical semiconductor channels 60. The silicon oxide liner 161 can be forming by thermal oxidation of the physically exposed surfaces of the second semiconductor channel layer 602, and/or can be formed by conformal deposition of a silicon oxide material, for example, by low pressure chemical vapor deposition (LPCVD). The thickness of the silicon oxide liner 161 can be in a range from 1 nm to 6 nm, such as from 1 nm to 3 nm, although lesser and greater thicknesses can also be used.

A stressor material can be conformally deposited in remaining volumes of the memory openings 49 after formation of the silicon oxide liner 161 to form a stressor material layer 162L. The stressor material includes a material that applies compressive stress to surrounding material portions as a primary effect. Because each cavity into which the stressor material is deposited into is an elongated cavity having a greater vertical dimension than a maximum lateral dimension with an aspect ratio greater than 5, such as greater than 20, the stressor material induces a vertical tensile stress on the semiconductor channels 60 as a secondary effect due to the Poisson effect. The Poisson effect is the phenomenon in which a material exhibits an opposite type of secondary strain in directions perpendicular to the direction of a primary strain. If a material is compressed along a lateral direction due to a primary compressive stress, the material is stretched along a vertical direction due to a secondary tensile stress, and vice versa.

In one embodiment, the stressor material can consist essentially of a dielectric metal oxide material or silicon nitride deposited under stress. Non-limiting examples of the stressor material include tantalum oxide, aluminum oxide, hafnium oxide, aluminum silicate, hafnium silicate, and silicon nitride deposited under stress, such as tensile or compressive stress. The stressor material layer 162L fills remaining portions of the memory cavity 49' within the memory openings 49. The stressor material layer 162L can be deposited by a conformal deposition method such as low pressure chemical vapor deposition (LPCVD), or by a self-planarizing deposition process such as spin coating.

Referring to FIG. 5G, the horizontal portion of the stressor material layer 162L can be removed, for example, by a recess etch from above the top surface of the insulating cap layer 70. Each remaining portion of the stressor material layer 162L constitutes a stressor pillar structure 162. Physically exposed portions of the silicon oxide liner 161 can be removed, for example, by a wet etch using dilute hydrofluoric acid. Each contiguous set of a silicon oxide liner 161 and a stressor pillar structure 162 constitutes an electrically isolated core 62 located within a respective one of the memory openings 49. As used herein, an "electrically isolated" element refers to an element that is electrically insulated from each neighboring element that directly contacts the element.

Further, the horizontal portion of the second semiconductor channel layer 602 located above the top surface of the insulating cap layer 70 can be removed by a planarization process, which can use a recess etch or chemical mechanical planarization (CMP). Each remaining portion of the second semiconductor channel layer 602 can be located entirely within a memory opening 49 or entirely within a support opening 19. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on.

The stressor pillar structures 162 apply a lateral compressive stress and an accompanying vertical tensile stress to the vertical semiconductor channels 60. The lateral extent of each stressor pillar structure 162 is limited by the silicon oxide liner 161 and the vertical semiconductor channel 60 within the same memory opening 49. Generally, the lateral extent of each stressor pillar structure 162 can be defined by at least one substantially vertical dielectric sidewall surface (such as a cylindrical sidewall of the stressor pillar structure 162) that provides a closed periphery around the stressor pillar structure 162. In one embodiment, each stressor pillar structure 162 can have a substantially cylindrical sidewall that vertically extends through a plurality of sacrificial material layers 42 within the alternating stack (32, 42), which may include each of the sacrificial material layers 42 other than the bottommost one of the sacrificial material layers 42.

The stressor pillar structures 162 can consist essentially of a stressor material and does not include any solid or liquid material therein other than the stressor material. As discussed above, the stressor material can be selected from a dielectric metal oxide material or silicon nitride. In one embodiment, the stressor material be a dielectric metal oxide material (i.e., stressor pillar structures 162 consist essentially of a dielectric metal oxide material). A silicon oxide liner 161 can be located between, and can contact sidewalls of, a respective vertical semiconductor channel 60 and a respective stressor pillar structure 162. In another embodiment, the stressor material is silicon nitride (i.e., stressor pillar structures 162 consist essentially of silicon nitride).

In one embodiment, each stressor pillar structure 162 has a circular cylindrical shape or a laterally-elongated cylindrical shape, and a vertical semiconductor channel 60 laterally surrounds the stressor pillar structure 162. A memory film 50 laterally surrounds the vertical semiconductor channel 60. Each stressor pillar structure 162 is formed on a side of the vertical semiconductor channel 60. The stressor pillar structures 162 can be formed directly on the silicon oxide liner 161.

A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each stressor pillar structure 162 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the stressor pillar structures 162. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a silicon oxide liner 161, a stressor pillar structure 162, and a drain region 63 within a memory opening 49 is herein referred to as a memory opening fill structure 58 in a first configuration. Each combination of a pedestal channel portion 11 (if present), a memory film 50, a vertical semiconductor channel 60, a silicon oxide liner 161, a stressor pillar structure 162, and a drain region 63 within each support opening 19 fills the respective support openings 19, and constitutes a support pillar structure in the first configuration.

Referring to FIG. 5I, a derivative of the first configuration of the memory opening fill structure 58 can be derived from the first configuration of the memory opening fill structure by employing an oxidizable semiconductor material in lieu of the dielectric material for the stressor pillar structure 162. In this case, the stressor pillar structure 162 can include, and/or can consist essentially of, a semiconductor material. In one embodiment, the semiconductor material can have a lattice constant that is greater than the lattice constant of the vertical semiconductor channel 60. In a non-limiting illustrative example, the vertical semiconductor channel 60 comprises intrinsic polysilicon or p-type doped polysilicon having a boron doping concentration less than $1 \times 10^{17}$ cm$^{-3}$, and the stressor material of the stressor pillar structure 162 is a semiconductor material having a greater lattice constant than the intrinsic or p-type doped polysilicon having the boron doping concentration less than $1 \times 10^{17}$ cm$^3$. For example, the semiconductor material of the stressor pillar structure 162 can include germanium, a silicon-germanium alloy, gallium arsenide, indium gallium arsenide, or n-type doped silicon (e.g. polysilicon) containing n-type dopants (such as P, As, and/or Sb) at a level that significantly increases the lattice constant of the doped silicon material relative to intrinsic silicon (for example, by including electrical dopants at an atomic concentration greater than $5.0 \times 10^{20}/cm^3$). The larger lattice constant of the material of the stressor pillar structure 162 relative to the lattice constant of the vertical semiconductor channel 60 can generate a primary lateral compressive stress (and lateral compressive strain) and a secondary vertical tensile stress (and vertical tensile strain) in the vertical semiconductor channel 60. The semiconductor material of the stressor pillar structure 162 can be deposited by a conformal deposition process, and any dopant therein can be provided, for example, by in-situ doping. A topmost portion of the stressor pillar structure 162 can be oxidized prior to formation of the drain region 63. The topmost portion of the stressor pillar structure 162 can be converted into a dielectric semiconductor oxide cap portion 163 (e.g., silicon oxide, germanium oxide, silicon germanium oxide, gallium oxide, etc.), which provides electrical isolation between the drain region 63 and the remaining portion of the stressor pillar structure 162, thereby electrically isolating the stressor pillar structure 162. The stressor pillar structure 162 is electrically floating. The contiguous set of the silicon oxide liner 161, the stressor pillar structure 162, and the dielectric semiconductor oxide cap portion 163 collectively constitutes an electrically insulating core 62.

Referring to FIG. 6, a second configuration of the memory opening fill structure 58 can be derived from the first configuration illustrated in FIG. 5H by omitting formation of a silicon oxide liner 161 at the processing steps of FIG. 5F. In this case, the stressor material is formed directly on a substantially vertical sidewall of each vertical semiconductor channel 60. In one embodiment, the stressor material is a dielectric metal oxide material or silicon nitride (i.e., stressor pillar structures 162 consist essentially of a dielectric metal oxide material or silicon nitride).

Each combination of a pedestal channel portion 11 (if present), a memory stack structure 55, a stressor pillar structure 162, and a drain region 63 within a memory opening 49 is herein referred to as a memory opening fill structure 58 in a second configuration. Each combination of a pedestal channel portion 11 (if present), a memory film 50, a vertical semiconductor channel 60, a stressor pillar structure 162, and a drain region 63 within each support opening 19 fills the respective support openings 19, and constitutes a support pillar structure in the second configuration.

Referring to FIG. 7A, an in-process exemplary structure for forming a memory opening fill structure 58 in a third configuration is illustrated, which is derived from the exemplary structure illustrated in FIG. 5E by depositing a silicon nitride liner 261 directly on physically exposed surfaces of the second semiconductor channel layer 602. Each set of a first semiconductor channel layer 601 and a vertically extending portions of the second semiconductor channel layer 602 located in a memory opening 49 constitutes a vertical semiconductor channel 60. Thus, the silicon nitride liner 261 is formed directly on an inner sidewall of each vertical semiconductor channel 60. The silicon nitride liner 261 can be deposited by a conformal deposition process, such as low pressure chemical vapor deposition. The thickness of the silicon nitride liner 261 can be in a range from 3 nm to 10 nm, although lesser and greater thicknesses can also be used.

A silicon layer 263L can be formed on the silicon nitride liner 261 by conformal deposition of amorphous silicon or polysilicon. The thickness of the silicon layer 263L can be selected such that an unfilled cavity is present within each memory opening 49 after deposition of the silicon layer 263L. Generally, oxidation of voidless silicon into thermal silicon oxide generates 125% volume expansion. In other words, thermal oxide generated from a silicon material portion has a volume of 225% of the original volume of silicon that is consumed by the thermal oxidation process. In one embodiment, the thickness of the silicon layer 263L can be selected such that the ratio of the volume occupied by the silicon layer 263L within each memory opening to the unfilled volume after formation of the silicon layer 263L is about 4:5.

Referring to FIG. 7B, a thermal oxidation process is performed to convert the silicon layer 263L into a thermal silicon oxide layer 262L including silicon oxide portions within each memory opening 49. A thermal oxidation process can be used, which can use a wet oxidation process or a dry oxidation process. The thermal silicon oxide layer 262L includes thermal silicon oxide, which is a stoichiometric material in which the ratio of silicon atoms to oxygen atoms is 1:2, and is essentially free of impurity materials such as carbon or hydrogen, i.e., includes carbon or hydrogen at a concentration less than 1 part per million in atomic concentration. In embodiments in which the thickness of the silicon layer 263L is selected such that the ratio of the volume occupied by the silicon layer 263L within each memory opening to the unfilled volume after formation of the silicon layer 263L is about 4:5, the entirety of the silicon layer 263L can be converted into the thermal silicon oxide layer 262L and the thermal silicon oxide layer 262L can fill the remaining voids within the memory openings 49.

In one embodiment, the silicon nitride liner 261 can be used as an oxidation stop structure. The oxidation rate of the silicon nitride material of the silicon nitride liner 261 is lower than the oxidation rate of silicon in the silicon layer 263L. Thus, the thermal oxidation process can partially consume the silicon nitride liner 261 during the thermal oxidation process. The remaining portion of the silicon nitride liner 261 can have a composition gradient at an inner sidewall such that a surface portion of the silicon nitride liner 261 at an interface with the thermal silicon oxide layer 262L includes a silicon oxynitride surface layer including oxygen atoms at a variable atomic concentration that decreases with a distance from the interface with the thermal silicon oxide layer 262L.

Referring to FIG. 7C, the horizontal portion of the thermal silicon oxide layer 262L can be removed, for example, by a recess etch from above the top surface of the insulating cap layer 70. Each remaining portion of the thermal silicon oxide layer 262L constitutes a stressor pillar structure 262 consisting essentially of thermal silicon oxide. Physically exposed portions of the silicon nitride liner 261 can be removed, for example, by a wet etch. Each contiguous set of a silicon nitride liner 261 and a stressor pillar structure 262 constitutes an electrically isolated core 62 located within a respective one of the memory openings 49.

The horizontal portion of the second semiconductor channel layer 602 located above the top surface of the insulating cap layer 70 can be removed by a planarization process, which can use a recess etch or chemical mechanical planarization (CMP). Each remaining portion of the second semiconductor channel layer 602 can be located entirely within a memory opening 49 or entirely within a support opening 19. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on.

The stressor pillar structures 262 apply a lateral compressive stress and an accompanying vertical tensile stress to the vertical semiconductor channels 60. The lateral extent of each stressor pillar structure 262 is limited by the silicon nitride liner 261 and the vertical semiconductor channel 60 within the same memory opening 49. Generally, the lateral extent of each stressor pillar structure 262 can be defined by at least one substantially vertical dielectric sidewall surface (such as a cylindrical sidewall of the stressor pillar structure 262) that provides a closed periphery around the stressor pillar structure 262. In one embodiment, each stressor pillar structure 262 can have a substantially cylindrical sidewall that vertically extends through a plurality of sacrificial material layers 42 within the alternating stack (32, 42), which may include each of the sacrificial material layers 42 other than the bottommost one of the sacrificial material layers 42.

The stressor pillar structures 262 can consist essentially of thermal silicon oxide. A silicon nitride liner 261 is located between, and contacts sidewalls of, a vertical semiconductor channel 60 and the stressor pillar structure 262. In one embodiment, each stressor pillar structure 262 has a circular cylindrical shape or a laterally-elongated cylindrical shape, and a vertical semiconductor channel 60 laterally surrounds the stressor pillar structure 262. A memory film 50 laterally surrounds the vertical semiconductor channel 60. Each stressor pillar structure 262 is formed on a side of the vertical semiconductor channel 60. The stressor pillar structures 262 can be formed directly on the silicon nitride liner 261.

Referring to FIG. 7D, the top surface of each stressor pillar structure 262 can be further recessed within each memory opening, for example, by a recess etch to a depth that is located between the top surface of the insulating cap layer 70 and the bottom surface of the insulating cap layer 70. The processing steps of FIG. 5H can be performed to form drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a silicon nitride liner 261, a stressor pillar structure 262, and a drain region 63 within a memory opening 49 is herein referred to as a memory opening fill structure 58 in a third configuration. Each combination of a pedestal channel portion 11 (if present), a memory film 50, a vertical semiconductor channel 60, a silicon nitride liner 261, a stressor pillar structure 262, and a drain region 63 within each support opening 19 fills the respective support openings 19, and constitutes a support pillar structure in the third configuration.

Figure 8:
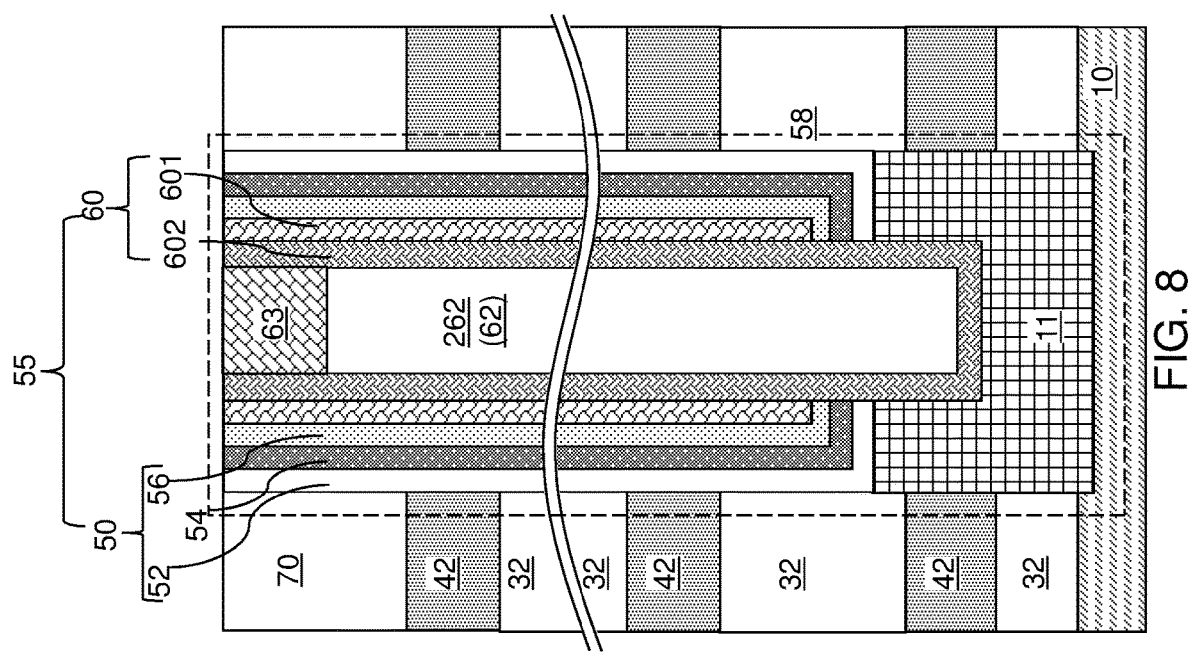
FIG. 8 is a schematic vertical cross-sectional view of a memory opening fill structure in a fourth configuration according to an embodiment of the present disclosure.

Referring to FIG. 8, a fourth configuration of a memory opening fill structure 58 is illustrated, which can be derived from the third configuration of the memory opening fill structure 58 illustrated in FIG. 7D by modifying the processing steps of FIG. 7B. Specifically, the thermal oxidation process that converts the silicon layer 263L into the thermal silicon oxide layer 262L is prolonged such that the entirety of the silicon nitride liner 261 is converted into an additional thermal silicon oxide portion that is incorporated into the thermal silicon oxide layer 262L. In this case, the thermal silicon oxide layer 262L directly contacts the second semiconductor channel layer 602, and each stressor pillar structure 262 formed by patterning the thermal silicon oxide layer 262L contacts a substantially vertical sidewall of a respective vertical semiconductor channel 60. In one embodiment, each stressor pillar structure 262 can include a silicon oxynitride surface layer including nitrogen atoms at a variable atomic concentration that decreases with a distance from the interface with a vertical semiconductor channel 60.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a stressor pillar structure 262, and a drain region 63 within a memory opening 49 is herein referred to as a memory opening fill structure 58 in a fourth configuration. Each combination of a pedestal channel portion 11 (if present), a memory film 50, a vertical semiconductor channel 60, a stressor pillar structure 262, and a drain region 63 within each support opening 19 fills the respective support openings 19, and constitutes a support pillar structure in the fourth configuration.

Figure 9B:
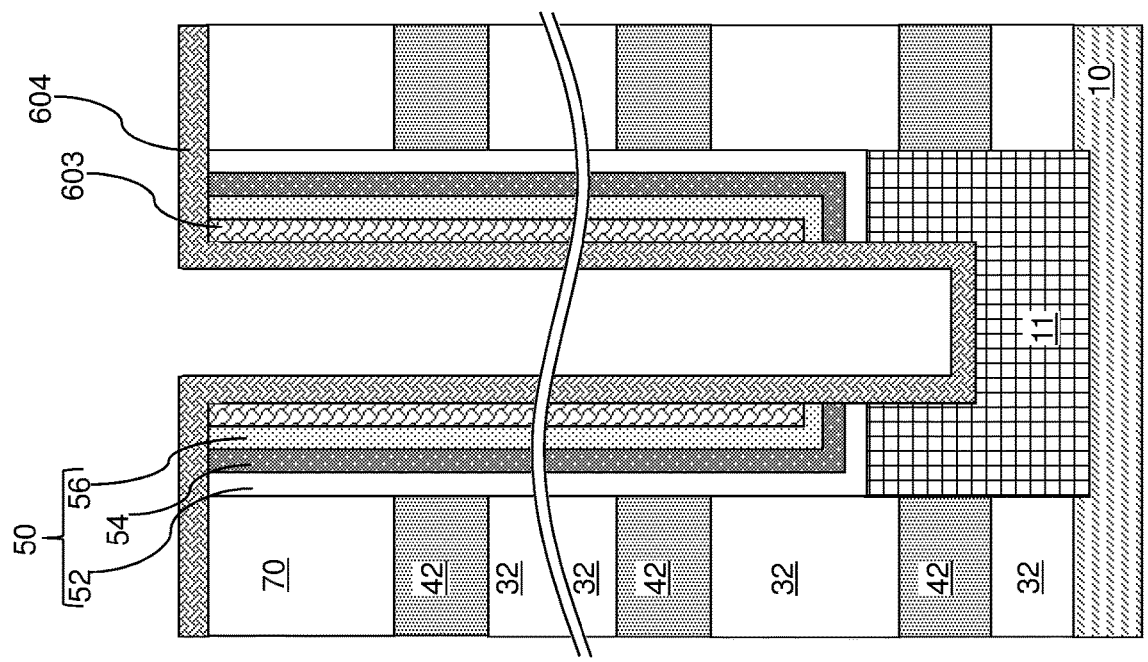
Figure 9A:
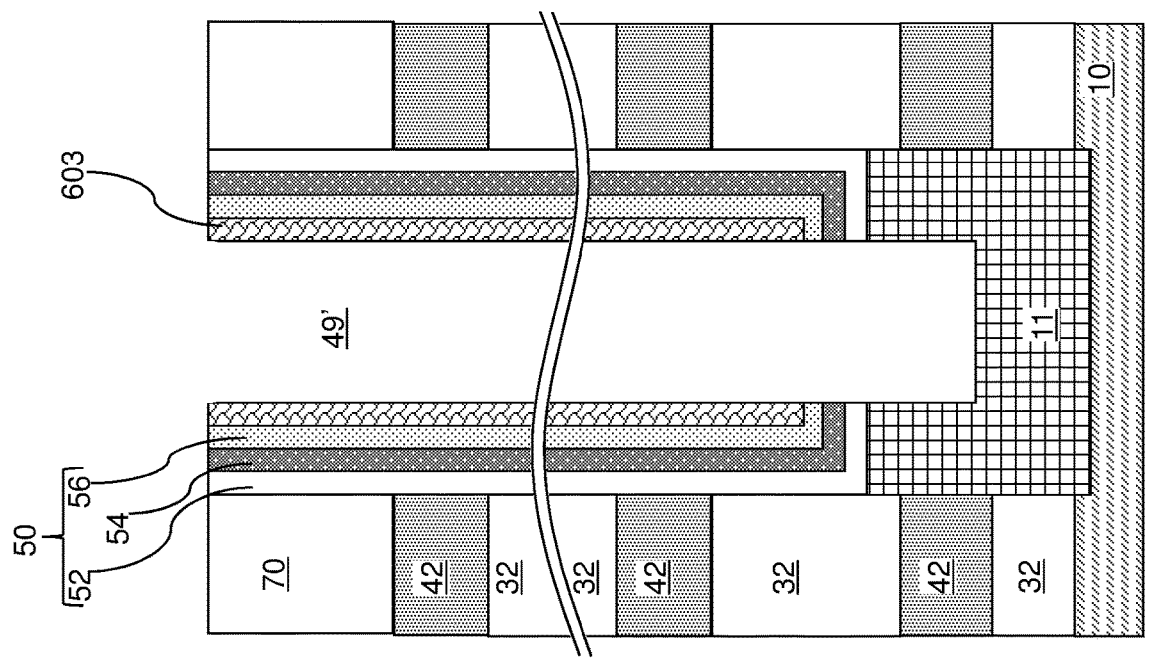

Referring to FIG. 9A, an in-process exemplary structure for forming a memory opening fill structure 58 in a fifth configuration is shown. The exemplary structure of FIG. 9A can be derived from the exemplary structure of FIG. 5D by performing the processing steps of FIGS. 5A-5D with replacement of the first semiconductor channel layer 601 of FIG. 5C with a first semiconductor channel layer 603. Each first semiconductor channel layer 603 can be formed on an inner sidewall of a respective memory film 50. The first semiconductor channel layer 603 includes silicon at an atomic concentration greater than 98%, and is free of germanium or includes germanium at an atomic concentration less than 2%. The thickness of the first semiconductor channel layer 603 can be in a range from 2 nm to 10 nm, although lesser and greater thicknesses can also be used. In one embodiment, the first semiconductor channel layer 603 can include electrical dopants of the first conductivity type in a range from $1.0 \times 10^{14}/cm^3$ to $1.0 \times 10^{18}/cm^3$, although lower and higher dopant concentrations can also be used.

In various embodiments, the first semiconductor channel layer 603 can be deposited as a first polycrystalline semiconductor material layer, or can be deposited as an amorphous semiconductor material layer. In an embodiment in which the first semiconductor channel layer 603 is deposited as an amorphous semiconductor material layer, the first semiconductor channel layer 603 may remain amorphous until deposition of a second semiconductor channel layer, or may be subsequently converted into a first polycrystalline semiconductor material layer prior to deposition of the second semiconductor channel layer. In an embodiment in which the first semiconductor channel layer 603 is deposited as, or is converted into, the first polycrystalline semiconductor material layer, the average grain size of the first polycrystalline semiconductor material layer can be in a range from 50% to 300% of the thickness of the first semiconductor channel layer 603. The first semiconductor channel layer 603 may be deposited as an amorphous material layer or a polycrystalline material layer depending on the deposition temperature and the deposition rate. For example, a deposition temperature in a range from 500 degrees Celsius to 575 degrees Celsius can be used to deposit the first semiconductor channel layer 603 as an amorphous material layer, or a deposition temperature in a range from 575 degrees Celsius to 625 degrees Celsius can be used to deposit the first semiconductor channel layer 603 as a polycrystalline material layer.

Referring to FIG. 9B, a second semiconductor channel layer 604 is formed directly on the semiconductor surface of the pedestal channel portion 11 (or the semiconductor material layer 10 if the pedestal channel portion 11 is omitted), and directly on inner sidewall of each first semiconductor channel layer 603. The second semiconductor channel layer 604 comprises, or consists essentially of, a silicon-germanium alloy including germanium at an atomic concentration in a range from 3% to 50% such as from 5% to 30%. The second semiconductor channel layer 604 can be formed by a conformal deposition method such as low pressure chemical vapor deposition (LPCVD). The thickness of the second semiconductor channel layer 604 can be in a range from 2 nm to 10 nm, although lesser and greater thicknesses can also be used. The second semiconductor channel layer 604 may partially fill the memory cavity 49' in each memory opening, or may fully fill the cavity in each memory opening. The second semiconductor channel layer 604 may be deposited as an amorphous material layer or a polycrystalline material layer depending on the deposition temperature and the deposition rate. For example, a deposition temperature in a range from 475 degrees Celsius to 550 degrees Celsius can be used to deposit the second semiconductor channel layer 604 as an amorphous material layer, or a deposition temperature in a range from 525 degrees Celsius to 625 degrees Celsius can be used to deposit the second semiconductor channel layer 604 as a polycrystalline material layer.

In various embodiments, the second semiconductor channel layer 604 can be deposited as a second polycrystalline semiconductor material layer, or can be deposited as an amorphous semiconductor material layer. In an embodiment in which the second semiconductor channel layer 604 is deposited as an amorphous semiconductor material layer, the second semiconductor channel layer 604 can be subsequently converted into a second polycrystalline semiconductor material layer by a subsequent anneal process. Grains of the second polycrystalline semiconductor material layer can be formed with epitaxial alignment to grains within the first polycrystalline semiconductor material layer across the interface between the first semiconductor channel layer 603 and the second semiconductor channel layer 604 during the anneal process. In this embodiment, polycrystalline grains of the second semiconductor channel layer 604 can be epitaxially aligned to a respective polycrystalline grain within the first semiconductor channel layer 603 after an anneal process that is performed after deposition of the silicon-germanium alloy of the second semiconductor channel layer 604. In one embodiment, the first semiconductor channel layer 603 is deposited as a first amorphous semiconductor material layer, the second semiconductor channel layer 604 is deposited as a second amorphous semiconductor material layer, and the first amorphous semiconductor material layer and the second amorphous semiconductor material layer are converted into a first polycrystalline semiconductor material layer and a second polycrystalline semiconductor material layer, respectively, during a subsequent anneal process. Polycrystalline grains of the second polycrystalline semiconductor material layer contact, and are epitaxially aligned to, a respective polycrystalline grain in the first polycrystalline semiconductor material layer.

In an embodiment in which the second semiconductor channel layer 604 is deposited as the second polycrystalline semiconductor material layer, grains of the second polycrystalline semiconductor material layer can be formed with epitaxial alignment to grains within the first polycrystalline semiconductor material layer across the interface between the first semiconductor channel layer 603 and the second semiconductor channel layer 604 during deposition of the second semiconductor channel layer 604. In other words, the second semiconductor channel layer 604 is deposited as a second polycrystalline semiconductor material layer with polycrystalline grains that contact, and are epitaxially aligned to, a respective polycrystalline grain in the first semiconductor channel layer 603. In this embodiment, polycrystalline grains of the second semiconductor channel layer 604 can be epitaxially aligned to a respective polycrystalline grain within the first semiconductor channel layer 603 upon deposition of the silicon-germanium alloy.

The materials of the first semiconductor channel layer 603 and the second semiconductor channel layer 604 are collectively referred to as a semiconductor channel material. In other words, the semiconductor channel material is a set of all semiconductor material in the first semiconductor channel layer 603 and the second semiconductor channel layer 604. Each set of a first semiconductor channel layer 603 and a vertically extending portions of the second semiconductor channel layer 604 located in a memory opening 49 constitutes a vertical semiconductor channel 60.

Referring to FIG. 9E, a mechanism for the generating a vertical tensile stress within the first semiconductor channel layer 603 in a vertical semiconductor channel 60 is illustrated. The first semiconductor channel layer 603 can be free of germanium or include germanium at an atomic concentration less than 2%. As such, the lattice constant of the first semiconductor channel layer 603 is about 0.5431 nm (i.e., the lattice constant of pure silicon) upon crystallization prior to formation of the second semiconductor channel layer 604 or if an amorphous silicon-containing material of the first semiconductor channel layer 603 were to be crystallized in the absence of the second semiconductor channel layer 604. The lattice constant of the second semiconductor channel layer 604 in a stress-free environment can be in a range from 0.5437 to 0.5544 due to the presence of germanium atoms within the material of the second semiconductor channel layer 604. The epitaxial alignment between grains of the second semiconductor channel layer 604 and the grains of the first semiconductor channel layer 603 distorts the crystalline structure within the first semiconductor channel layer 603, and expands the lattice constant along the direction parallel to the interface between the first semiconductor channel layer 603 and the second semiconductor channel layer 604. Because the interface between the first semiconductor channel layer 603 and the second semiconductor channel layer 604 is parallel to the vertical direction, the first semiconductor channel layer 603 within each vertical semiconductor channel 60 is under a vertical tensile stress.

Referring to FIG. 9C, an electrically isolated core 62 can be formed within a cavity in each memory opening 49. The electrically isolated core 62 can be formed by any of the methods described above for forming an electrically isolated core 62. For example, the electrically isolated core 62 can include a combination of a silicon oxide liner 161 and a stressor pillar structure 162 as in the first configuration of the memory opening fill structure 58, a stressor pillar structure 162 as in the second configuration of the memory opening fill structure 58, a combination of a silicon nitride liner 261 and a stressor pillar structure 262 as in the third configuration of the memory opening fill structure 58, or a stressor pillar structure 262 as in the fourth configuration of the memory opening fill structure 58. Alternatively, the electrically isolated core 62 may include, and/or consist essentially of, undoped silicate glass or a doped silicate glass. Horizontal portions of the second semiconductor channel layer 604 located above the top surface of the insulating cap layer 70 can be removed by a recess etch or by chemical mechanical planarization. A stack of a first semiconductor channel layer 603 and a second semiconductor channel layer 604 constitutes a vertical semiconductor channel 60 of a vertical NAND string.

Referring to FIG. 9D, a drain region 63 can be formed at upper ends of the vertical semiconductor channels 60. Each vertical semiconductor channel 60 includes a first semiconductor channel layer 603 and a second semiconductor channel layer 604. The first semiconductor channel layer 603 is under a vertical tensile stress and exhibits stress-induced enhanced charge carrier mobility.

Referring to FIG. 10A, a configuration of the exemplary structure is illustrated, which can be derived from the exemplary structure illustrated in FIG. 5E. In one embodiment, the material of the sacrificial material layers 42 can be selected such that the sacrificial material layers 42 radially apply a lateral compressive stress to memory stack structures to be formed in the memory openings 49. The lateral compressive stress induces a tensile stress in vertical semiconductor channels along the vertical direction upon formation of the vertical semiconductor channels. In one embodiment, the sacrificial material layers 42 are formed at the processing steps of FIG. 2 by depositing a compressive-stress-generating sacrificial material that generates the lateral compressive stress. The lateral compressive stress applied to the memory stack structures can be subsequently memorized by a rapid thermal anneal (RTA) process prior to replacement of the sacrificial material layers 42 with electrically conductive layers.

Figure 11:
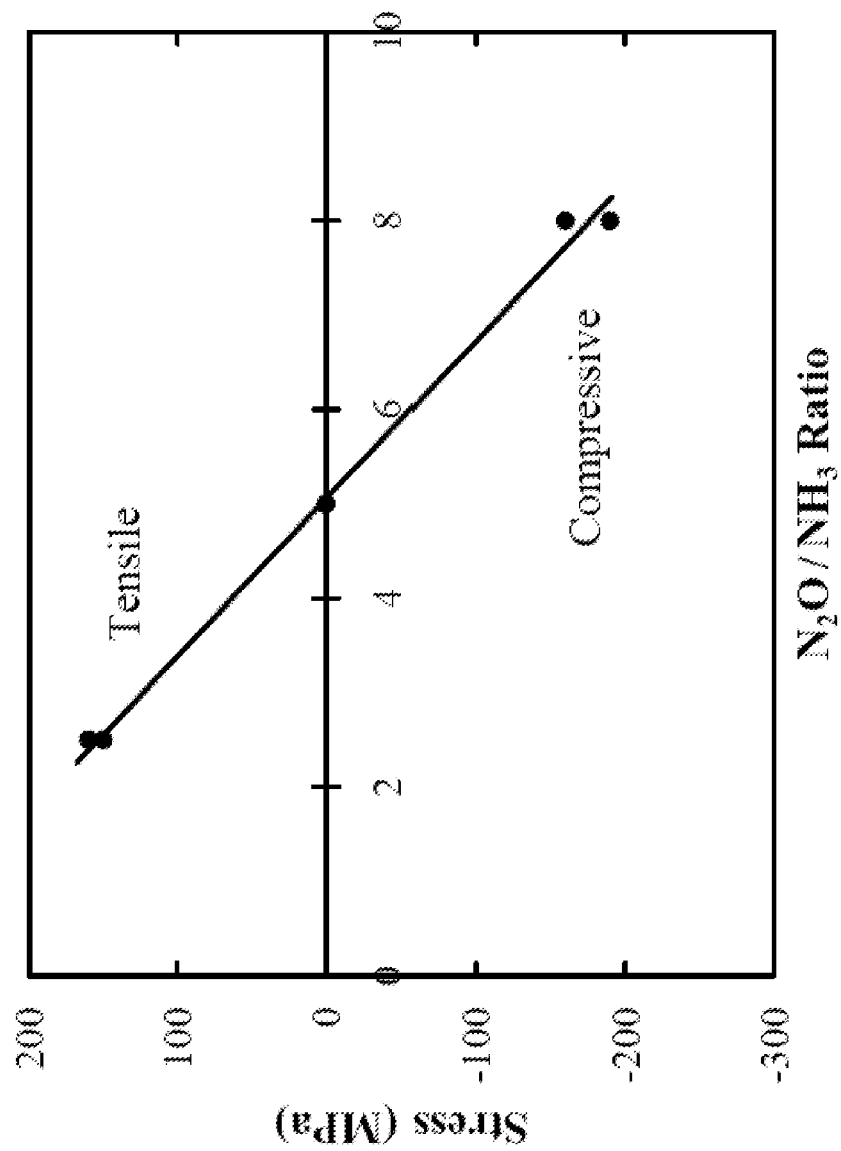
FIG. 11 illustrates the dependence of stress that a silicon nitride liner generates as a function of the $N_2O/NH_3$ ratio used during deposition of the silicon nitride liner.

In one embodiment, the sacrificial material layers 42 comprise a compressive-stress-generating silicon nitride material that applies a compress stress having a magnitude in a range from 0.5 GPa to 5.0 GPa to material portions in contact with the sacrificial material layers. The compressive-stress-generating silicon nitride material can be deposited in a plasma enhanced chemical vapor deposition (PECVD) process using a silicon precursor such as silane, $N_2O$ and $NH_3$. FIG. 11 illustrates the stress that a silicon nitride layer generates as a function of the $N_2O/NH_3$ ratio used during deposition of the silicon nitride layer.

Referring to FIG. 10B, at least one electrically isolated core material layer 462L can be formed in the memory cavities 49'. The at least one electrically isolated core material layer 462L can include a combination of a silicon oxide liner 161 and a stressor material layer 162L, a stressor material layer 162L, a combination of a silicon nitride liner 261 and a thermal silicon oxide layer 262L, or a thermal silicon oxide layer 262L described above. In this case, a stressor material can be formed directly on a substantially vertical sidewall of each vertical semiconductor channel 60. Alternatively, the at least one electrically isolated core material layer 462L can include undoped silicate glass or a doped silicate glass.

Figure 10C:
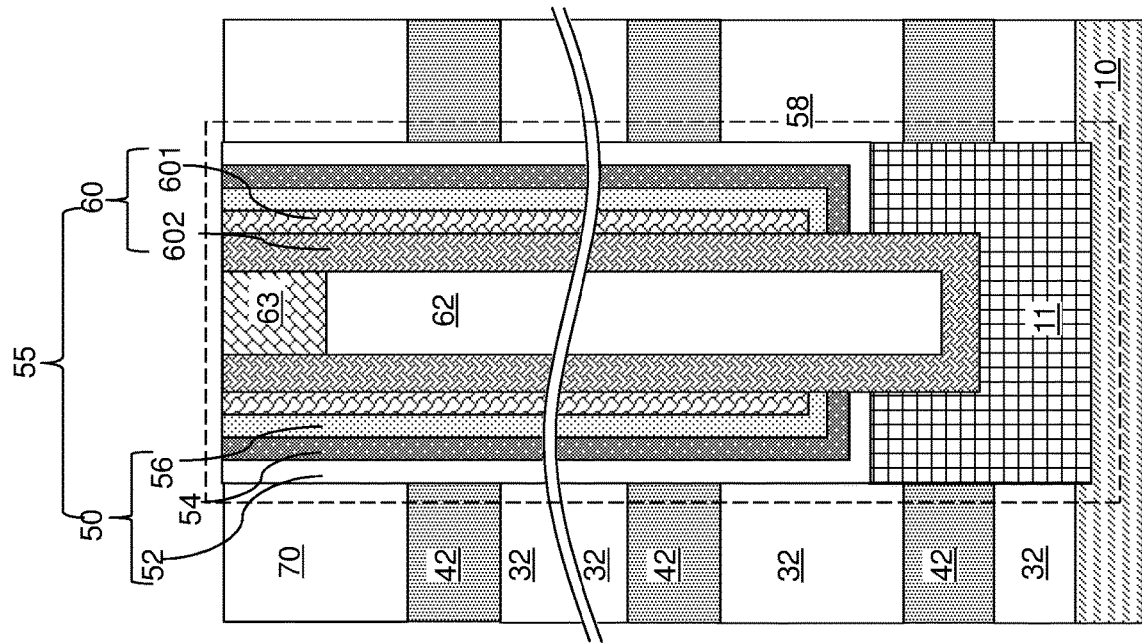

Referring to FIG. 10C, horizontal portions of the at least one electrically isolated core material layer 462L can be removed from above the horizontal plane including a top surface of the insulating cap layer 70. The material of the at least one electrically isolated core material layer 462L can be vertically recessed below the horizontal plane including a top surface of the insulating cap layer 70 by a recess etch. Each remaining portion of the at least one electrically isolated core material layer 462L constitutes an electrically isolated core 62. Each electrically isolated core 62 can be formed within a cavity in a respective memory opening 49. The electrically isolated core 62 can be formed by any of the methods described above for forming an electrically isolated core 62. For example, the electrically isolated core 62 can include a combination of a silicon oxide liner 161 and a stressor pillar structure 162 as in the first configuration of the memory opening fill structure 58, a stressor pillar structure 162 as in the second configuration of the memory opening fill structure 58, a combination of a silicon nitride liner 261 and a stressor pillar structure 262 as in the third configuration of the memory opening fill structure 58, or a stressor pillar structure 262 as in the fourth configuration of the memory opening fill structure 58. Alternatively, the electrically isolated core 62 may include, and/or consist essentially of, undoped silicate glass or a doped silicate glass. Horizontal portions of the second semiconductor channel layer 604 located above the top surface of the insulating cap layer 70 can be removed by a recess etch or by chemical mechanical planarization. A stack of a first semiconductor channel layer 603 and a second semiconductor channel layer 604 constitutes a vertical semiconductor channel 60 of a vertical NAND string.

Figure 10D:
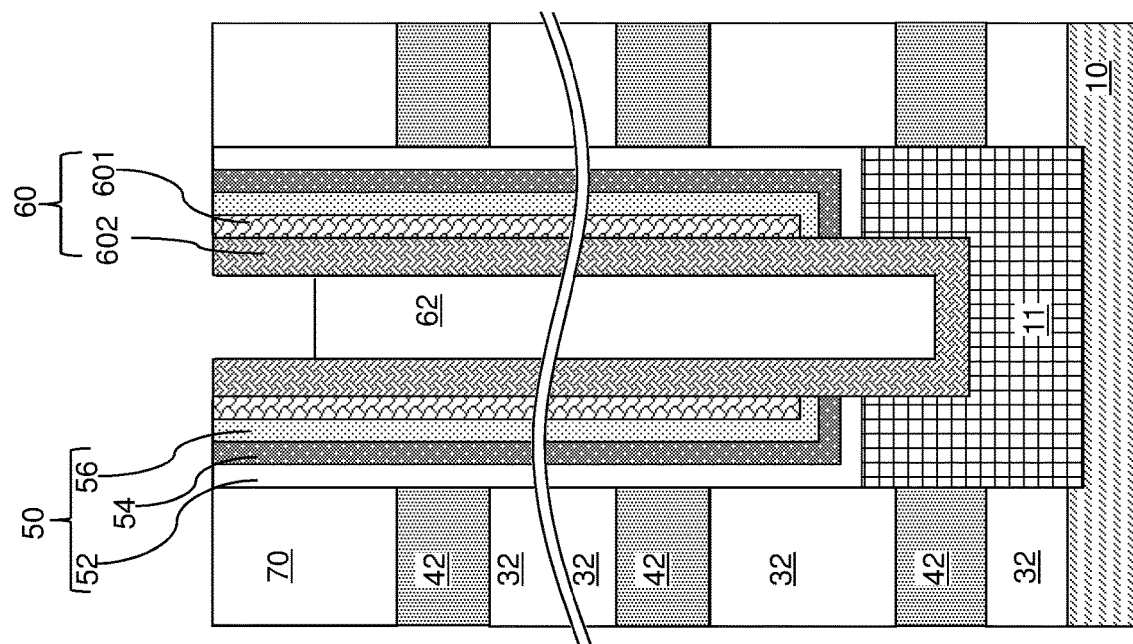

Referring to FIG. 10D, a drain region 63 can be formed at upper ends of the vertical semiconductor channels 60. Each vertical semiconductor channel 60 includes a combination of a first semiconductor channel layer 601 and a second semiconductor channel layer 602, or a combination of a first semiconductor channel layer 603 and a second semiconductor channel layer 604.

A stress-memorization anneal process can be performed to permanently settle the microstructural state of the vertical semiconductor channels 60 in a vertically stretched state caused by the vertical tensile strain induced by the laterally compressive stress applied by the compressive-stress-generating silicon nitride material of the sacrificial material layers 42. The stress-memorization anneal process can use a rapid thermal anneal that is performed in a temperature range from 950 degrees Celsius to 1,000 degrees Celsius, such as from 1,000 degrees Celsius to 1,075 degrees Celsius. The permanent change in the microstructural state of the vertical semiconductor channels 60 remains after the sacrificial material layers 42 are subsequently removed and replaced with electrically conductive layers.

Figure 12A:
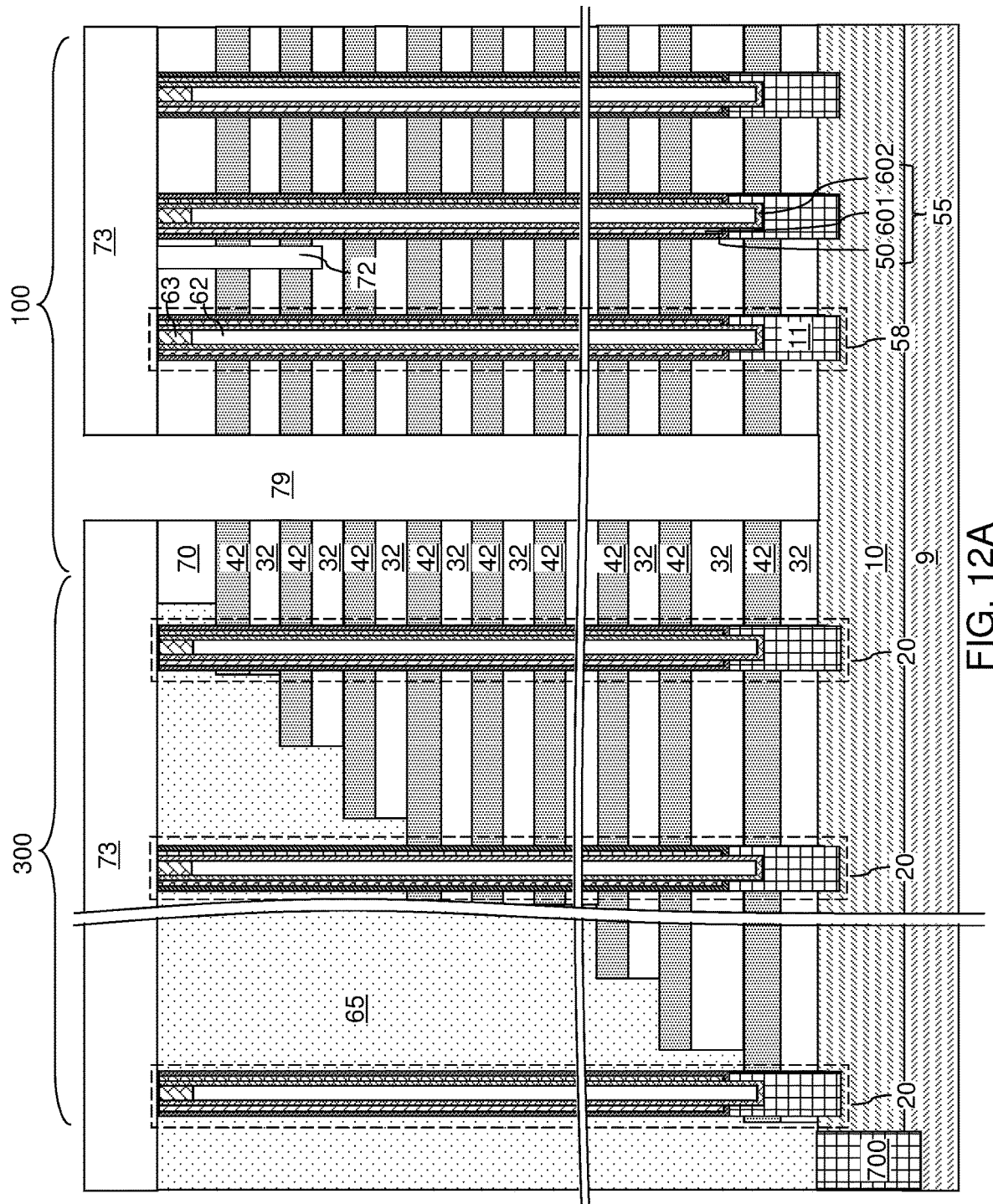
FIG. 12A is a schematic vertical cross-sectional view of the first exemplary structure after formation of backside trenches according to an embodiment of the present disclosure.
Figure 12B:
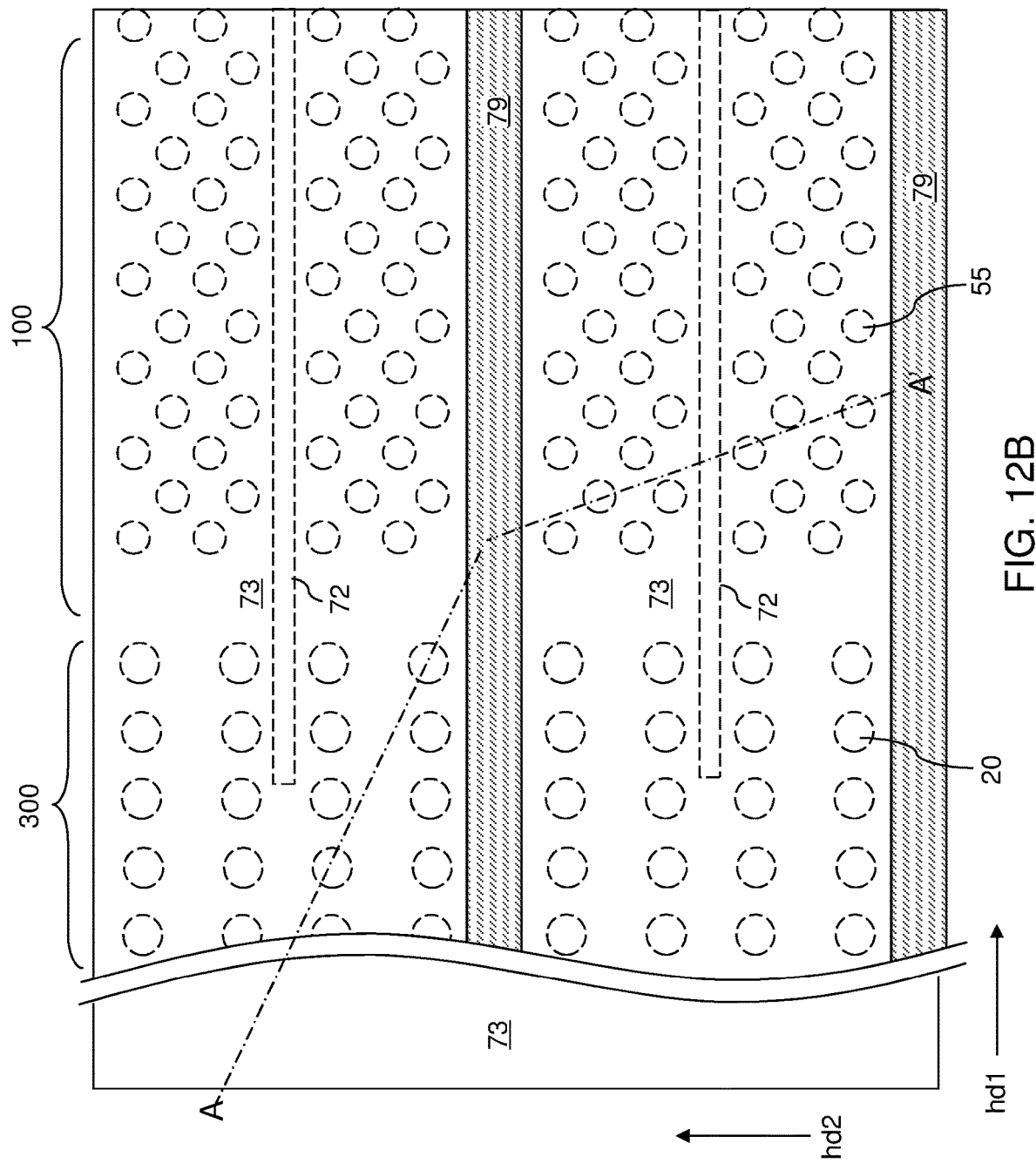
FIG. 12B is a partial see-through top-down view of the first exemplary structure of FIG. 12A. The vertical plane A-A' is the plane of the schematic vertical cross-sectional view of FIG. 12A.

Referring to FIGS. 12A and 12B, each configuration of the first exemplary structure includes memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. The stressor pillar structures (162, 262, 62) have a respective circular cylindrical shape or a respective laterally-elongated cylindrical shape. The vertical semiconductor channels 60 laterally surround a respective one of the stressor pillar structures (162, 262, 62), and memory films 50 laterally surround a respective one of the vertical semiconductor channels 60.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described using the illustrated configuration for the memory stack structure, the methods of various embodiments of the present disclosure can be applied to alternative memory stack structures including different layer stacks or structures for the memory film 50 and/or for the vertical semiconductor channel 60.

A contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 13:
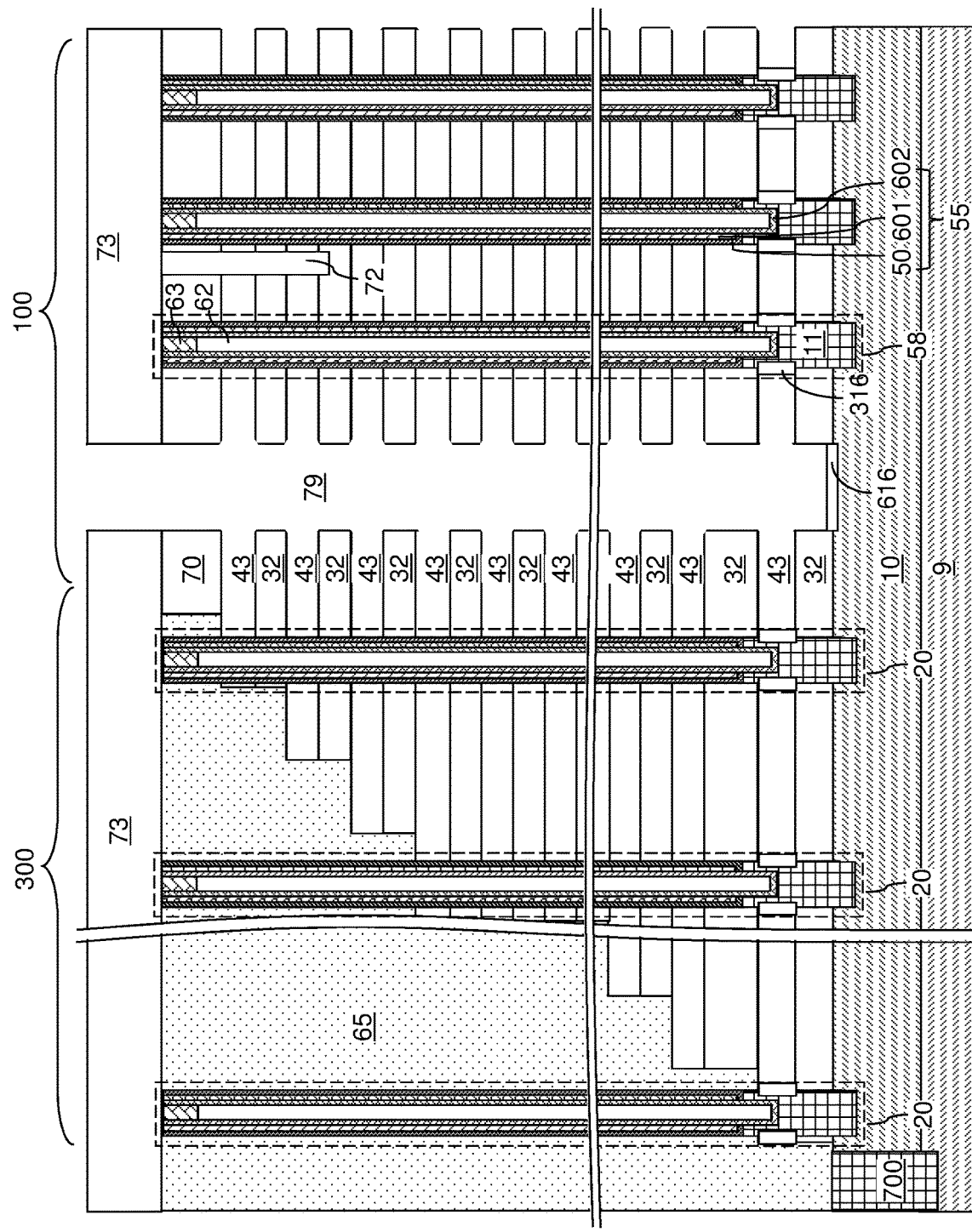
FIG. 13 is a schematic vertical cross-sectional view of the first exemplary structure after formation of backside recesses according to an embodiment of the present disclosure.

Referring to FIGS. 13 and 14A, an etchant that selectively etches the second material of the sacrificial material layers 42 with respect to the first material of the insulating layers 32 can be introduced into the backside trenches 79, for example, using an etch process. FIG. 14A illustrates a region of the first exemplary structure of FIG. 13. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 316, and to convert each physically exposed surface portion of the semiconductor material layer 10 into a planar dielectric portion 616. In one embodiment, each tubular dielectric spacer 316 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 316 include a dielectric material that includes the same semiconductor element as the pedestal channel portions 11 and additionally includes at least one non-metallic element such as oxygen and/or nitrogen such that the material of the tubular dielectric spacers 316 is a dielectric material. In one embodiment, the tubular dielectric spacers 316 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 14B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 316 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 14C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Figure 15:
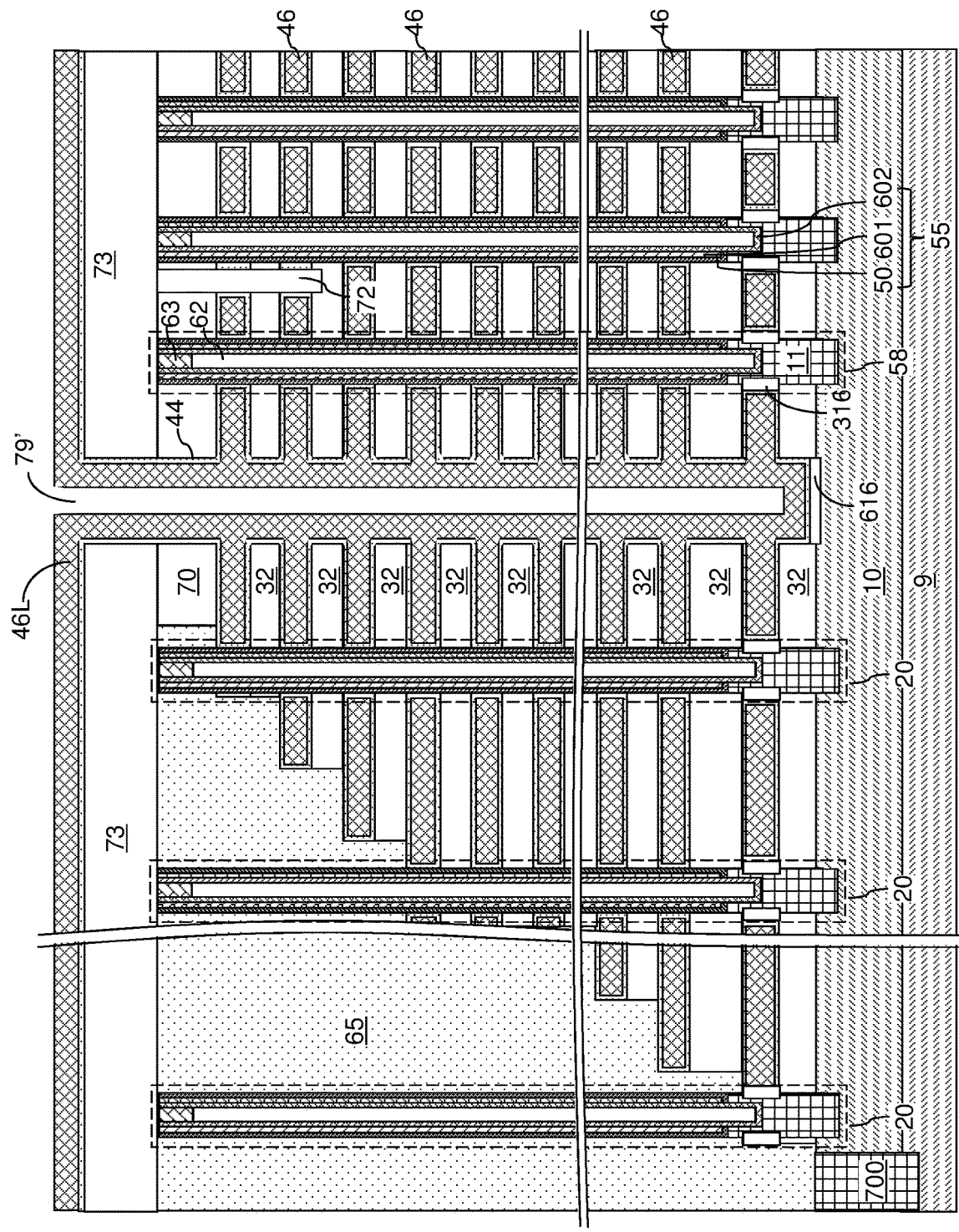
FIG. 15 is a schematic vertical cross-sectional view of the first exemplary structure at the processing step of FIG. 9D.

Referring to FIGS. 14D and 15, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 316 laterally surrounds a pedestal channel portion 11. A bottommost electrically conductive layer 46 laterally surrounds each tubular dielectric spacer 316 upon formation of the electrically conductive layers 46.

Figure 16A:
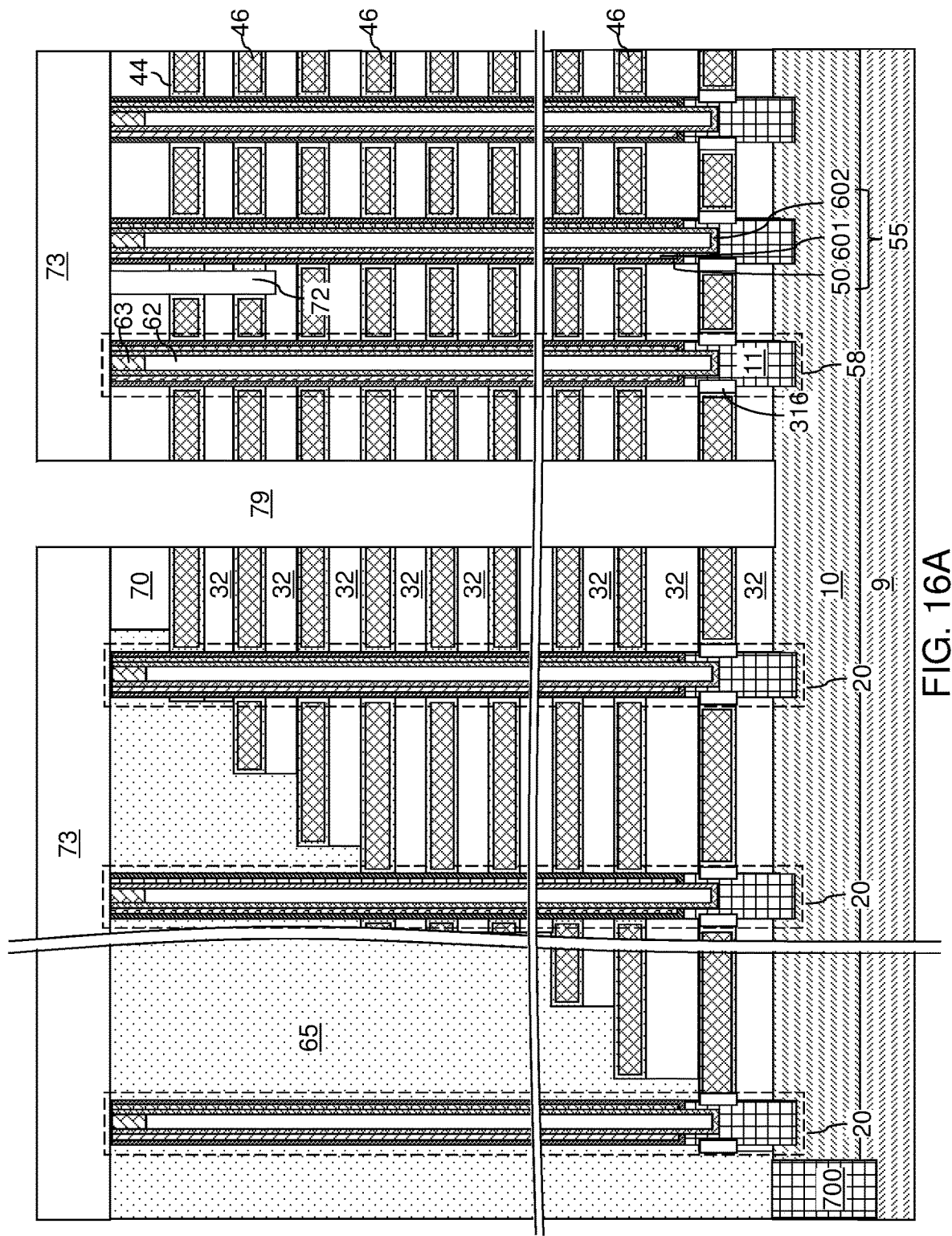
FIG. 16A is a schematic vertical cross-sectional view of the first exemplary structure after removal of a deposited conductive material from within the backside trench according to an embodiment of the present disclosure.
Figure 16B:
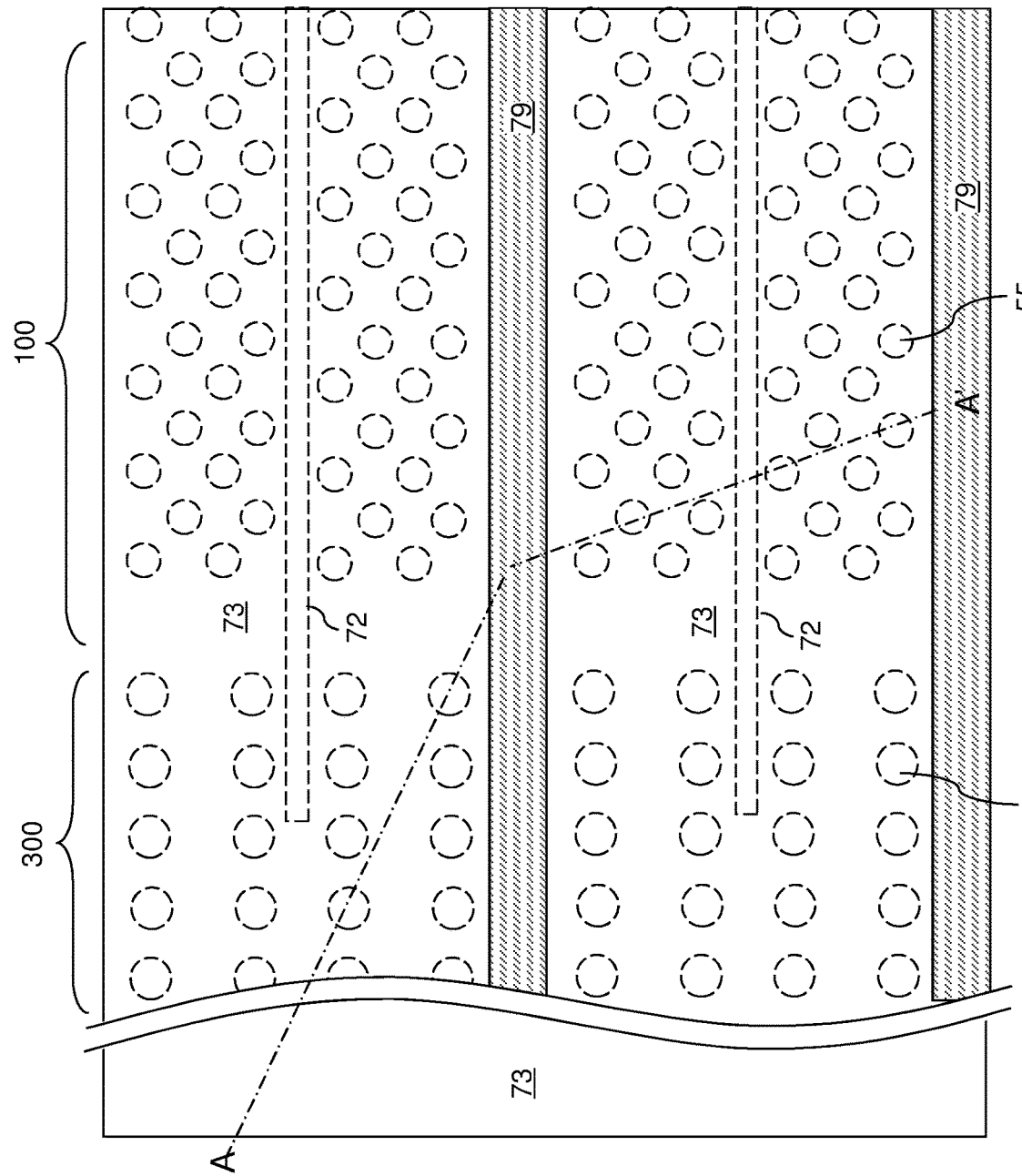
FIG. 16B is a partial see-through top-down view of the first exemplary structure of FIG. 16A. The vertical plane A-A' is the plane of the schematic vertical cross-sectional view of FIG. 16A.

Referring to FIGS. 16A and 16B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

Figure 17A:
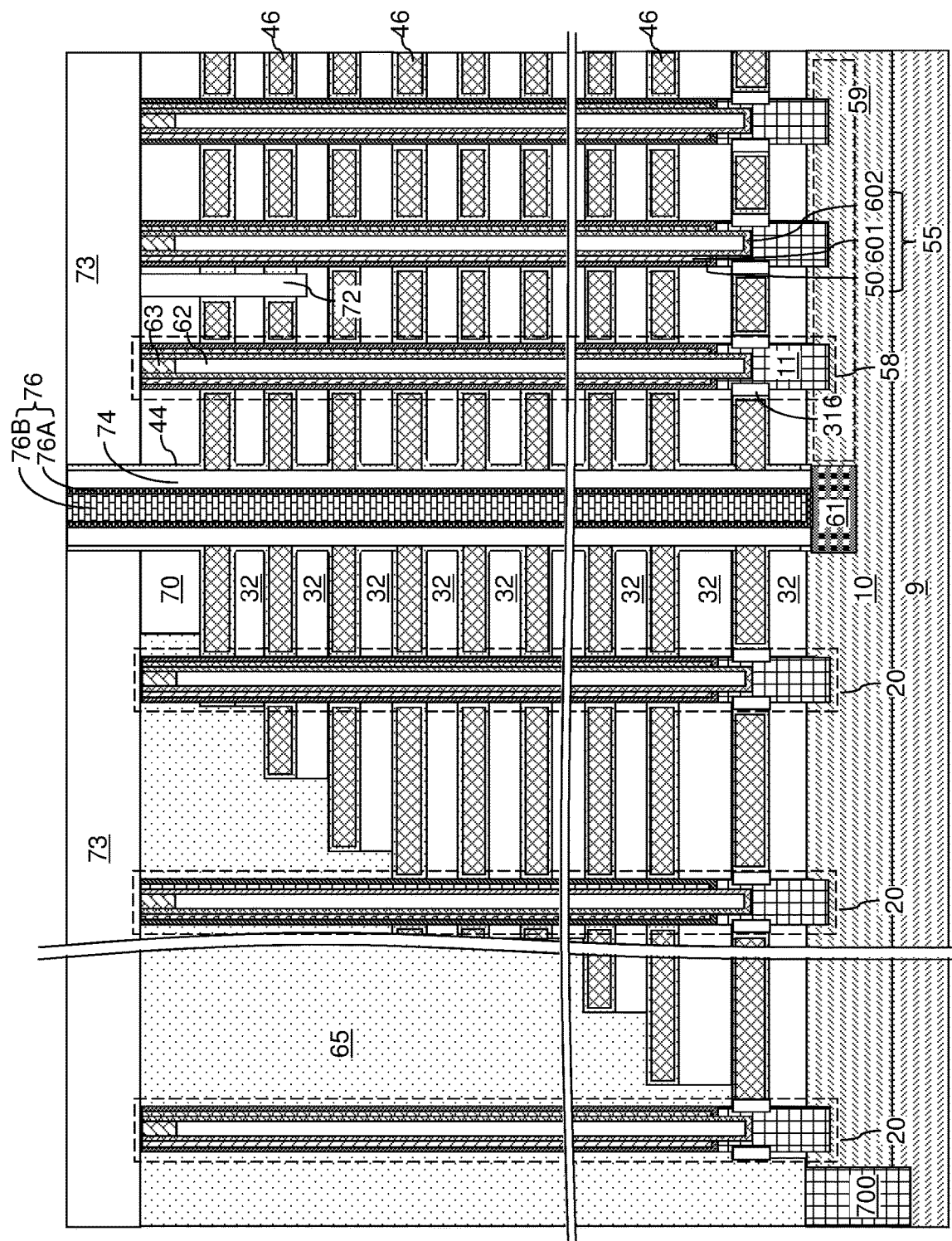
FIG. 17A is a schematic vertical cross-sectional view of the first exemplary structure after formation of an insulating spacer and a backside contact structure according to an embodiment of the present disclosure.

Referring to FIGS. 17A and 17B, an insulating material layer can be formed in the backside trenches 79 and over the contact level dielectric layer 73 by a conformal deposition process. First exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not used, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized using the contact level dielectric layer 73 overlying the alternating stack (32, 46) as a stopping layer. If chemical mechanical planarization (CMP) process is used, the contact level dielectric layer 73 can be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 can contact a sidewall of the backside blocking dielectric layer 44.

According to an aspect of the present disclosure, the electrically conductive layers 46 formed at the processing steps of FIGS. 14D, 15, 16A and 16B can be a metallic material that applies a compress stress. The memory stack structures 55 are included within the electrically conductive layers 46 and extend vertically. Due to the vertically-extending geometry of the memory stack structures 55, the electrically conductive layers 46 apply a laterally compressive stress to the memory stack structures 55. The laterally compressive stress applied by the electrically conductive layers 46 induces a vertical tensile stress within each vertical semiconductor channel 60 due to the Poisson effect. In one embodiment, the electrically conductive layers 46 can apply a laterally compressive stress having a magnitude in a range from 3 GPa to 9.0 GPa to the vertical semiconductor channels 60, which induces vertical tensile stress within each of the vertical semiconductor channels 60. The vertical tensile stress within the vertical semiconductor channels 60 induces enhancement in charge carrier mobility within the semiconductor material of the vertical semiconductor channels 60.

A stress-memorization anneal process can be performed to permanently settle the microstructural state of the vertical semiconductor channels 60 in a vertically stretched state caused by the vertical tensile strain induced by the laterally compressive stress applied by the electrically conductive layers 46. The stress-memorization anneal process can use a rapid thermal anneal that is performed in a temperature range from 950 degrees Celsius to 1,000 degrees Celsius, such as from 1,000 degrees Celsius to 1,075 degrees Celsius. The permanent change in the microstructural state of the vertical semiconductor channels 60 remains after the sacrificial material layers 42 are subsequently removed and replaced with electrically conductive layers.

Generally, a stress memorization process can be performed to provide a three-dimensional memory device having a higher charge carrier mobility. In a three-dimensional memory device an alternating stack of insulating layers 32 and sacrificial material layers 42 is formed over a substrate (9, 10). Memory openings 49 are formed through the alternating stack (32, 42), and memory stack structures 55 are formed in the memory openings 49. Each memory stack structure 55 comprises a memory film 50 that contains a vertical stack of memory elements located at levels of the sacrificial material layers 42, and a vertical semiconductor channel 60 that contacts the memory film 50. The sacrificial material layers 42 are replaced with electrically conductive layers 46. A lateral compressive stress is applied to the vertical semiconductor channels 60 in the memory stack structures 55. The lateral compressive stress induces a tensile stress in the vertical semiconductor channels 60 along the vertical direction. The lateral compressive stress to the memory stack structures 55 can be provided by the electrically conductive layers 46. Specifically, backside recesses 43 are formed by removing the sacrificial material layers 42 and depositing a compressive-stress-generating conductive material within the backside recesses to form the electrically conductive layers 46. The compressive-stress-generating conductive material comprises a compressive-stress-generating metal such as tungsten that laterally surrounds the memory stack structures 55.

Figure 18A:
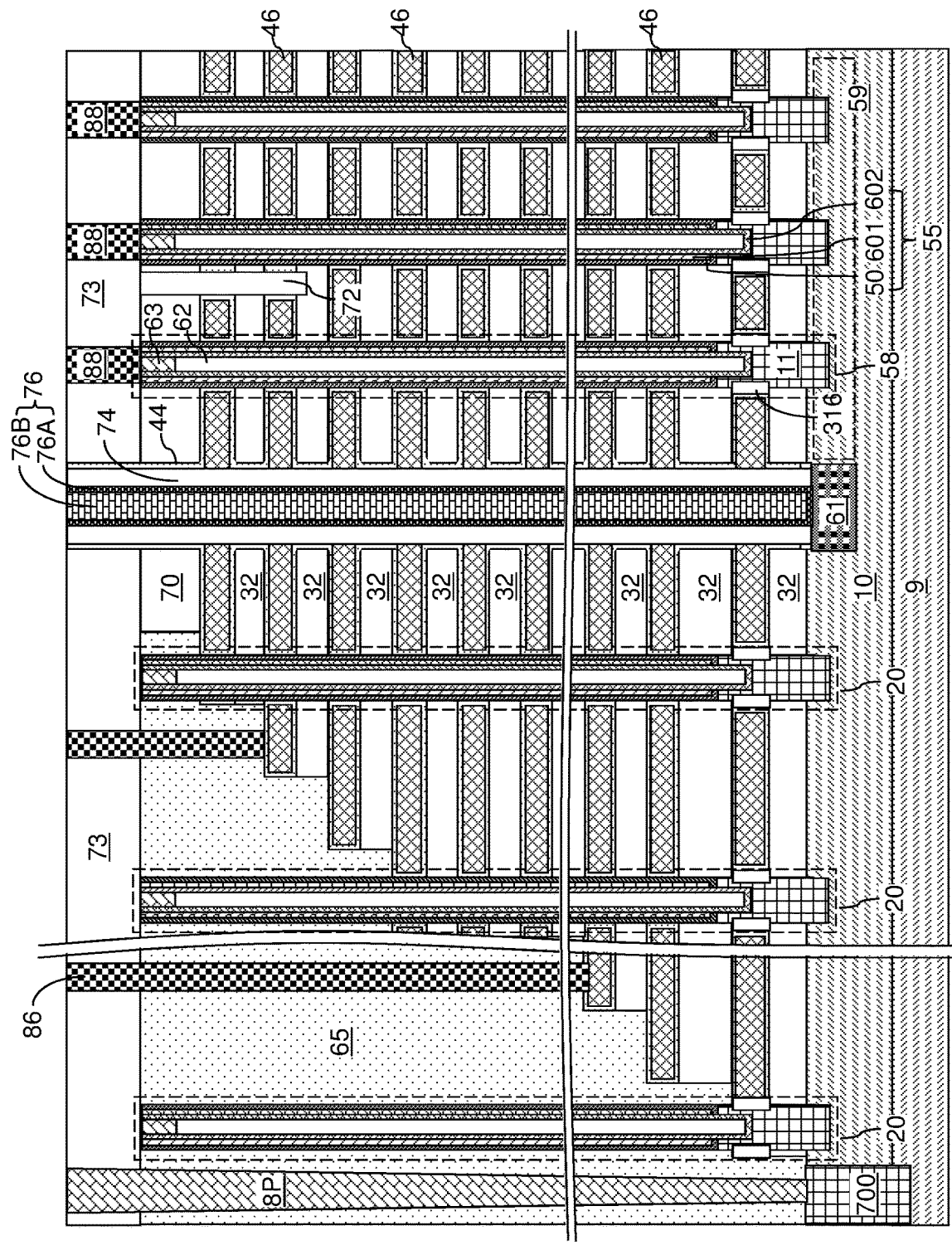
FIG. 18A is a schematic vertical cross-sectional view of the first exemplary structure after formation of additional contact via structures according to an embodiment of the present disclosure.
Figure 18B:
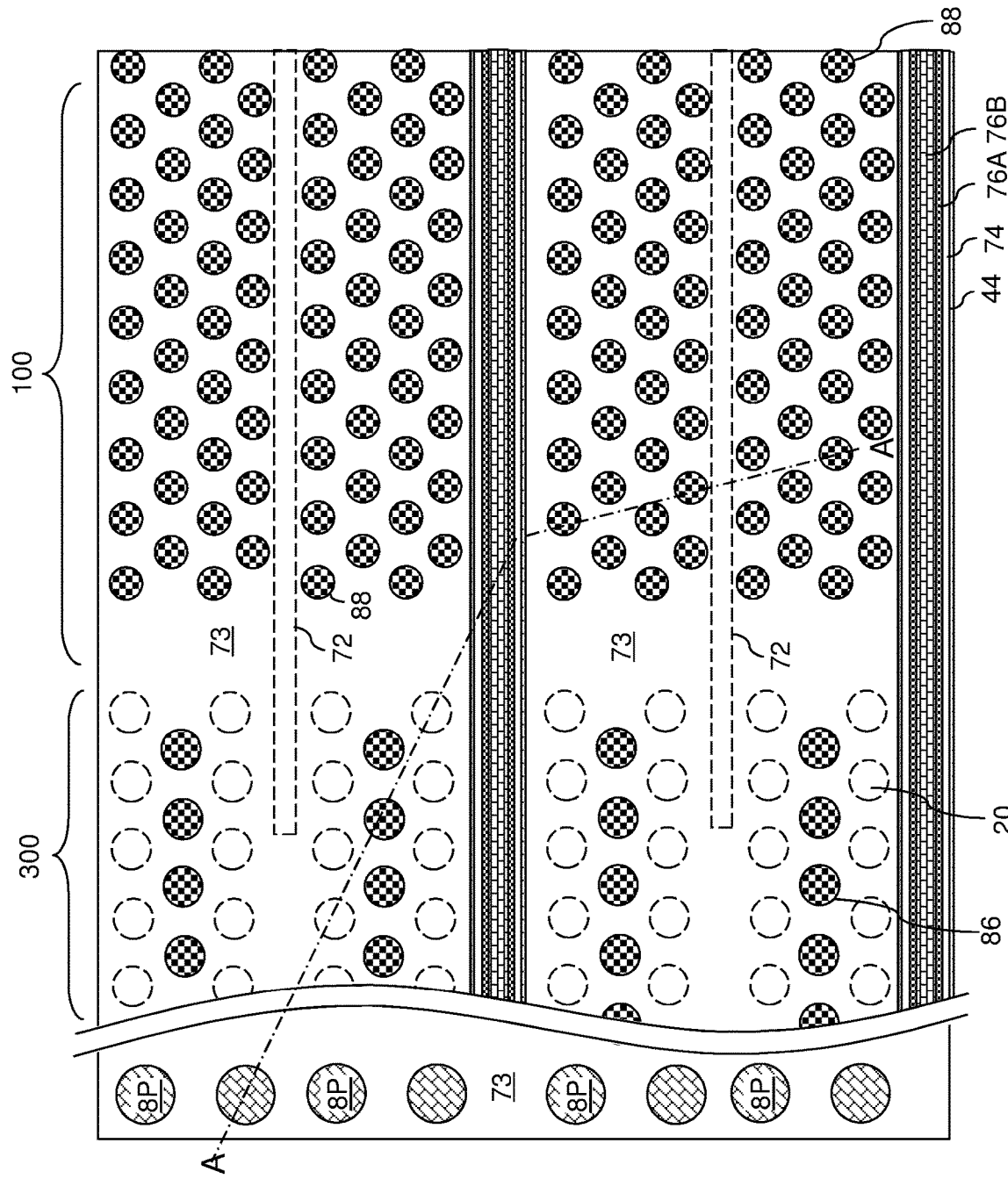
FIG. 18B is a top-down view of the first exemplary structure of FIG. 18A. The vertical plane A-A' is the plane of the schematic vertical cross-sectional view of FIG. 18A.

Referring to FIGS. 18A and 18B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 19A:
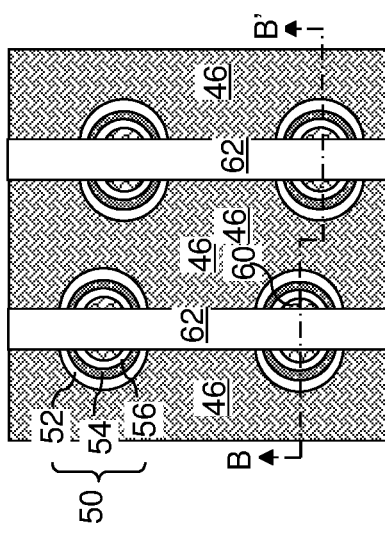
FIG. 19A is a top-down view of a second exemplary structure including split-cell three-dimensional memory elements according to an embodiment of the present disclosure.
Figure 19B:
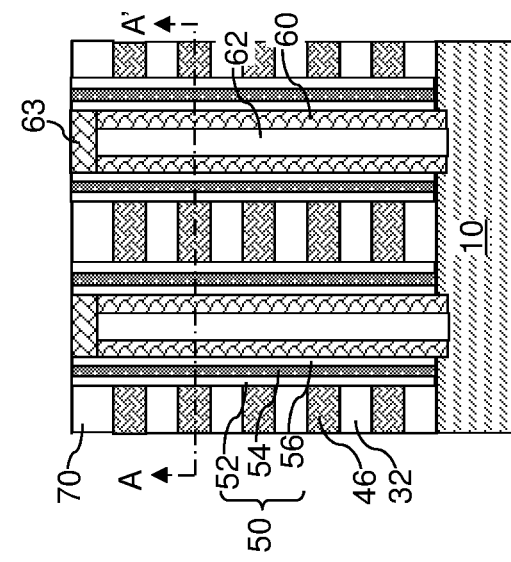
FIG. 19B is a vertical cross-sectional view along the vertical plane B-B' of FIG. 19A.

Referring to FIGS. 19A and 19B, a second exemplary structure including split-cell three-dimensional memory elements according to an embodiment of the present disclosure is illustrated. The second exemplary structure of FIGS. 19A and 19B can be formed by performing the processing steps of the first exemplary structure using an elongates shape (such as a shape of an oval or an ellipse) for the horizontal cross-sectional shape of each memory opening 49. After formation of the second semiconductor channel layer (602, 604) in any of the configurations of the first embodiment, a photoresist layer can be applied over the insulating cap layer 70, and is lithographically patterned to form line-shaped openings in the photoresist layer. The locations of the memory openings 49 and the line-shaped openings in the photoresist layer are selected such that the line-shaped openings extend through a center portion of a respective set of memory openings. Line trenches can be formed through the alternating stack (32, 42) and through the center region of each memory opening 49. Each line trench can have a pair of substantially vertical sidewalls that extend through each layer of the alternating stack (32, 42) and a row of memory openings 49.

An electrically isolated core 62 is formed within each of the line trenches. Each electrically isolated core 62 can include any material or any combination of materials used for the electrically isolated cores 62 of the first exemplary structure. For example, each electrically isolated core 62 can include a combination of a silicon oxide liner 161 and a stressor pillar structure 162 as in the first configuration of the memory opening fill structure 58 of the first exemplary structure, a stressor pillar structure 162 as in the second configuration of the memory opening fill structure 58 of the first exemplary structure, a combination of a silicon nitride liner 261 and a stressor pillar structure 262 as in the third configuration of the memory opening fill structure 58 of the first exemplary structure, or a stressor pillar structure 262 as in the fourth configuration of the memory opening fill structure 58 of the first exemplary structure. Alternatively, the electrically isolated core 62 may include, and/or consist essentially of, undoped silicate glass or a doped silicate glass. Subsequently, drain regions 63 can be formed above the electrically isolated cores 62. Specifically, each drain region 63 can be formed on upper ends of a pair of vertical semiconductor channels 60 formed within a respective memory opening. The electrically isolated cores 62 can apply a lateral compressive stress and a vertical tensile stress to the vertical semiconductor channels 60 as in the first exemplary structure. In one embodiment, each of the semiconductor channels 60 may include a lateral stack of a first semiconductor channel layer 603 and a second semiconductor channel layer 604 as in the fifth configuration of the first exemplary structure.

In addition, any of the stress memorization methods that can be used for the first exemplary structure can be used on the second exemplary structure. In the second exemplary structure, the laterally compressive stress can be applied by the sacrificial material layers 42 and memorized in the vertical semiconductor channels 60 during a stress memorization anneal process. Alternatively, the lateral compressive stress can be applied by electrically conductive layers 46 that replace the sacrificial material layers 42, and memorized in the vertical semiconductor channels 60 during a stress memorization anneal process.

Generally, the memory cell in a split cell configuration of the second exemplary structure can comprise a semi-cylindrical outer sidewall surface, which can be an outer sidewall surface of a blocking dielectric layer 52. An electrically isolated core 62 fills each line trench. Each stressor pillar structure (162, 262, 62) can include a pair of planar sidewalls that vertically extend through all levels of the electrically conductive layers 46 and laterally extends with a uniform lateral separation distance (e.g., a lateral width) therebetween. In embodiments in which a silicon oxide liner 161 or a silicon nitride liner 262 is not used, a stressor pillar structure (162, 262, 62) contacts two rows of memory films 50. In embodiments in which a silicon oxide liner 161 or a silicon nitride liner 262 is used in each electrically isolated core 62, a stressor pillar structure (162, 262, 62) can be laterally spaced from two rows of memory films 50 by the silicon oxide liner 161 or the silicon nitride liner 262.

Figure 20A:
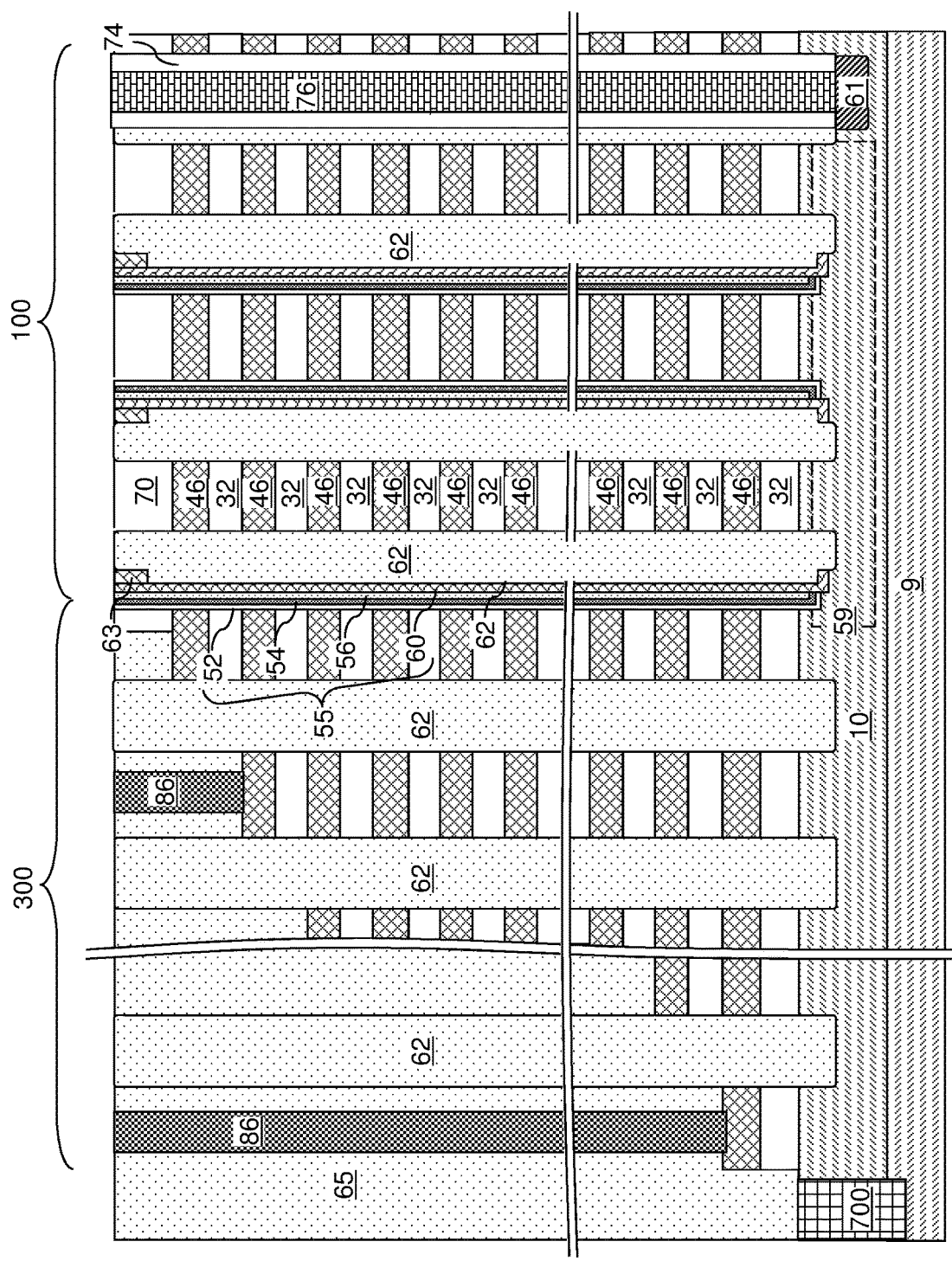
FIG. 20A is a vertical cross-sectional view of a third exemplary structure including flat cell three-dimensional memory elements according to an embodiment of the present disclosure.
Figure 20B:
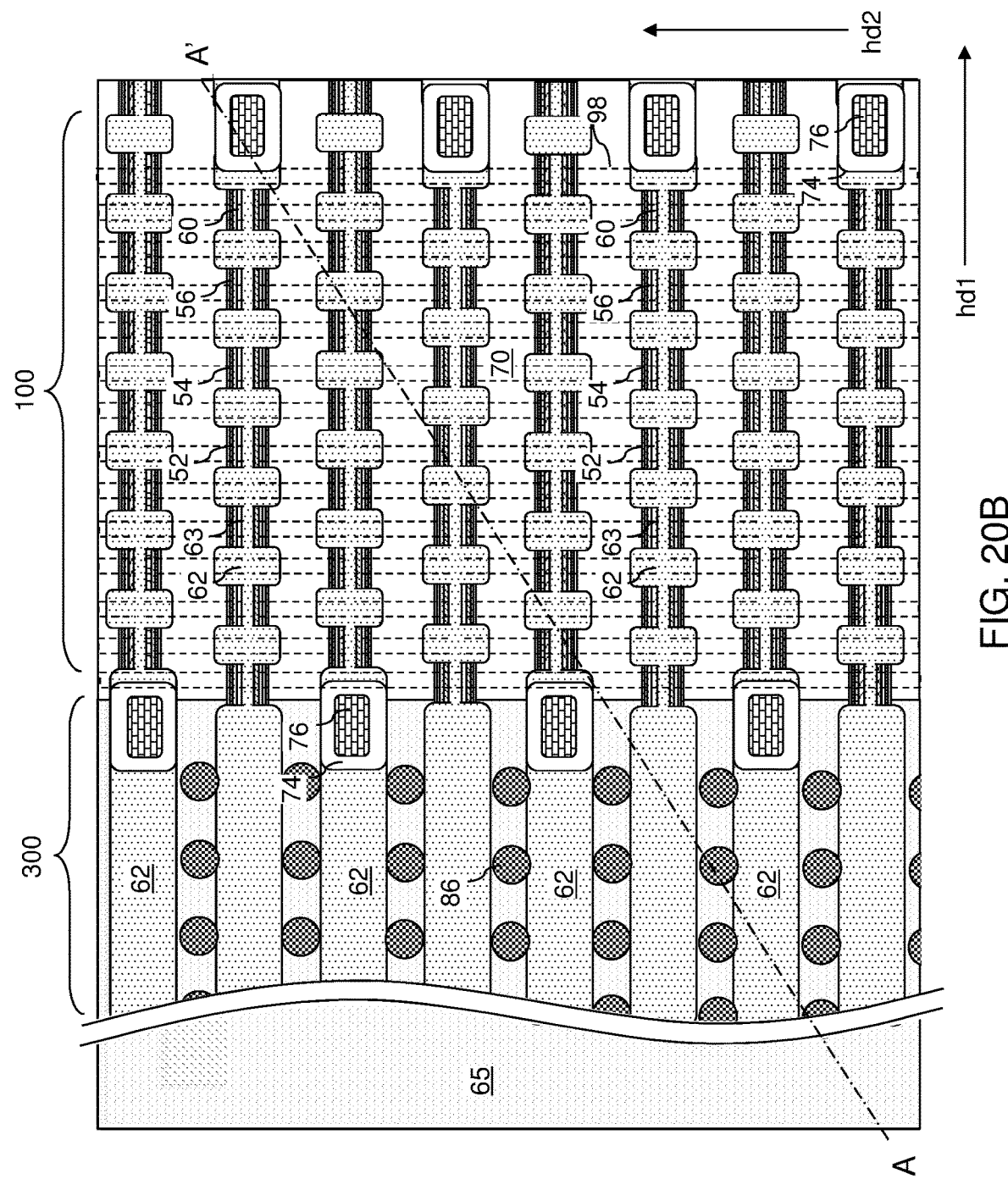
FIG. 20B is a top-down view of the exemplary structure of FIG. 20A. The vertical plane A-A' is the plane of the vertical cross-sectional view of FIG. 20A.

Referring to FIGS. 20A and 20B, a third exemplary structure according to an embodiment of the present disclosure is illustrated. The third exemplary structure includes flat cell three-dimensional memory elements, which can be provided by forming line trenches laterally extending along a first horizontal direction hd1 and laterally spaced apart along a second horizontal direction hd2 that is perpendicular to the first horizontal direction hd1.

The blocking dielectric layer 52, the charge storage layer 54, the tunneling dielectric layer 56, the first semiconductor channel layer (601, 603), and the second semiconductor channel layer (602, 604) are formed in the line trenches in lieu of the memory openings of the first exemplary structure. A photoresist layer can be applied over the third exemplary structure, and a two-dimensional array of discrete rectangular openings can be formed through the photoresist layer. A two-dimensional array of pillar trenches can be formed through the line trenches such that each set of material portions of the blocking dielectric layer 52, the charge storage layer 54, the tunneling dielectric layer 56, the first semiconductor channel layer (601, 603), and the second semiconductor channel layer (602, 604) are divided into discrete material portions that are laterally spaced apart along the first horizontal direction hd1 by the pillar trenches. The pillar trenches in the staircase region 300 can be laterally elongated along the first horizontal direction hd1. The photoresist layer is subsequently removed, for example, by ashing. A void having a laterally undulating width is formed within each line trench.

An electrically isolated core 62 is formed within each of the voids having a respective laterally undulating width. Each electrically isolated core 62 can include any material or any combination of materials used for the electrically isolated cores 62 of the first exemplary structure. For example, each electrically isolated core 62 can include a combination of a silicon oxide liner 161 and a stressor pillar structure 162 as in the first configuration of the memory opening fill structure 58 of the first exemplary structure, a stressor pillar structure 162 as in the second configuration of the memory opening fill structure 58 of the first exemplary structure, a combination of a silicon nitride liner 261 and a stressor pillar structure 262 as in the third configuration of the memory opening fill structure 58 of the first exemplary structure, or a stressor pillar structure 262 as in the fourth configuration of the memory opening fill structure 58 of the first exemplary structure. Alternatively, the electrically isolated core 62 may include, and/or consist essentially of, undoped silicate glass or a doped silicate glass. Subsequently, drain regions 63 can be formed above the electrically isolated cores 62. Specifically, each drain region 63 can be formed on upper ends of a pair of vertical semiconductor channels 60 formed within a respective memory opening. The electrically isolated cores 62 can apply a lateral compressive stress and a vertical tensile stress to the vertical semiconductor channels 60 as in the first exemplary structure. In one embodiment, each of the semiconductor channels 60 may include a lateral stack of a first semiconductor channel layer 603 and a second semiconductor channel layer 604 as in the fifth configuration of the first exemplary structure.

In addition, any of the stress memorization methods that can be used for the first exemplary structure can be used on the third exemplary structure. In the third exemplary structure, the laterally compressive stress can be applied by the sacrificial material layers 42 and memorized in the vertical semiconductor channels 60 during a stress memorization anneal process. Alternatively, the lateral compressive stress can be applied by electrically conductive layers 46 that replace the sacrificial material layers 42, and memorized in the vertical semiconductor channels 60 during a stress memorization anneal process.

Discrete backside openings can be formed in lieu of the backside trenches of the first exemplary structure through portions of the electrically isolated cores 62. An insulating spacer 74 and a backside contact via structure 76 can be formed within each backside opening.

Generally, the memory cell in a flat cell configuration of the third exemplary structure can comprise a flat outer sidewall surface, which can be an outer sidewall surface of a blocking dielectric layer 52. An electrically isolated core 62 contacts two rows of vertical stacks of memory cells. Each memory film 50 can comprise a pair of substantially vertical planar sidewall surfaces, which can contact an alternating stack of insulating layers 32 and electrically conductive layers 46 on one side and a vertical semiconductor channel 60 on another side. Each stressor pillar structure (162, 262, 62) in the electrically isolated cores 62 can include a pair of laterally undulating lengthwise sidewalls that vertically extend through all levels of the electrically conductive layers 46 and laterally spaced apart with an undulating lateral separation distance along the second horizontal direction hd2.

In embodiments in which a silicon oxide liner 161 or a silicon nitride liner 262 is not used, a stressor pillar structure (162, 262, 62) contacts the two rows of vertical semiconductor channels 60 and two rows of memory films 50. In embodiments in which a silicon oxide liner 161 or a silicon nitride liner 262 is used in each electrically isolated core 62, a stressor pillar structure (162, 262, 62) can be laterally spaced from two rows of vertical semiconductor channels 60 and two rows of memory films 50 by the silicon oxide liner 161 or the silicon nitride liner 262.

Referring to all drawings related to the first, second, and third exemplary structures and according to various embodiments of the present disclosure, a three-dimensional memory device is provided. The three-dimensional memory device comprises an alternating stack of insulating layers 32 and electrically conductive layers 46 located over a substrate (9, 10); a memory stack structure 55 vertically extending through the alternating stack (32, 46), wherein the memory stack structure 55 comprises a memory film 50 that contains a vertical stack of memory elements located at levels of the electrically conductive layers 46, and a vertical semiconductor channel 60 that contacts the memory film 50; and a stressor pillar structure (162, 262, 62) located on a side of the vertical semiconductor channel 60, wherein: the stressor pillar structure (162, 262, 62) applies a vertical tensile stress to the vertical semiconductor channels 60; a lateral extent of the stressor pillar structure (162, 262, 62) is defined by at least one substantially vertical dielectric sidewall surface that provides a closed periphery around the stressor pillar structure (162, 262, 62); the stressor pillar structure (162, 262, 62) consists essentially of a stressor material and does not include any solid or liquid material therein other than the stressor material; and the stressor material is selected from a dielectric metal oxide material, silicon nitride deposited under stress, thermal silicon oxide or a semiconductor material having a greater lattice constant than that of the vertical semiconductor channel. The silicon nitride may be intentionally deposited under compressive or tensile stress, as shown in FIG. 11 and as described above. The silicon nitride may be intentionally deposited under tensile stress such that it that applies a compressive stress having a magnitude in a range from 0.5 GPa to 5.0 GPa to the semiconductor channel.

In one embodiment, the stressor material is selected from tantalum oxide, aluminum oxide, hafnium oxide, aluminum silicate, and hafnium silicate. In one embodiment, the stressor material is a dielectric metal oxide material and the stressor pillar structure (162, 262, 62) directly contacts a substantially vertical sidewall of the vertical semiconductor channel 60.

In one embodiment, the stressor material is a dielectric metal oxide material, and a silicon oxide liner 161 is located between, and contacts sidewalls of, the vertical semiconductor channel 60 and the stressor pillar structure 162.

In one embodiment, the stressor material is silicon nitride deposited under stress and the stressor pillar structure (162, 262, 62) directly contacts a substantially vertical sidewall of a respective one of the vertical semiconductor channels 60.

In one embodiment, the stressor material is thermal silicon oxide and the stressor pillar structure (162, 262, 62) directly contacts a substantially vertical sidewall of a respective one of the vertical semiconductor channels 60.

In one embodiment, the stressor material is thermal silicon oxide; and a silicon nitride liner 261 is located between, and contacts sidewalls of, the vertical semiconductor channel 60 and the stressor pillar structure 262.

In one embodiment, the vertical semiconductor channel 60 comprises intrinsic polysilicon or p-type doped polysilicon having a boron doping concentration less than $1 \times 10^{17}$ cm$^{-3}$, and the stressor material is a semiconductor material having a greater lattice constant than the intrinsic polysilicon or the p-type doped polysilicon having the boron doping concentration less than $1 \times 10^{17}$ cm$^{-3}$.

In one embodiment, the stressor pillar structure (162, 262, 62) has a circular cylindrical shape or a laterally-elongated cylindrical shape; the vertical semiconductor channel 60 laterally surrounds the stressor pillar structure (162, 262, 62); and the memory film 50 laterally surrounds the vertical semiconductor channel 60.

In one embodiment, the memory cell comprises a semi-cylindrical outer sidewall surface; the stressor pillar structure (162, 262, 62) includes a pair of planar sidewalls that vertically extend through all levels of the electrically conductive layers 46 and laterally extends with a uniform lateral separation distance therebetween.

In one embodiment, the memory film 50 comprises a pair of substantially vertical planar sidewall surfaces; the stressor pillar structure (162, 262, 62) includes a pair of laterally undulating lengthwise sidewalls that vertically extend through all levels of the electrically conductive layers and laterally spaced apart with an undulating lateral separation distance.

Figure 21B:
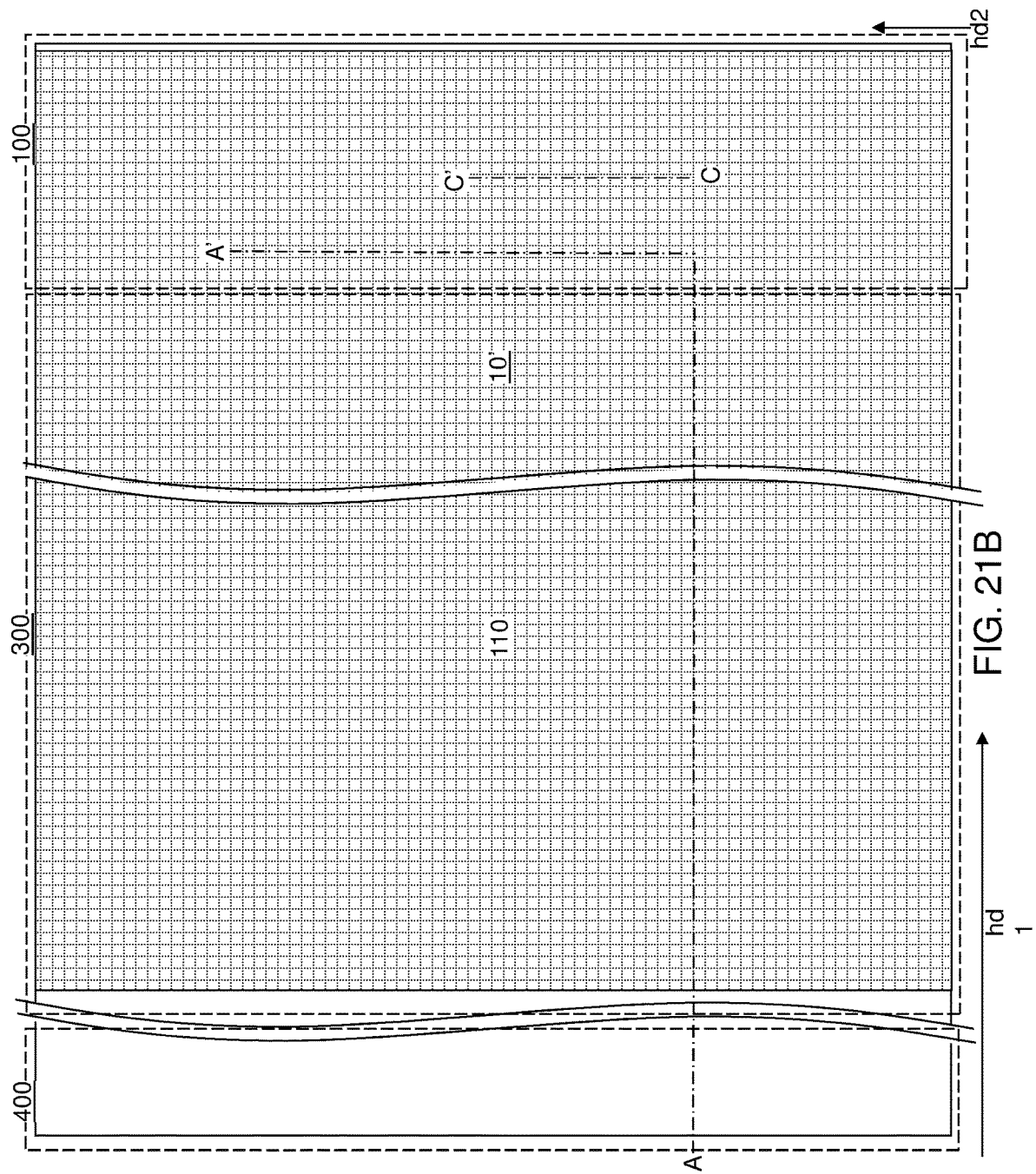
FIG. 21B is a top-down view of the fourth exemplary structure of FIG. 21A. The hinged vertical plane A-A' is the plane of the vertical cross-sectional view of FIG. 21A.
Figure 21C:
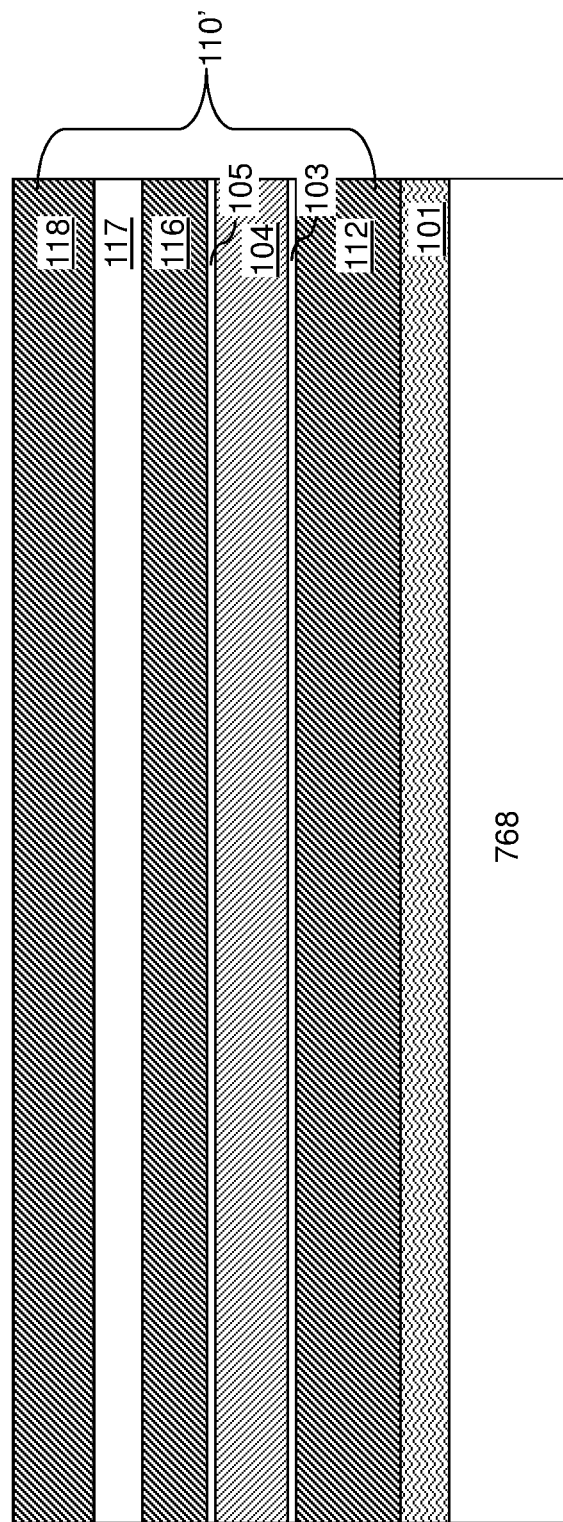
FIG. 21C is a magnified view of the in-process source level material layers along the vertical plane C-C' of FIG. 21B.

Referring to FIGS. 21A-21C, a fourth exemplary structure according to a first embodiment of the present disclosure is illustrated. The fourth exemplary structure includes a substrate 8 and semiconductor devices 710 formed thereupon. The substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring between the various nodes of the semiconductor devices and landing pads for through-memory-level contact via structures to be subsequently formed. The lower-level metal interconnect structures 780 are included within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be included within the first dielectric material layers 764. The first dielectric material layers 764 may be a plurality of dielectric material layers in which various elements of the lower-level metal interconnect structures 780 are sequentially included. Each of the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 can be formed within a topmost dielectric material layer of the first dielectric material layers 764 (which can be a plurality of dielectric material layers). Each of the lower-level metal interconnect structures 780 can include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 can be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each of the at least one second dielectric material layer 768 may include any of doped silicate glass, undoped silicate glass, and organosilicate glass. In one embodiment, the at least one second dielectric material layer 768 can comprise, or consist essentially of, dielectric material layers having dielectric constants that do not exceed the dielectric constant of undoped silicate glass (silicon oxide) of 3.9.

A planar sacrificial material layer 101 and in-process source-level material layers 110' can be formed over the at least one second dielectric material layer 768 with a pattern. The planar sacrificial material layer 101 includes a material that can be removed selective to the materials of the topmost layer of the at least one second dielectric material layer 768 and selective to the bottommost layer of the in-process source-level material layers 110'. In one embodiment, the planar sacrificial material layer 101 can include an undoped amorphous silicon, germanium or a silicon-germanium alloy including germanium at an atomic percentage greater than 20%, amorphous carbon, organosilicate glass, borosilicate glass, an organic polymer, or a silicon-based polymer. The thickness of the planar sacrificial material layer 101 may be in a range from 5 nm to 100 nm, although lesser and greater thicknesses can also be used.

The in-process source-level material layers 110' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 can include a doped semiconductor material such as doped polysilicon or doped amorphous silicon. The conductivity type of the lower source-level semiconductor layer 112 and the upper source-level semiconductor layer 116 can be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 can be in a range from 10 nm to 300 nm, such as from 20 nm to 150 nm, although lesser and greater thicknesses can also be used.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be used.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be used.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be used. The optional source-select-level conductive layer 118 can include a conductive material that can be used as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-select-level conductive layer 118 can be in a range from 30 nm to 200 nm, such as from 60 nm to 100 nm, although lesser and greater thicknesses can also be used.

The in-process source-level material layers 110' can be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The planar sacrificial material layer 101 and the in-process source-level material layers 110' may be patterned to provide openings in areas in which through-memory-level contact via structures and through-dielectric contact via structures are to be subsequently formed. Patterned portions of the stack of the planar sacrificial material layer 101 and the in-process source-level material layers 110' are present in each memory array region 100 in which three-dimensional memory stack structures are to be subsequently formed. The at least one second dielectric material layer 768 can include a blanket layer portion underlying the planar sacrificial material layer 101 and the in-process source-level material layers 110' and a patterned portion that fills gaps within the patterned portions of the planar sacrificial material layer 101 and the in-process source-level material layers 110'.

The planar sacrificial material layer 101 and the in-process source-level material layers 110' can be patterned such that an opening extends over a staircase region 300 in which contact via structures contacting word line electrically conductive layers are to be subsequently formed. In one embodiment, the staircase region 300 can be laterally spaced from the memory array region 100 along a first horizontal direction hd1. A horizontal direction that is perpendicular to the first horizontal direction hd1 is herein referred to as a second horizontal direction hd2. In one embodiment, additional openings in the planar sacrificial material layer 101 and the in-process source-level material layers 110' can be formed within the area of a memory array region 100, in which a three-dimensional memory array including memory stack structures is to be subsequently formed. A peripheral device region 700 that is subsequently filled with a field dielectric material portion can be provided adjacent to the staircase region 300. A peripheral region 400 can be provided adjacent to the staircase region 300.

The region of the semiconductor devices 710 and the combination of the lower-level dielectric layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are included in the lower-level dielectric layers 760.

The lower-level metal interconnect structures 780 can be electrically connected to active nodes (e.g., transistor active regions 742 or gate electrodes 754) of the semiconductor devices 710 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed. In one embodiment, the pattern of the lower-level metal interconnect structures 780 can be selected such that the landing-pad-level metal line structures 788 (which are a subset of the lower-level metal interconnect structures 780 located at the topmost portion of the lower-level metal interconnect structures 780) can provide landing pad structures for the through-memory-level contact via structures to be subsequently formed.

Figure 22:
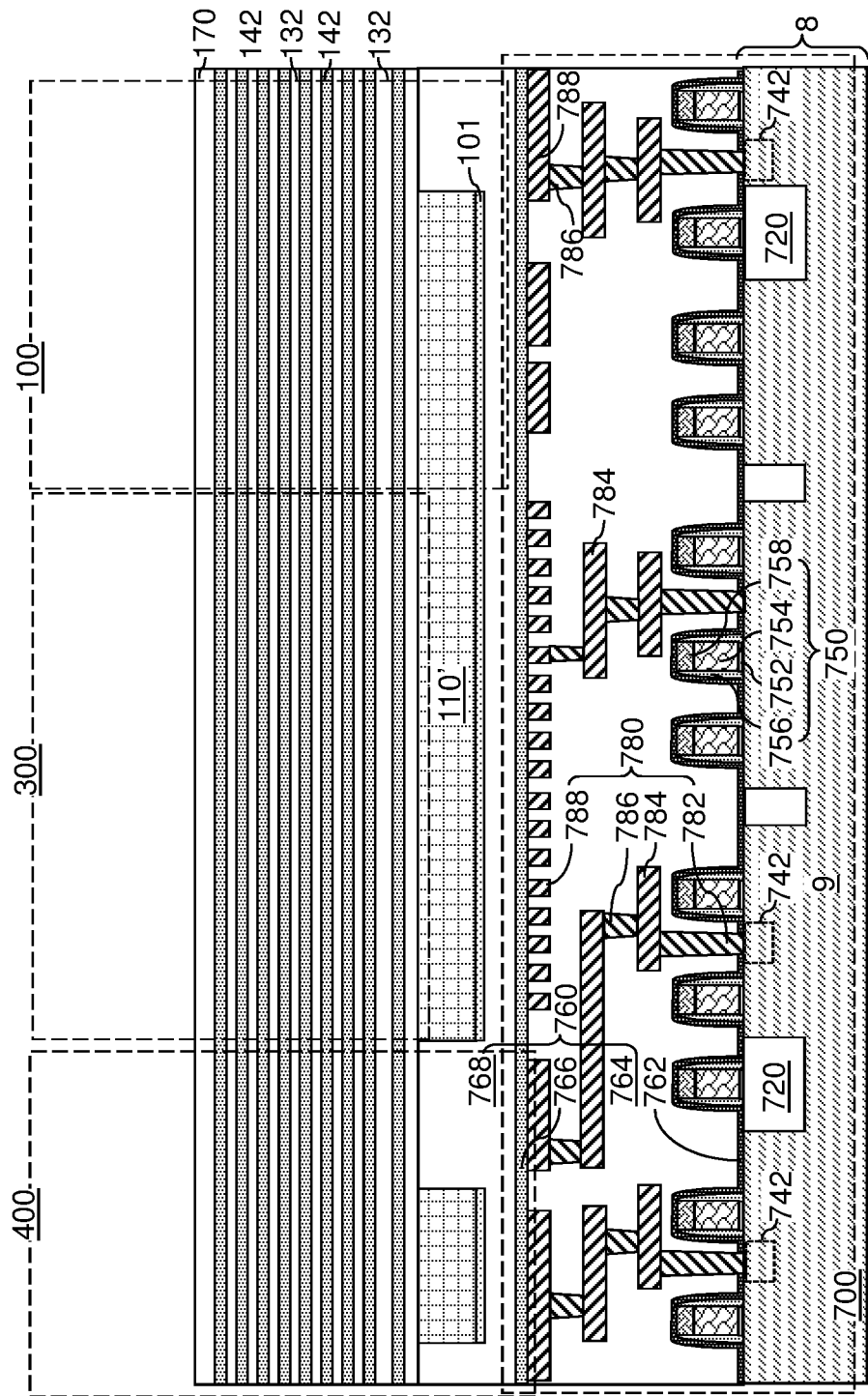
FIG. 22 is a vertical cross-sectional view of the fourth exemplary structure after formation of a first-tier alternating stack of first insulating layers and first spacer material layers according to an embodiment of the present disclosure.

Referring to FIG. 22, an alternating stack of first material layers and second material layers is subsequently formed. Each first material layer can include a first material, and each second material layer can include a second material that is different from the first material. In case at least another alternating stack of material layer is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described using embodiments in which sacrificial material layers are replaced with electrically conductive layers, other embodiments form the spacer material layers as electrically conductive layers (thereby obviating the need to perform replacement processes).

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality of layers.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is used for the first insulating layers 132, tetraethylorthosilicate (TEOS) can be used as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be used for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be used. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which can be any dielectric material that can be used for the first insulating layers 132. In one embodiment, the first insulating cap layer 170 includes the same dielectric material as the first insulating layers 132. The thickness of the first insulating cap layer 170 can be in a range from 20 nm to 300 nm, although lesser and greater thicknesses can also be used.

Figure 23:
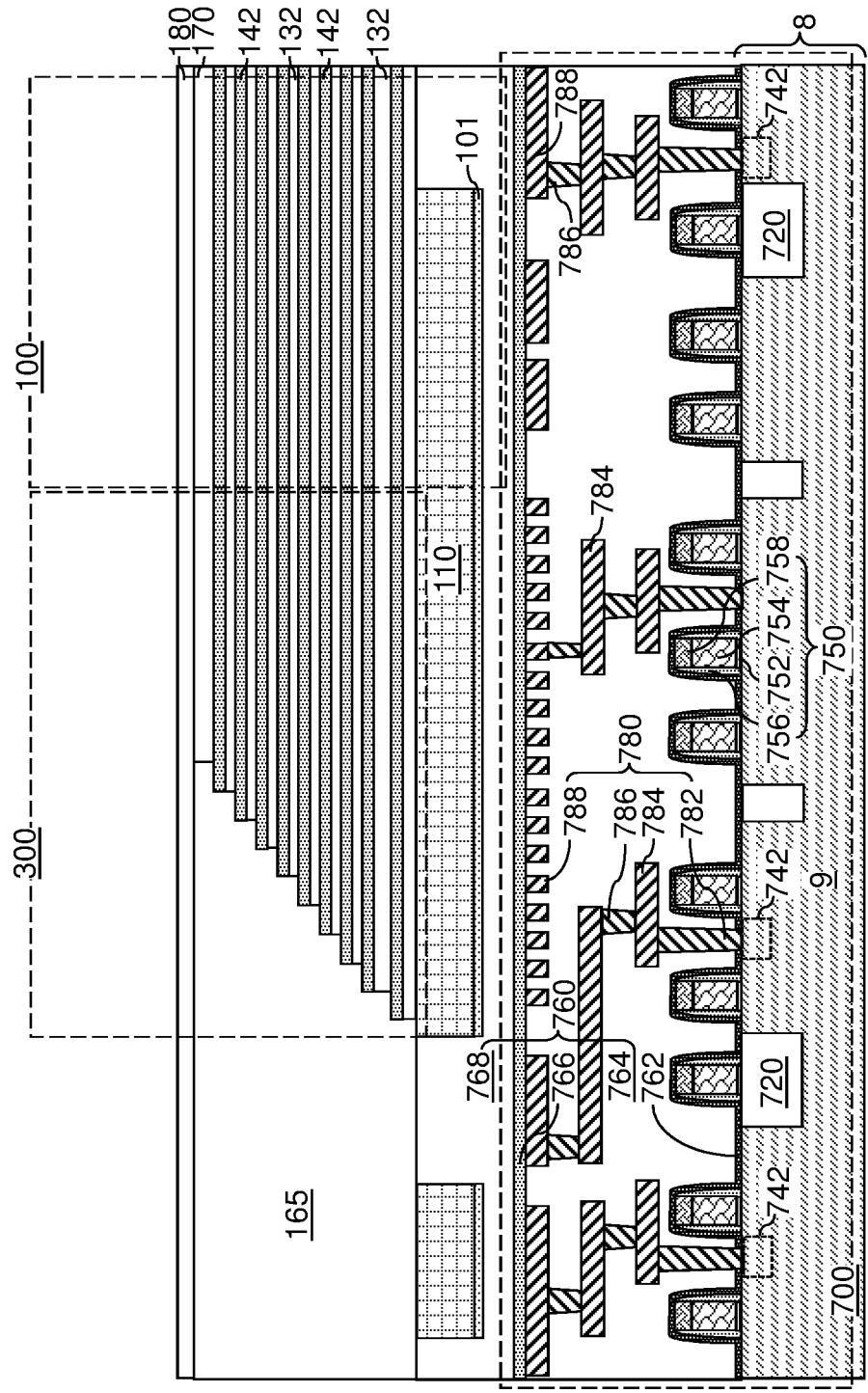
FIG. 23 is a vertical cross-sectional view of the fourth exemplary structure after patterning a first-tier staircase region, a first retro-stepped dielectric material portion, and an inter-tier dielectric layer according to an embodiment of the present disclosure.

Referring to FIG. 23, the first insulating cap layer 170 and the first-tier alternating stack (132, 142) can be patterned to form first stepped surfaces in the staircase region 300. The staircase region 300 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be used.

Figure 24A:
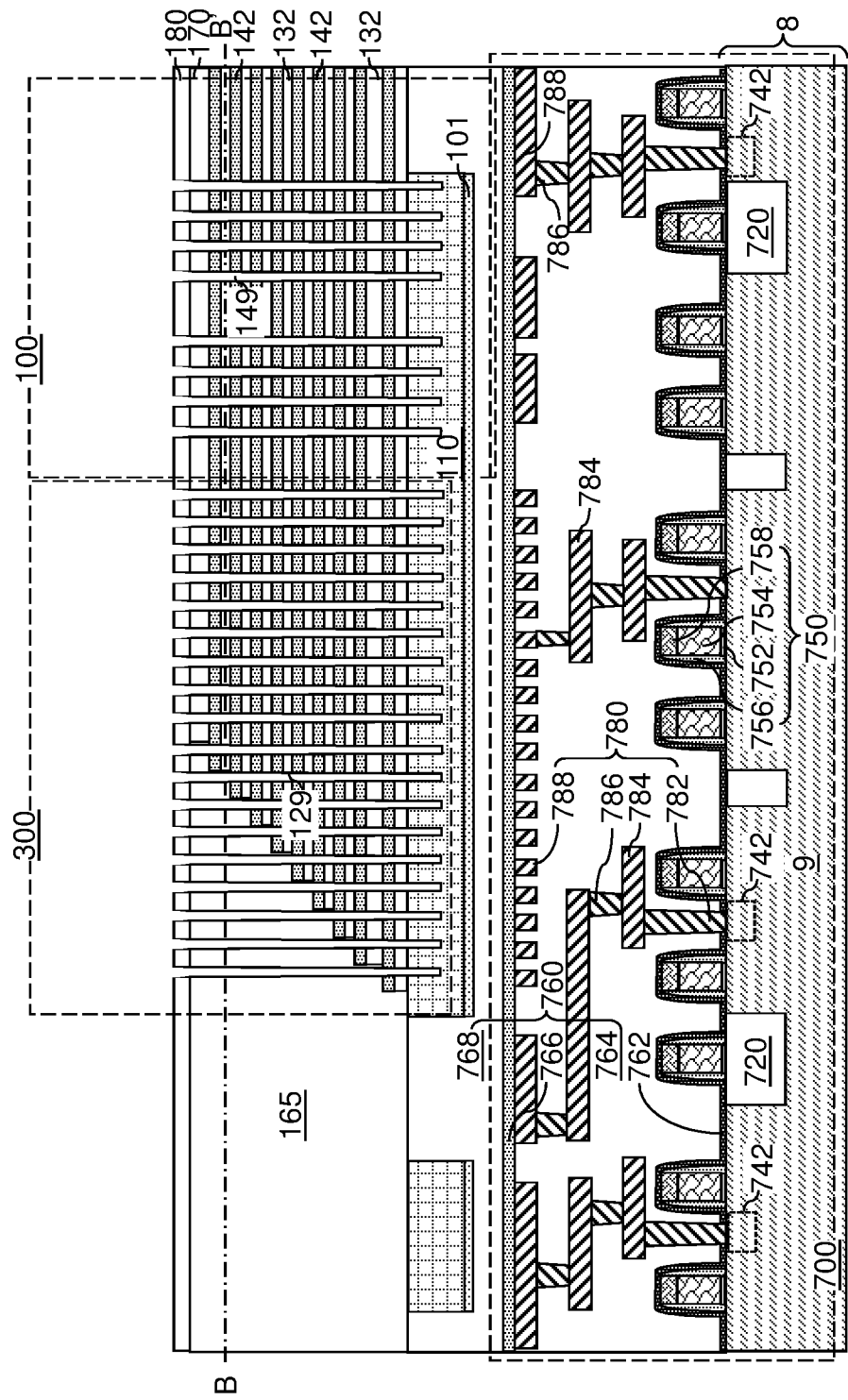
FIG. 24A is a vertical cross-sectional view of the fourth exemplary structure after formation of first-tier memory openings and first-tier support openings according to an embodiment of the present disclosure.
Figure 24B:
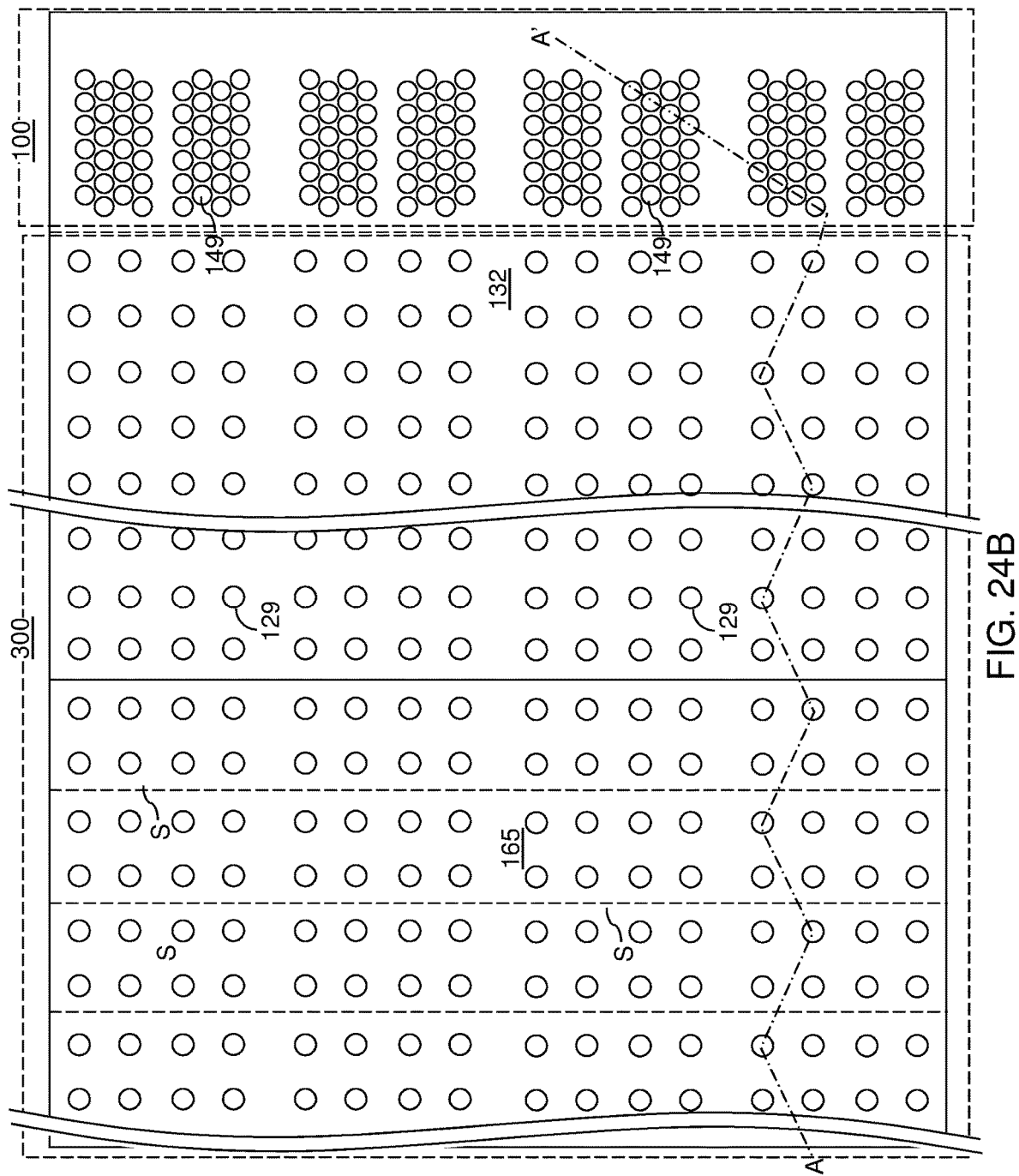
FIG. 24B is a top-down view of the fourth exemplary structure of FIG. 24A. The hinged vertical plane A-A' corresponds to the plane of the vertical cross-sectional view of FIG. 24A.

Referring to FIGS. 24A and 24B, various first-tier openings (149, 129) can be formed through the inter-tier dielectric layer 180 and the first-tier structure (132, 142, 170, 165) and into the in-process source-level material layers 110'. A photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) can include first-tier memory openings 149 and first-tier support openings 129. Locations of steps S in the first-tier alternating stack (132, 142) are illustrated as dotted lines in FIG. 24B.

The first-tier memory openings 149 are openings that are formed in the memory array region 100 through each layer within the first-tier alternating stack (132, 142) and are subsequently used to form memory stack structures therein. The first-tier memory openings 149 can be formed in clusters of first-tier memory openings 149 that are laterally spaced apart along the second horizontal direction hd2. Each cluster of first-tier memory openings 149 can be formed as a two-dimensional array of first-tier memory openings 149.

The first-tier support openings 129 are openings that are formed in the staircase region 300 and are subsequently used to form staircase-region contact via structures that interconnect a respective pair of an underlying lower-level metal interconnect structure 780 (such as a landing-pad-level metal line structure 788) and an electrically conductive layer (which can be formed as one of the spacer material layers or can be formed by replacement of a sacrificial material layer within the electrically conductive layer). A subset of the first-tier support openings 129 that is formed through the first retro-stepped dielectric material portion 165 can be formed through a respective horizontal surface of the first stepped surfaces. Further, each of the first-tier support openings 129 can be formed directly above (i.e., above, and with an areal overlap with) a respective one of the lower-level metal interconnect structure 780.

In one embodiment, the first anisotropic etch process can include an initial step in which the materials of the first-tier alternating stack (132, 142) are etched concurrently with the material of the first retro-stepped dielectric material portion 165. The chemistry of the initial etch step can alternate to optimize etching of the first and second materials in the first-tier alternating stack (132, 142) while providing a comparable average etch rate to the material of the first retro-stepped dielectric material portion 165. The first anisotropic etch process can use, for example, a series of reactive ion etch processes or a single reaction etch process (e.g., $CF_4/O_2/Ar$ etch). The sidewalls of the various first-tier openings (149, 129) can be substantially vertical, or can be tapered.

After etching through the alternating stack (132, 142) and the first retro-stepped dielectric material portion 165, the chemistry of a terminal portion of the first anisotropic etch process can be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process can etch through the source-select-level conductive layer 118, the source-level insulating layer 117, the upper source-level semiconductor layer 116, the upper sacrificial liner 105, the source-level sacrificial layer 104, and the lower sacrificial liner 103, the lower source-level semiconductor layer 112, and into an upper portion of the planar sacrificial material layer 101. The terminal portion of the first anisotropic etch process can include at least one etch chemistry for etching the various semiconductor materials of the in-process source-level material layers 110'. The photoresist layer can be subsequently removed, for example, by ashing.

Optionally, the portions of the first-tier memory openings 149 and the first-tier support openings 129 at the level of the inter-tier dielectric layer 180 can be laterally expanded by an isotropic etch. In this case, the inter-tier dielectric layer 180 can comprise a dielectric material (such as borosilicate glass) having a greater etch rate than the first insulating layers 132 (that can include undoped silicate glass) in dilute hydrofluoric acid. An isotropic etch (such as a wet etch using HF) can be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 25:
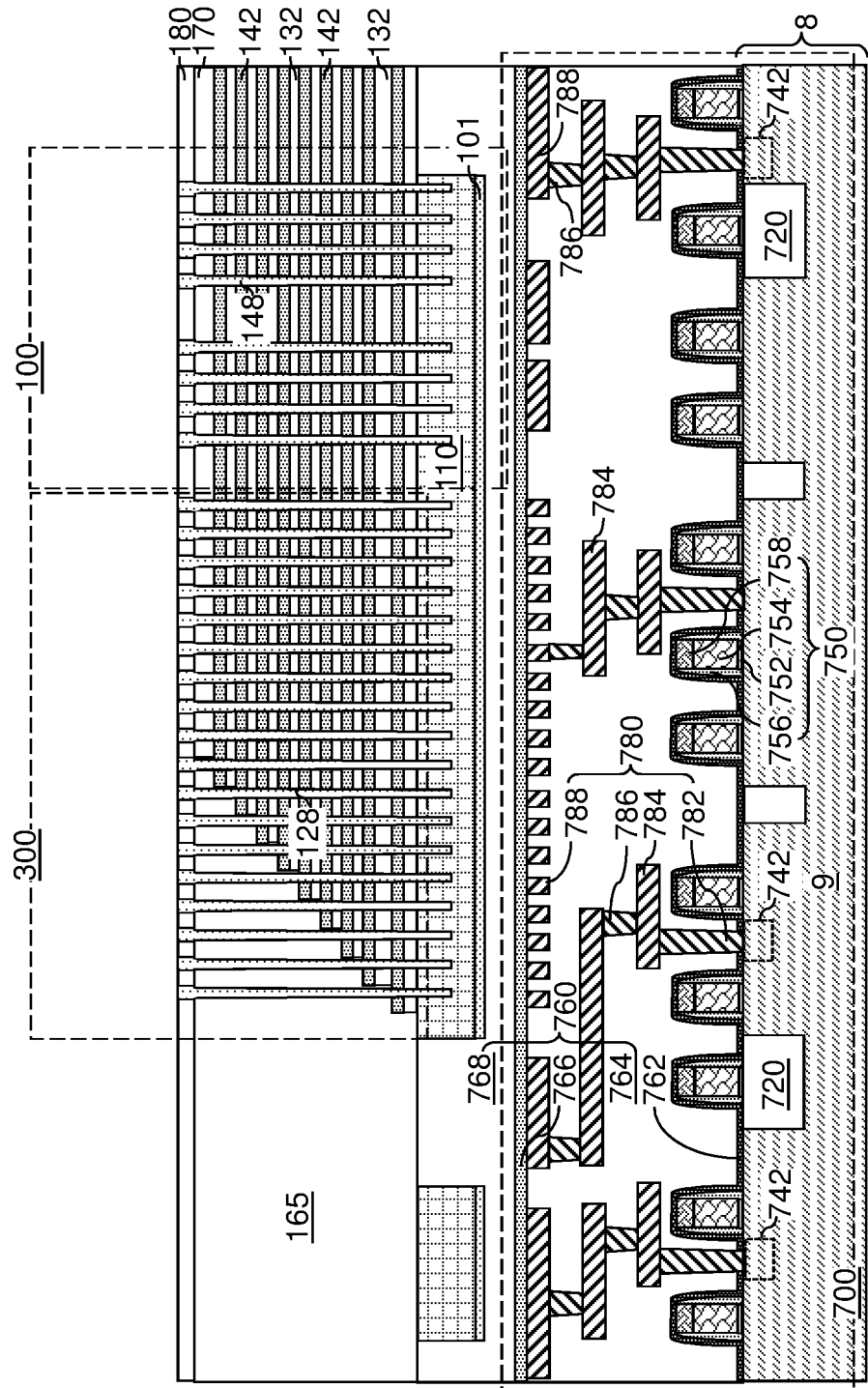
FIG. 25 is a vertical cross-sectional view of the fourth exemplary structure after formation of various sacrificial fill structures according to an embodiment of the present disclosure.

Referring to FIG. 25, sacrificial first-tier opening fill portions (148, 128) can be formed in the various first-tier openings (149, 129). For example, a sacrificial first-tier fill material can be deposited concurrently in each of the first-tier openings (149, 129). The sacrificial first-tier fill material includes a material that can be subsequently removed selective to the materials of the first insulating layers 132 and the first sacrificial material layers 142.

In one embodiment, the sacrificial first-tier fill material can include a semiconductor material, such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be formed prior to depositing the sacrificial first-tier fill material. The sacrificial first-tier fill material may be formed by a non-conformal deposition or a conformal deposition method.

In another embodiment, the sacrificial first-tier fill material can include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be formed prior to depositing the sacrificial first-tier fill material. The sacrificial first-tier fill material may be formed by a non-conformal deposition or a conformal deposition method.

In yet another embodiment, the sacrificial first-tier fill material can include amorphous silicon or a carbon-containing material (such as amorphous carbon or diamond-like carbon) that can be subsequently removed by ashing, or a silicon-based polymer that can be subsequently removed selective to the materials of the first-tier alternating stack (132, 142).

Portions of the deposited sacrificial material can be removed from above the topmost layer of the first-tier alternating stack (132, 142), such as from above the inter-tier dielectric layer 180. For example, the sacrificial first-tier fill material can be recessed to a top surface of the inter-tier dielectric layer 180 using a planarization process. The planarization process can include a recess etch, chemical mechanical planarization (CMP), or a combination thereof. The top surface of the inter-tier dielectric layer 180 can be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128) can be coplanar with the top surface of the inter-tier dielectric layer 180. Each of the sacrificial first-tier opening fill portions (148, 128) may, or may not, include cavities therein.

Figure 26:
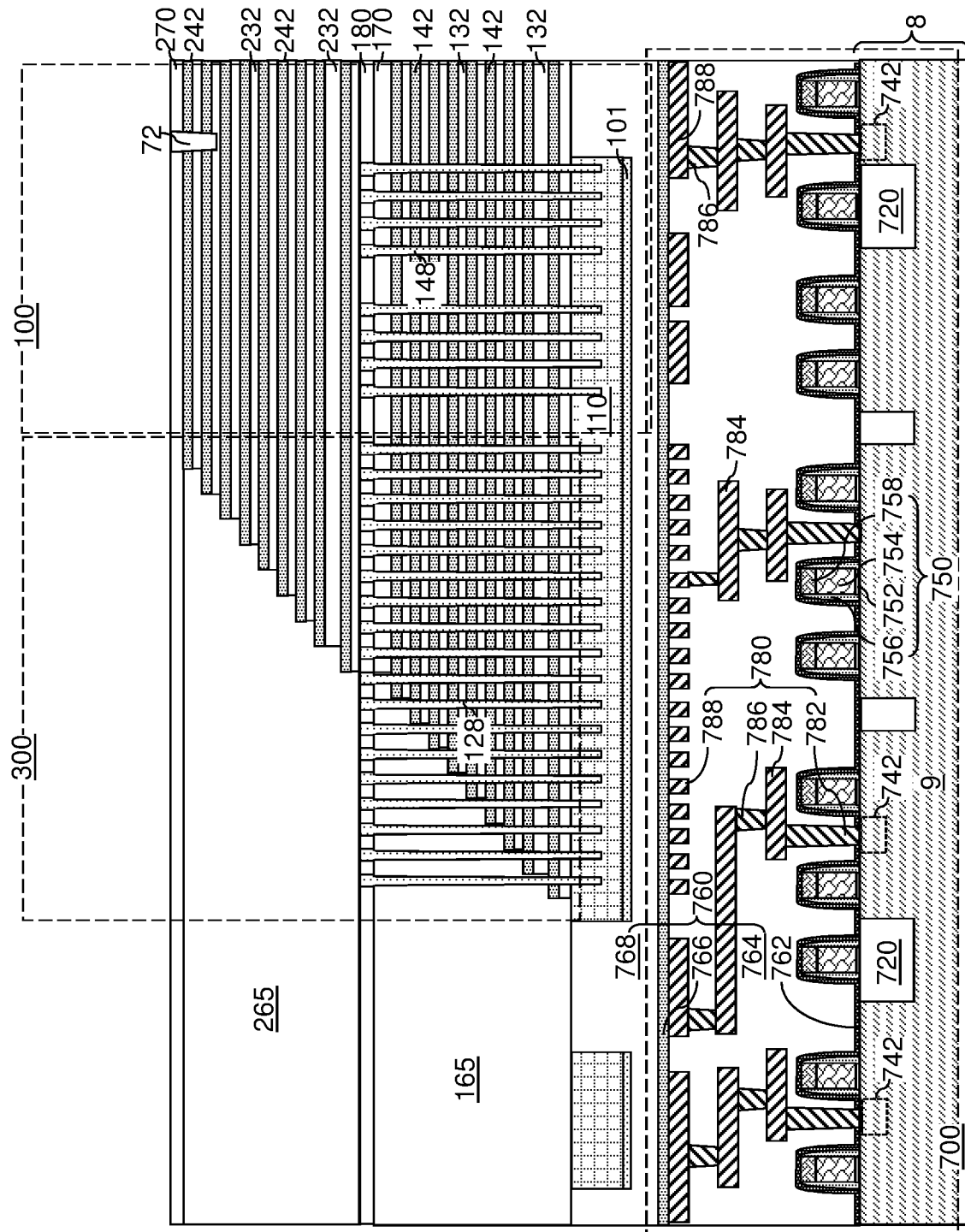
FIG. 26 is a vertical cross-sectional view of the fourth exemplary structure after formation of a second-tier alternating stack of second insulating layers and second spacer material layers, second stepped surfaces, and a second retro-stepped dielectric material portion according to an embodiment of the present disclosure.

Referring to FIG. 26, a second-tier structure can be formed over the first-tier structure (132, 142, 170, 148). The second-tier structure can include an additional alternating stack of insulating layers and spacer material layers, which can be sacrificial material layers. For example, a second-tier alternating stack (232, 242) of material layers can be subsequently formed on the top surface of the first-tier alternating stack (132, 142). The second-tier alternating stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second-tier alternating stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be used for the second insulating layers 232 can be any material that can be used for the first insulating layers 132. The fourth material of the second sacrificial material layers 242 is a sacrificial material that can be removed selective to the third material of the second insulating layers 232. Sacrificial materials that can be used for the second sacrificial material layers 242 can be any material that can be used for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be used for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be used. In one embodiment, each second sacrificial material layer 242 in the second-tier alternating stack (232, 242) can have a uniform thickness that is substantially invariant within each respective second sacrificial material layer 242.

Second stepped surfaces in the second stepped area can be formed in the staircase region 300 using a same set of processing steps as the processing steps used to form the first stepped surfaces in the first stepped area with suitable adjustment to the pattern of at least one masking layer. A second retro-stepped dielectric material portion 265 can be formed over the second stepped surfaces in the staircase region 300.

A second insulating cap layer 270 can be subsequently formed over the second-tier alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the in-process source-level material layers 110', and at least one retro-stepped dielectric material portion (165, 265) can be formed over the staircase regions on the at least one alternating stack (132, 142, 232, 242).

Optionally, drain-select-level isolation structures 72 can be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 27A:
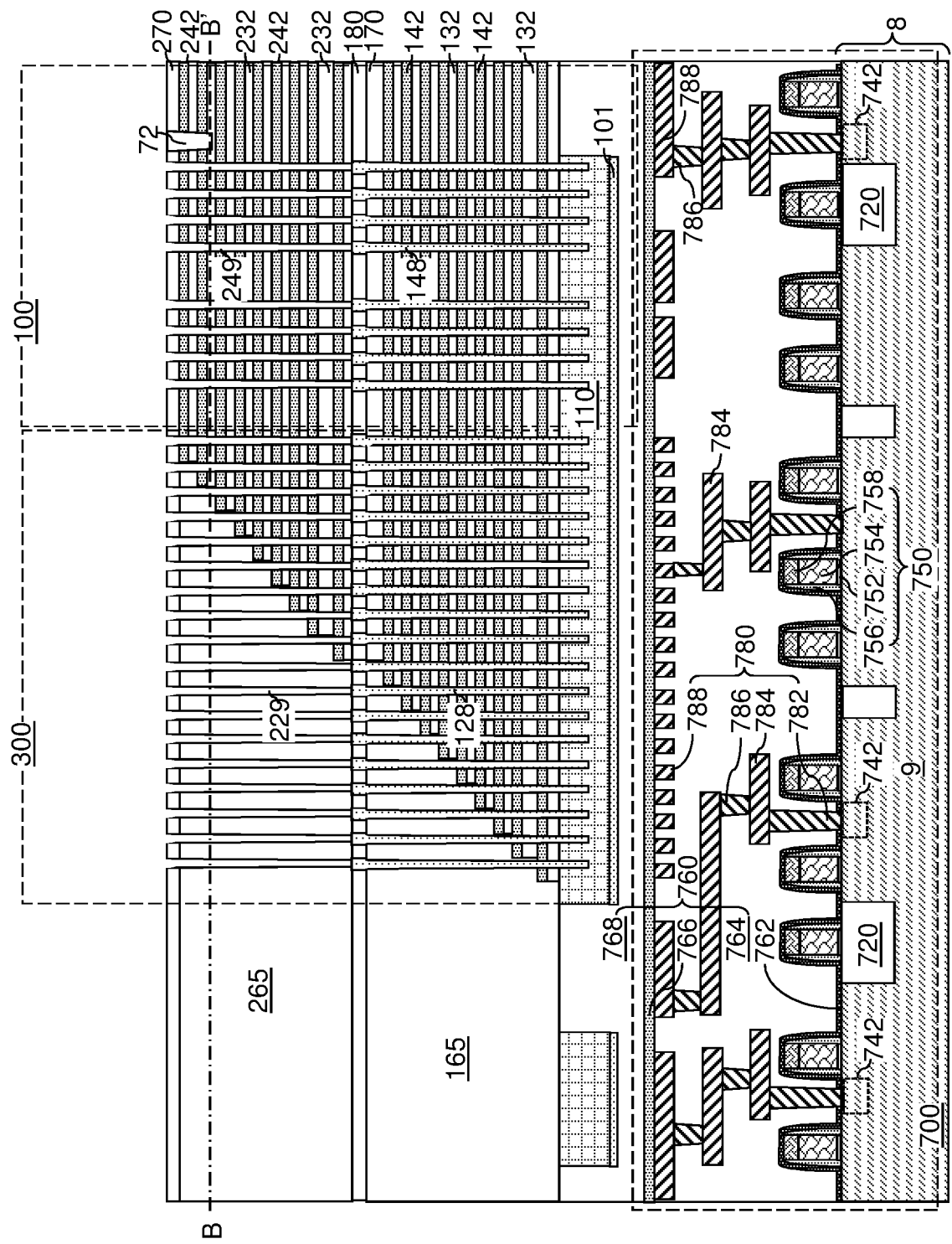
FIG. 27A is a vertical cross-sectional view of the fourth exemplary structure after formation of second-tier memory openings and second-tier support openings according to an embodiment of the present disclosure.
Figure 27B:
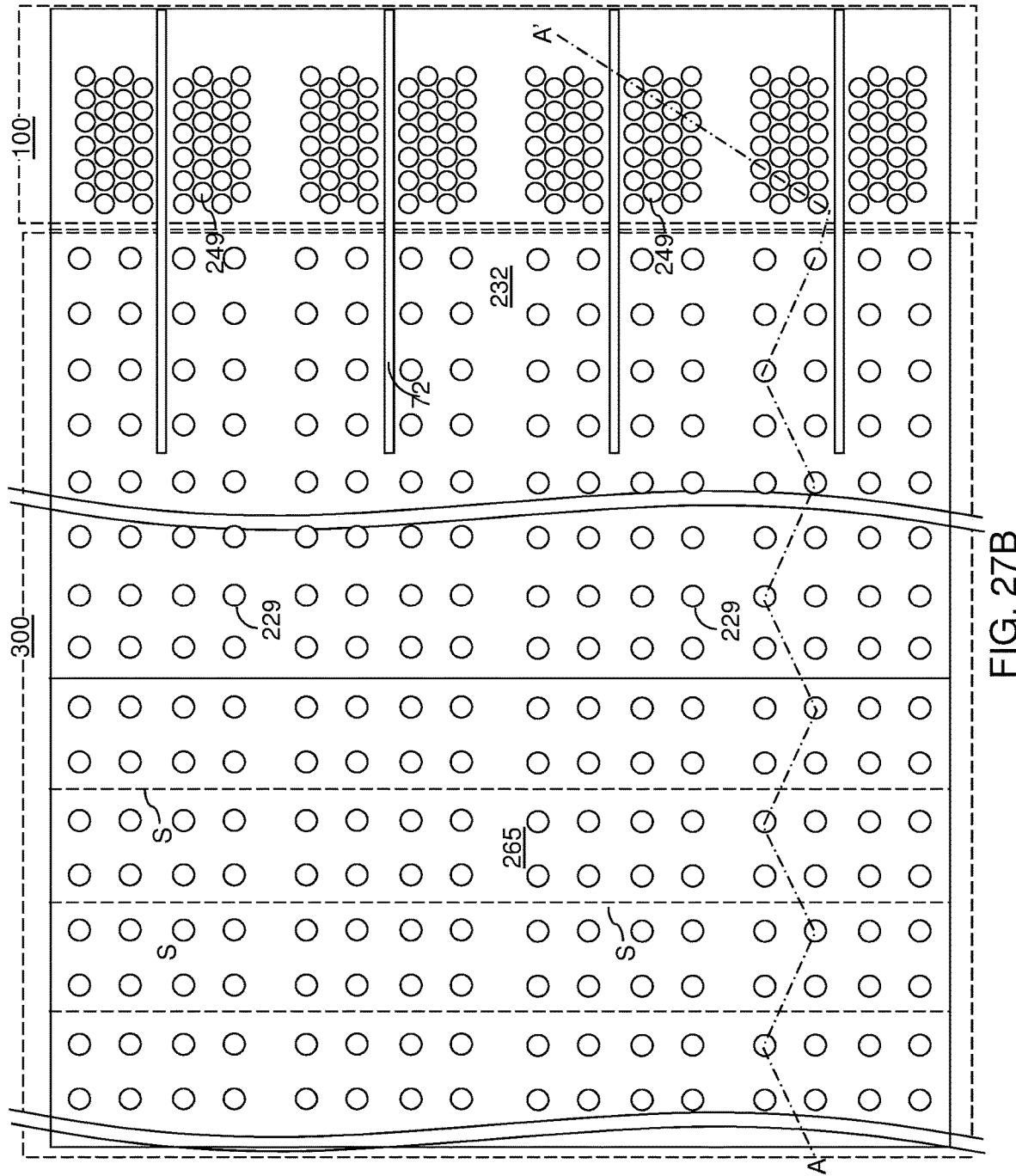
FIG. 27B is a horizontal cross-sectional view of the fourth exemplary structure along the horizontal plane B-B' of FIG. 27A. The hinged vertical plane A-A' corresponds to the plane of the vertical cross-sectional view of FIG. 27A.

Referring to FIGS. 27A and 27B, various second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill portions (148, 128). Thus, the lithographic mask used to pattern the first-tier openings (149, 129) can be used to pattern the photoresist layer.

The pattern of openings in the photoresist layer can be transferred through the second-tier structure (232, 242, 265, 270, 72) by a second anisotropic etch process to form various second-tier openings (249, 229) concurrently, i.e., during the second anisotropic etch process. The various second-tier openings (249, 229) can include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 can be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process can include an etch step in which the materials of the second-tier alternating stack (232, 242) are etched concurrently with the material of the second retro-stepped dielectric material portion 265. The chemistry of the etch step can alternate to optimize etching of the materials in the second-tier alternating stack (232, 242) while providing a comparable average etch rate to the material of the second retro-stepped dielectric material portion 265. The second anisotropic etch process can use, for example, a series of reactive ion etch processes or a single reaction etch process (e.g., $CF_4/O_2/Ar$ etch). The sidewalls of the various second-tier openings (249, 229) can be substantially vertical, or can be tapered. A bottom periphery of each second-tier opening (249, 229) may be laterally offset, and/or may be located entirely within, a periphery of a top surface of an underlying sacrificial first-tier opening fill portion (148, 128). The photoresist layer can be subsequently removed, for example, by ashing.

Figure 28:
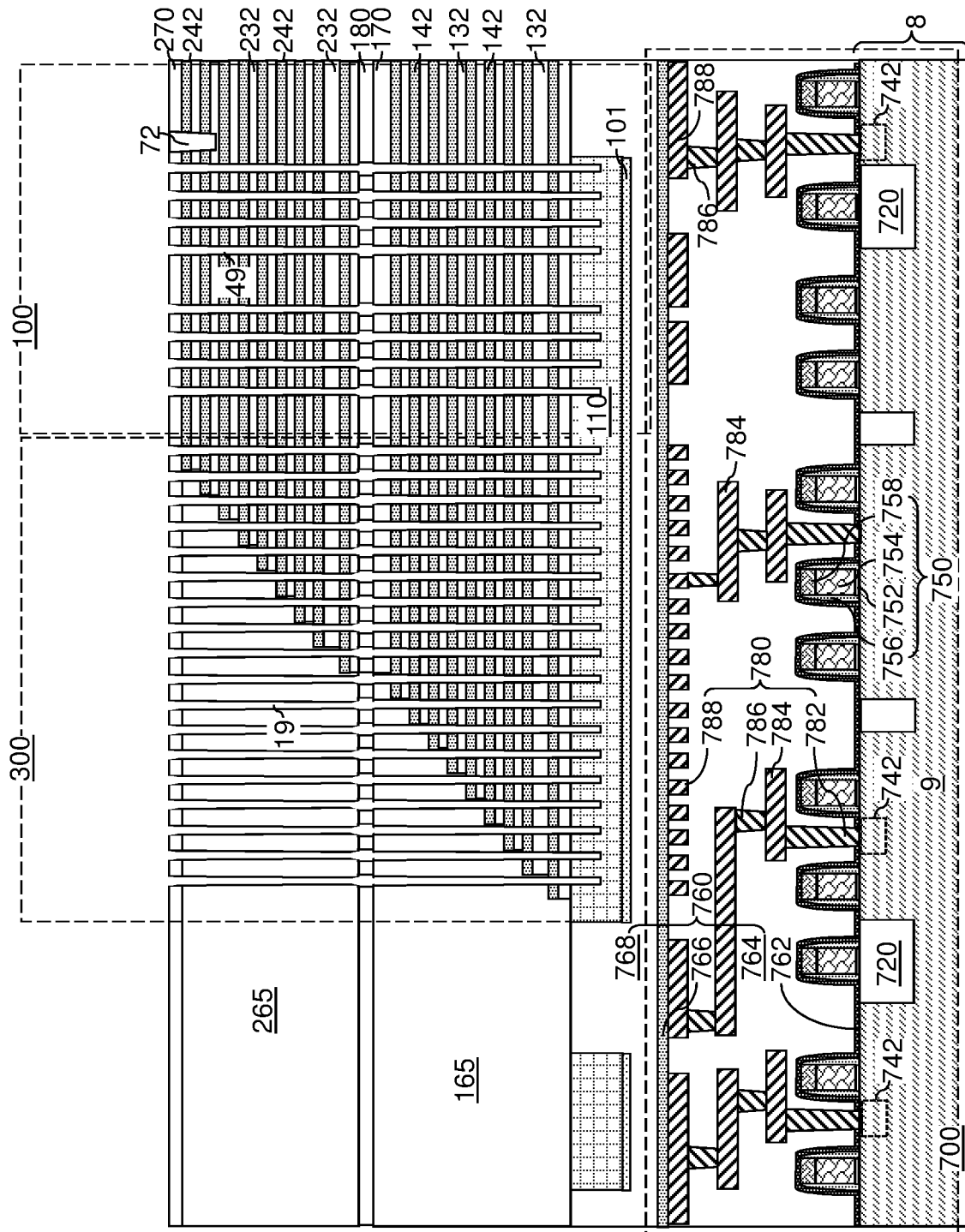
FIG. 28 is a vertical cross-sectional view of the fourth exemplary structure after formation of inter-tier memory openings and inter-tier support openings according to an embodiment of the present disclosure.

Referring to FIG. 28, the sacrificial first-tier fill material of the sacrificial first-tier opening fill portions (148, 128) can be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 29A-29D provide sequential cross-sectional views of a memory opening 49 during formation of a memory opening fill structure. The same structural change occurs in each of the memory openings 49 and the support openings 19.

Referring to FIG. 29A, a memory opening 49 in the fourth exemplary device structure of FIG. 28 is illustrated. The memory opening 49 extends through the first-tier structure and the second-tier structure.

Referring to FIG. 29B, a stack of layers including a blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. Alternatively, the sacrificial material layers (142, 242) can be laterally recessed with respect to the sidewalls of the insulating layers (132, 232), and a combination of a deposition process and an anisotropic etch process can be used to form the charge storage layer 54 as a plurality of memory material portions that are vertically spaced apart. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used. The stack of the blocking dielectric layer 52, the charge storage layer 54, and the tunneling dielectric layer 56 constitutes a memory film 50 that stores memory bits.

In one embodiment, the semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L can have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be used. A memory cavity 49' is present in the volume of each memory opening 49 that is not filled with the deposited material layers (52, 54, 56, 60L).

Referring to FIG. 29C, an electrically isolated core 62 can be formed within each memory cavity using any of the methods for forming the electrically isolated cores 62 described above. Each electrically isolated core 62 can include any material or any combination of materials used for the electrically isolated cores 62 of the first, second, and third exemplary structures. For example, each electrically isolated core 62 can include a combination of a silicon oxide liner 161 and a stressor pillar structure 162 as in the first configuration of the memory opening fill structure 58 of the first exemplary structure, a stressor pillar structure 162 as in the second configuration of the memory opening fill structure 58 of the first exemplary structure, a combination of a silicon nitride liner 261 and a stressor pillar structure 262 as in the third configuration of the memory opening fill structure 58 of the first exemplary structure, or a stressor pillar structure 262 as in the fourth configuration of the memory opening fill structure 58 of the first exemplary structure. Alternatively, the electrically isolated core 62 may include, and/or consist essentially of, undoped silicate glass or a doped silicate glass. The electrically isolated cores 62 can apply a lateral compressive stress and a vertical tensile stress to the vertical semiconductor channels 60 as in the first exemplary structure. In one embodiment, each of the semiconductor channels 60 may include a lateral stack of a first semiconductor channel layer 603 and a second semiconductor channel layer 604 as in the fifth configuration of the first exemplary structure.

In addition, any of the stress memorization methods that can be used for the first exemplary structure can be used on the this exemplary structure. In this case, the laterally compressive stress can be applied by the sacrificial material layers (142, 242) and memorized in the vertical semiconductor channels 60 during a stress memorization anneal process.

Alternatively, the lateral compressive stress can be applied by electrically conductive layers that replace the sacrificial material layers (142, 242) and are memorized in the vertical semiconductor channels 60 during a stress memorization anneal process.

Referring to FIG. 29D, a doped semiconductor material can be deposited in cavities overlying the electrically isolated cores 62. The doped semiconductor material has a doping of the second conductivity type, which is the opposite conductivity type of the doping of the semiconductor channel material layer 60L. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process.

Each remaining portion of the doped semiconductor material constitutes a drain region 63. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, an electrically isolated core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 30:
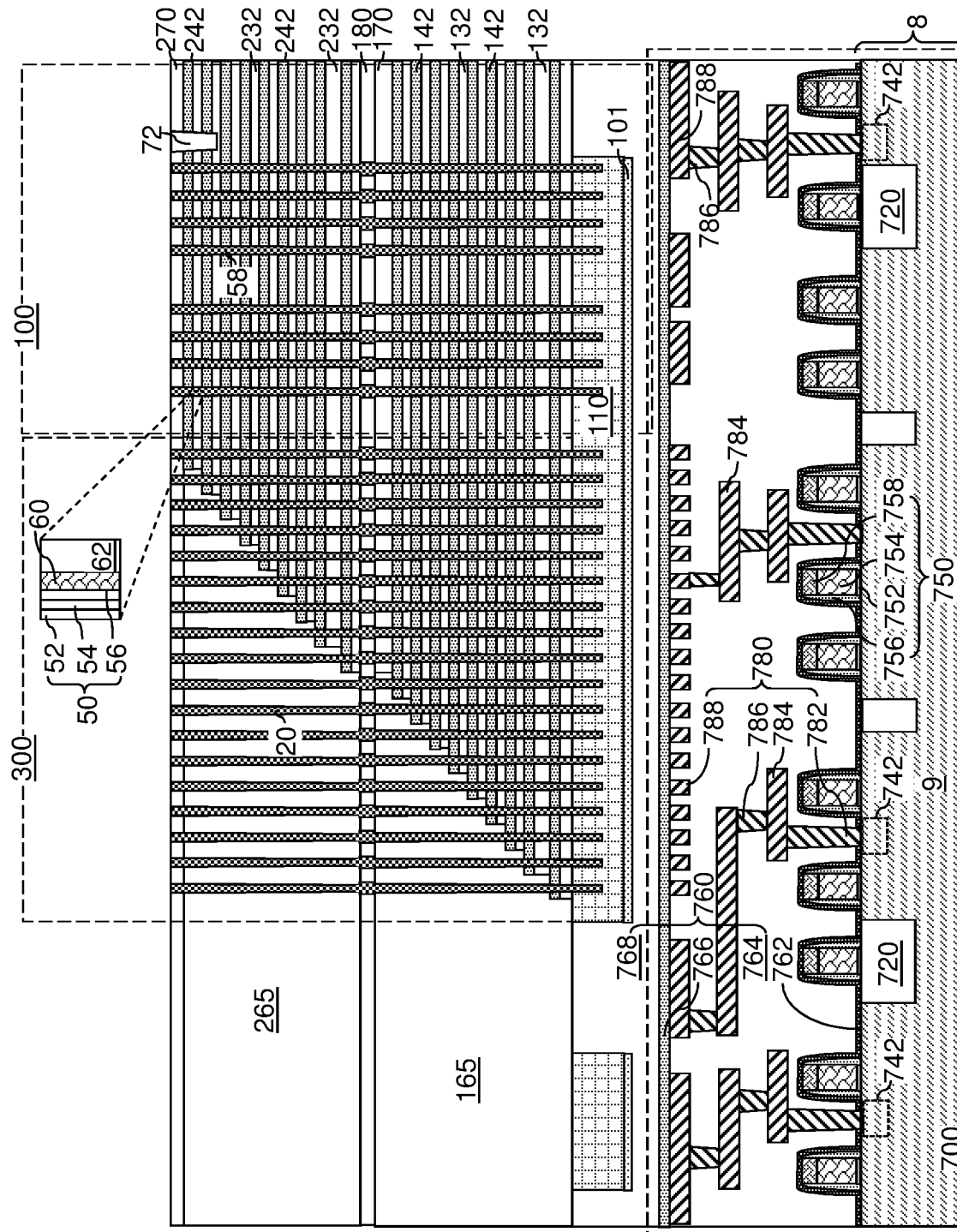
FIG. 30 is a vertical cross-sectional view of the fourth exemplary structure after formation of memory opening fill structures and support pillar structures according to an embodiment of the present disclosure.

Referring to FIG. 30, the fourth exemplary structure is illustrated after formation of the memory opening fill structures 58. Support pillar structures 20 are formed in the support openings 19 concurrently with formation of the memory opening fill structures 58. Each support pillar structure 20 can have a same set of components as a memory opening fill structure 58. Each memory opening fill structure 58 includes a memory stack structure 55, which includes a memory film 50 that contains a vertical stack of memory elements located at levels of the spacer material layers and a vertical semiconductor channel 60 that contacts the memory film 50.

Figure 31A:
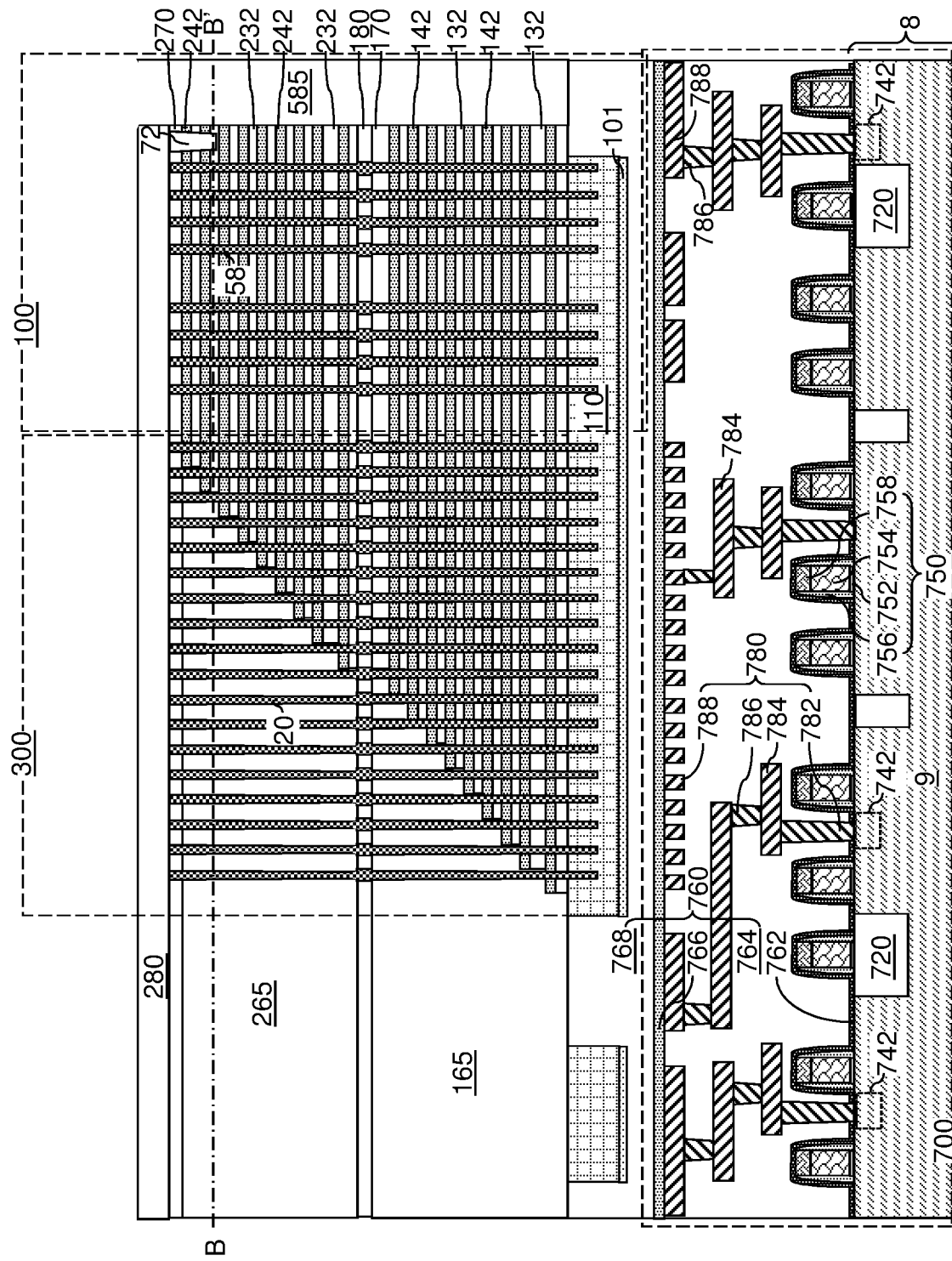
FIG. 31A is a vertical cross-sectional view of the fourth exemplary structure after formation of backside pillar cavities according to an embodiment of the present disclosure.
Figure 31B:
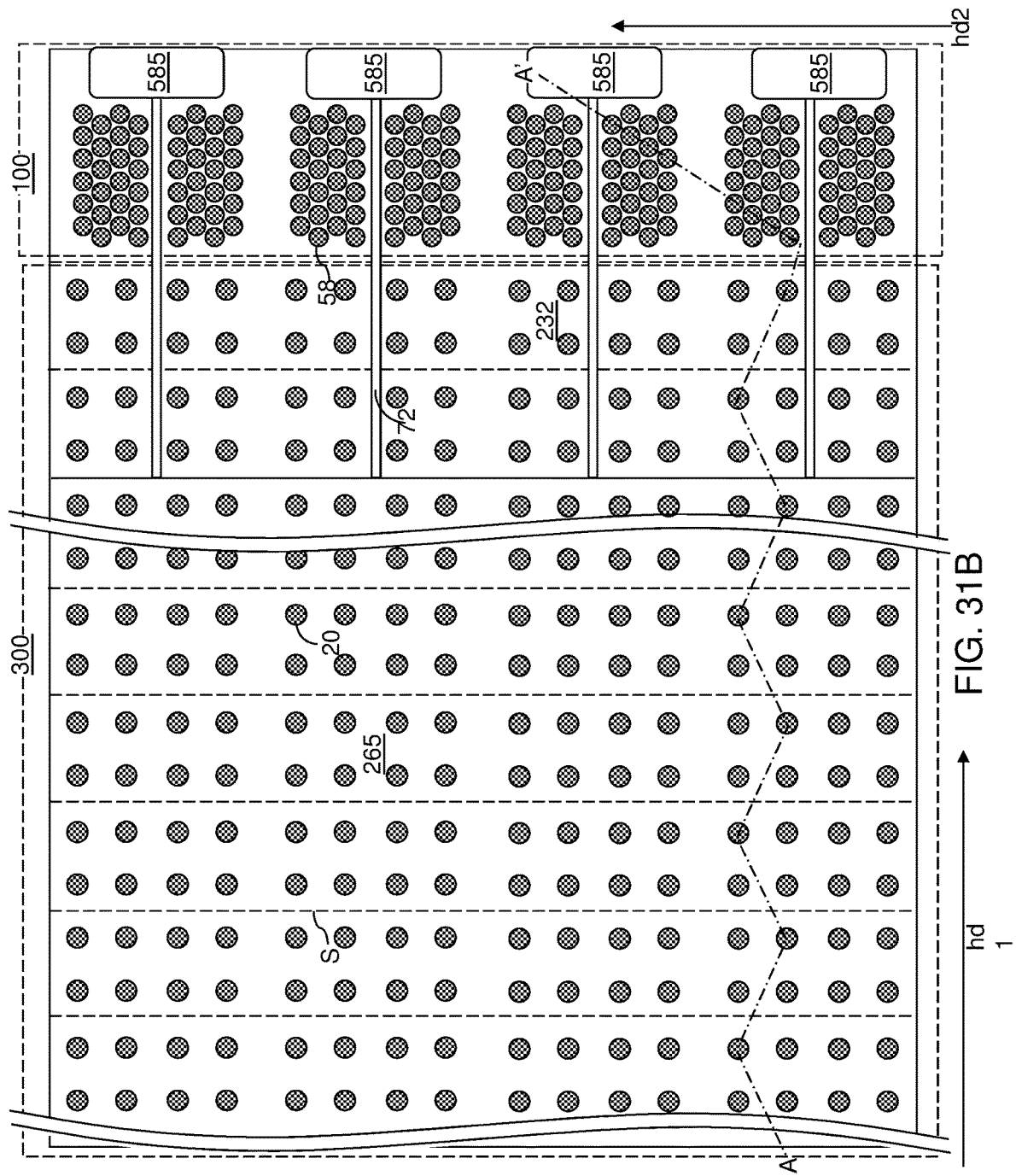
FIG. 31B is a horizontal cross-sectional view of the fourth exemplary structure along the horizontal plane B-B' of FIG. 31A. The hinged vertical plane A-A' corresponds to the plane of the vertical cross-sectional view of FIG. 31A.

Referring to FIGS. 31A and 31B, a first contact level dielectric layer 280 can be formed over the second-tier structure (232, 242, 270, 265, 72). The first contact level dielectric layer 280 includes a dielectric material such as silicon oxide, and can be formed by a conformal or non-conformal deposition process. For example, the first contact level dielectric layer 280 can include undoped silicate glass and can have a thickness in a range from 100 nm to 600 nm, although lesser and greater thicknesses can also be used.

A photoresist layer (not shown) can be applied over the first contact level dielectric layer 280, and can be lithographically patterned to form discrete openings within the area of the memory array region 100 in which memory opening fill structures 58 are not present. An anisotropic etch can be performed to form vertical interconnection region cavities 585 having substantially vertical sidewalls that extend through the first contact level dielectric layer 280, the second-tier structure (232, 242, 270, 265, 72), and the first-tier structure (132, 142, 170, 165) can be formed underneath the openings in the photoresist layer. A top surface of the at least one second dielectric layer 768 can be physically exposed at the bottom of each vertical interconnection region cavity 585. The photoresist layer can be removed, for example, by ashing.

Figure 32:
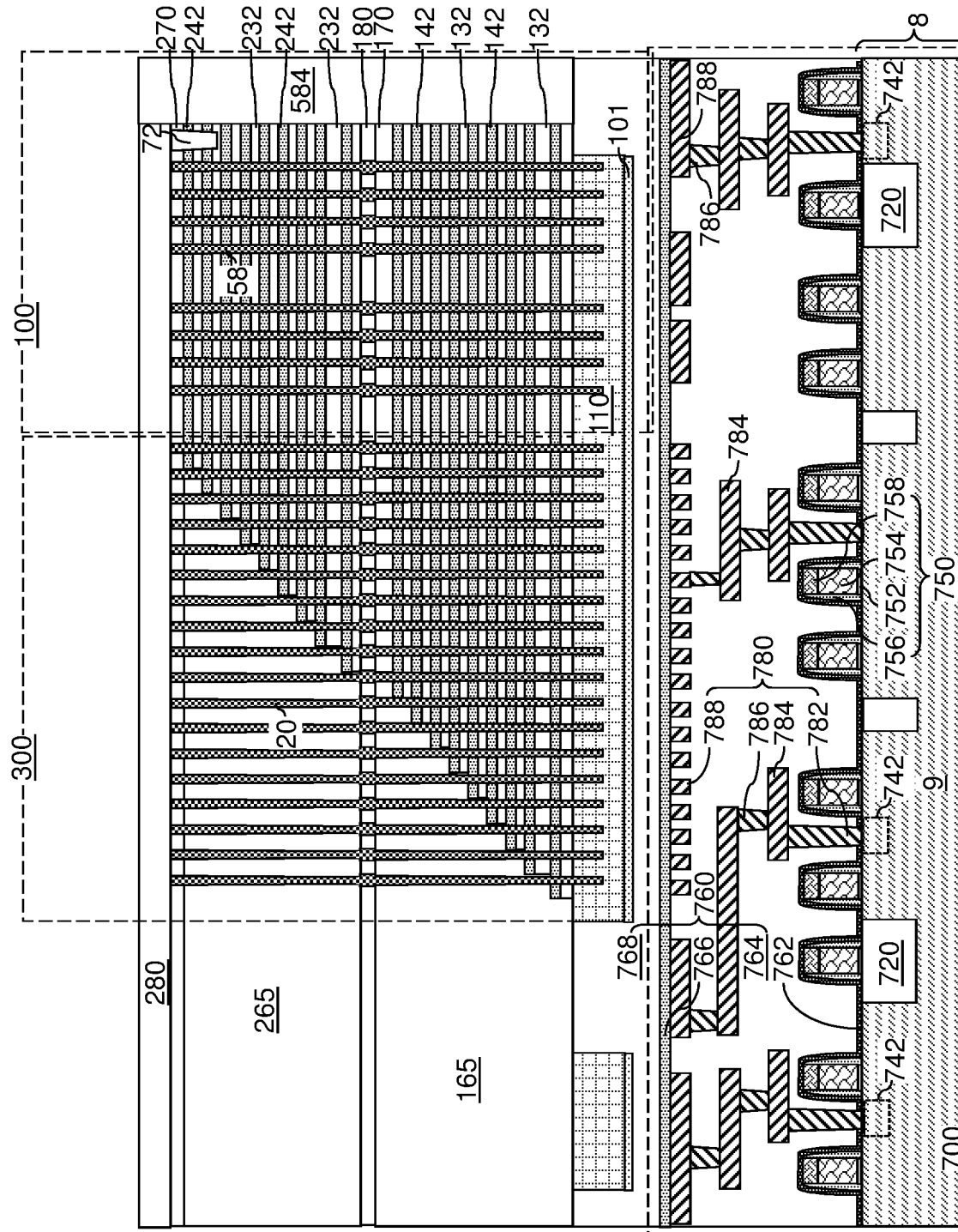
FIG. 32 is a vertical cross-sectional view of the fourth exemplary structure after formation of dielectric pillar structures according to an embodiment of the present disclosure.

Referring to FIG. 32, a dielectric material such as silicon oxide can be deposited in the vertical interconnection region cavities 585 by a conformal deposition process (such as low pressure chemical vapor deposition) or a self-planarizing deposition process (such as spin coating). Excess portions of the deposited dielectric material can be removed from above the top surface of the first contact level dielectric layer 280 by a planarization process. Remaining portions of the dielectric material in the vertical interconnection region cavities 585 constitute interconnection-region dielectric fill material portions 584.

Figure 33A:
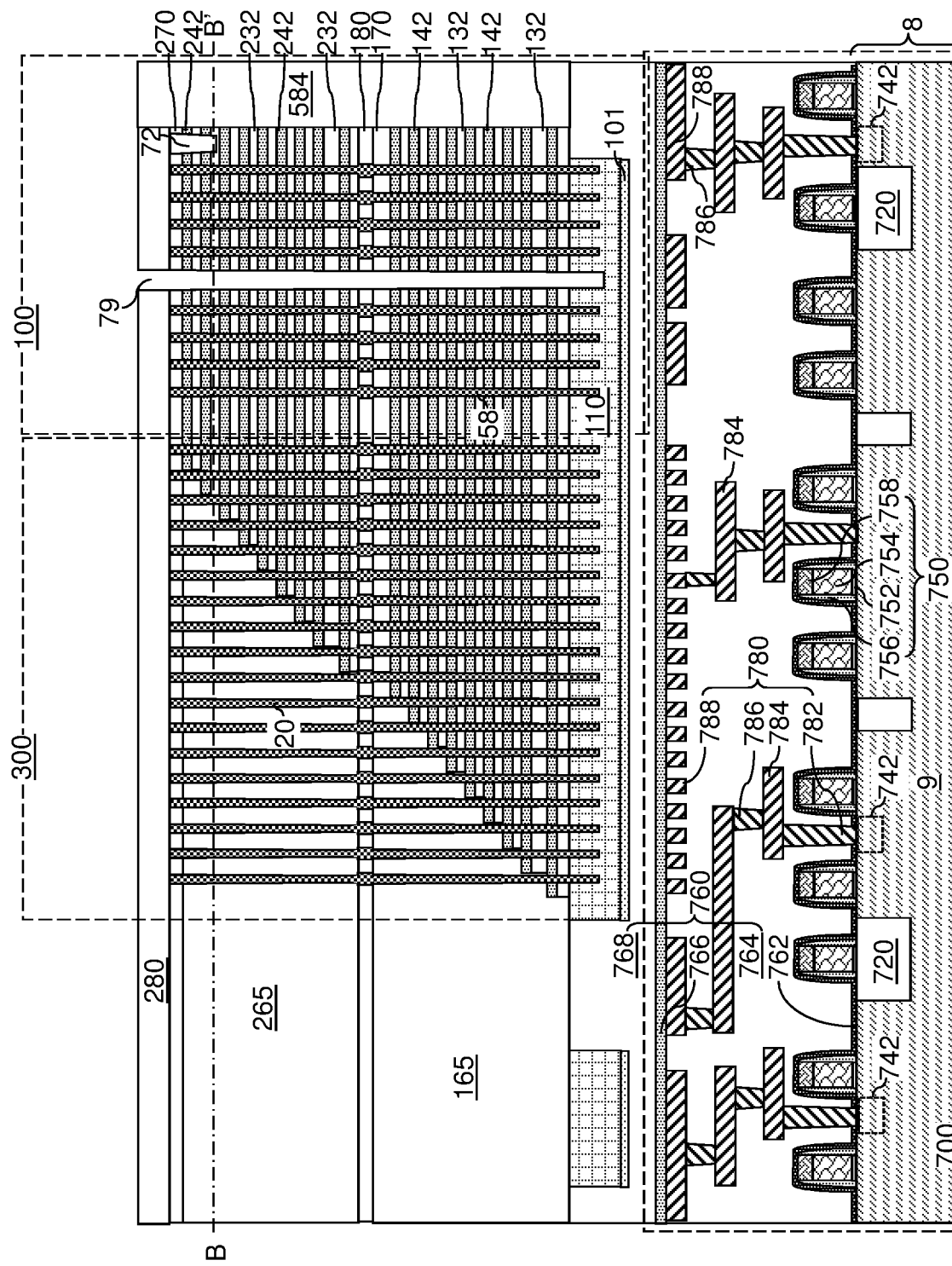
FIG. 33A is a vertical cross-sectional view of the fourth exemplary structure after formation of a first contact level dielectric layer and backside trenches according to an embodiment of the present disclosure.
Figure 33B:
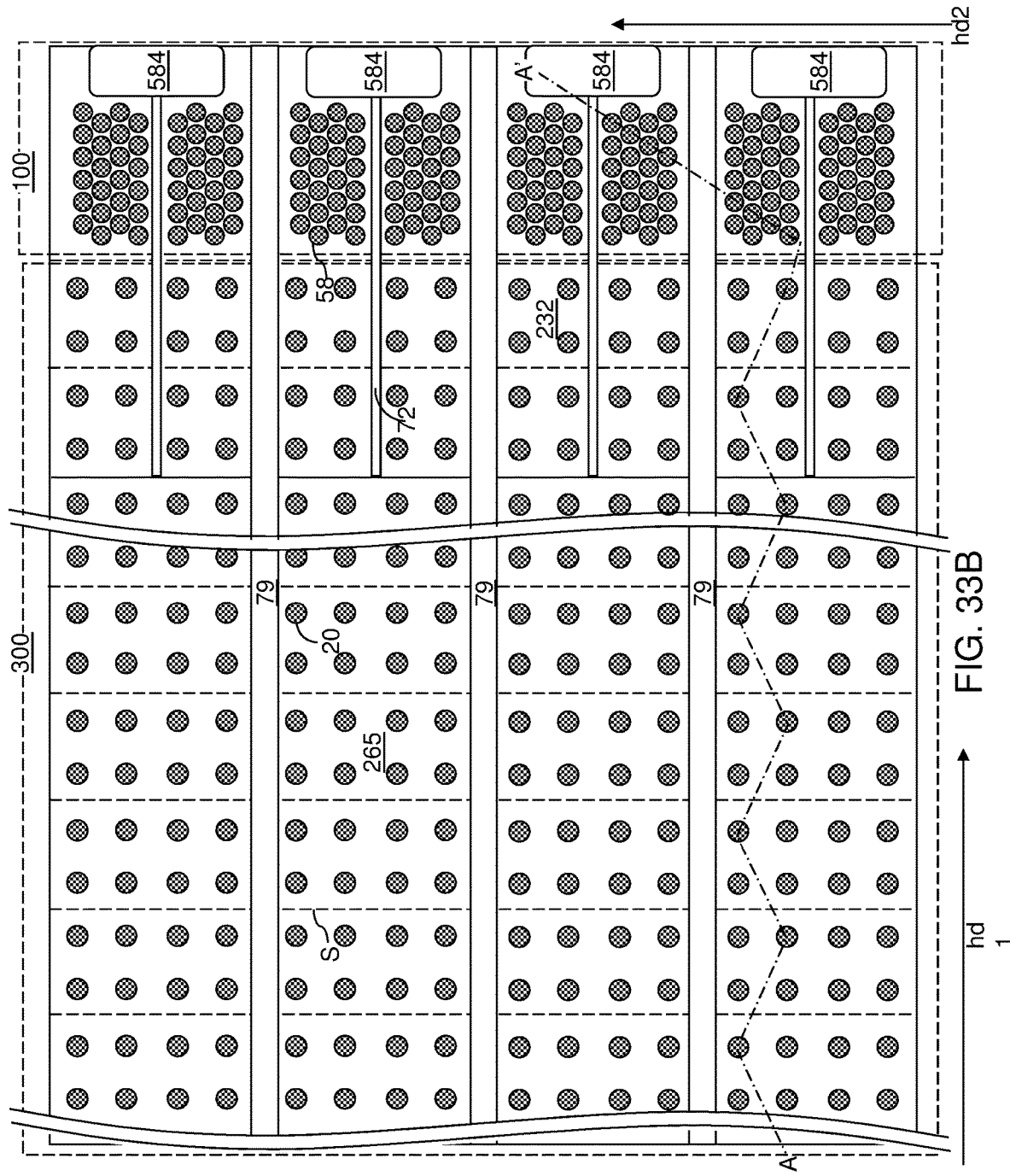
FIG. 33B is a horizontal cross-sectional view of the fourth exemplary structure along the horizontal plane B-B' of FIG. 33A. The hinged vertical plane A-A' corresponds to the plane of the vertical cross-sectional view of FIG. 33A.

Referring to FIGS. 33A and 33B, a first contact level dielectric layer 280 can be formed over the second-tier structure (232, 242, 270, 265, 72). The first contact level dielectric layer 280 includes a dielectric material such as silicon oxide, and can be formed by a conformal or non-conformal deposition process. For example, the first contact level dielectric layer 280 can include undoped silicate glass and can have a thickness in a range from 100 nm to 600 nm, although lesser and greater thicknesses can also be used.

A photoresist layer can be applied over the first contact level dielectric layer 280 and can be lithographically patterned to form elongated openings that extend along the first horizontal direction hd1 between clusters of memory opening fill structures 58. Backside trenches 79 can be formed by transferring the pattern in the photoresist layer through the first contact level dielectric layer 280, the second-tier structure (232, 242, 270, 265, 72), and the first-tier structure (132, 142, 170, 165), and into the in-process source-level material layers 110'. Portions of the first contact level dielectric layer 280, the second-tier structure (232, 242, 270, 265, 72), the first-tier structure (132, 142, 170, 165), and the in-process source-level material layers 110' that underlie the openings in the photoresist layer can be removed to form the backside trenches 79. In one embodiment, the backside trenches 79 can be formed between clusters of memory stack structures 55. The clusters of the memory stack structures 55 can be laterally spaced apart along the second horizontal direction hd2 by the backside trenches 79.

Figure 34:
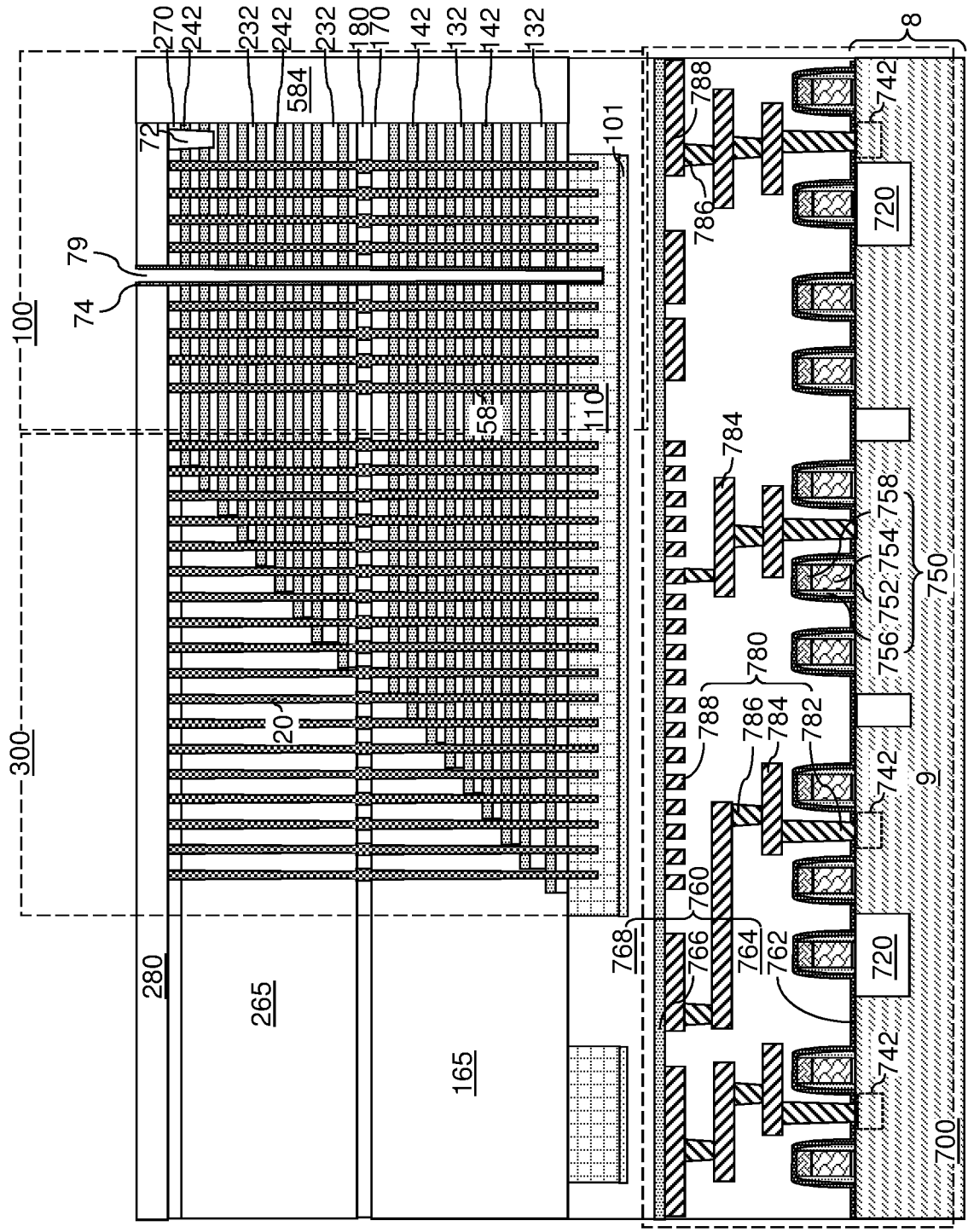
FIG. 34 is a vertical cross-sectional view of the fourth exemplary structure after formation of backside trench spacers according to an embodiment of the present disclosure.
Figure 35A:
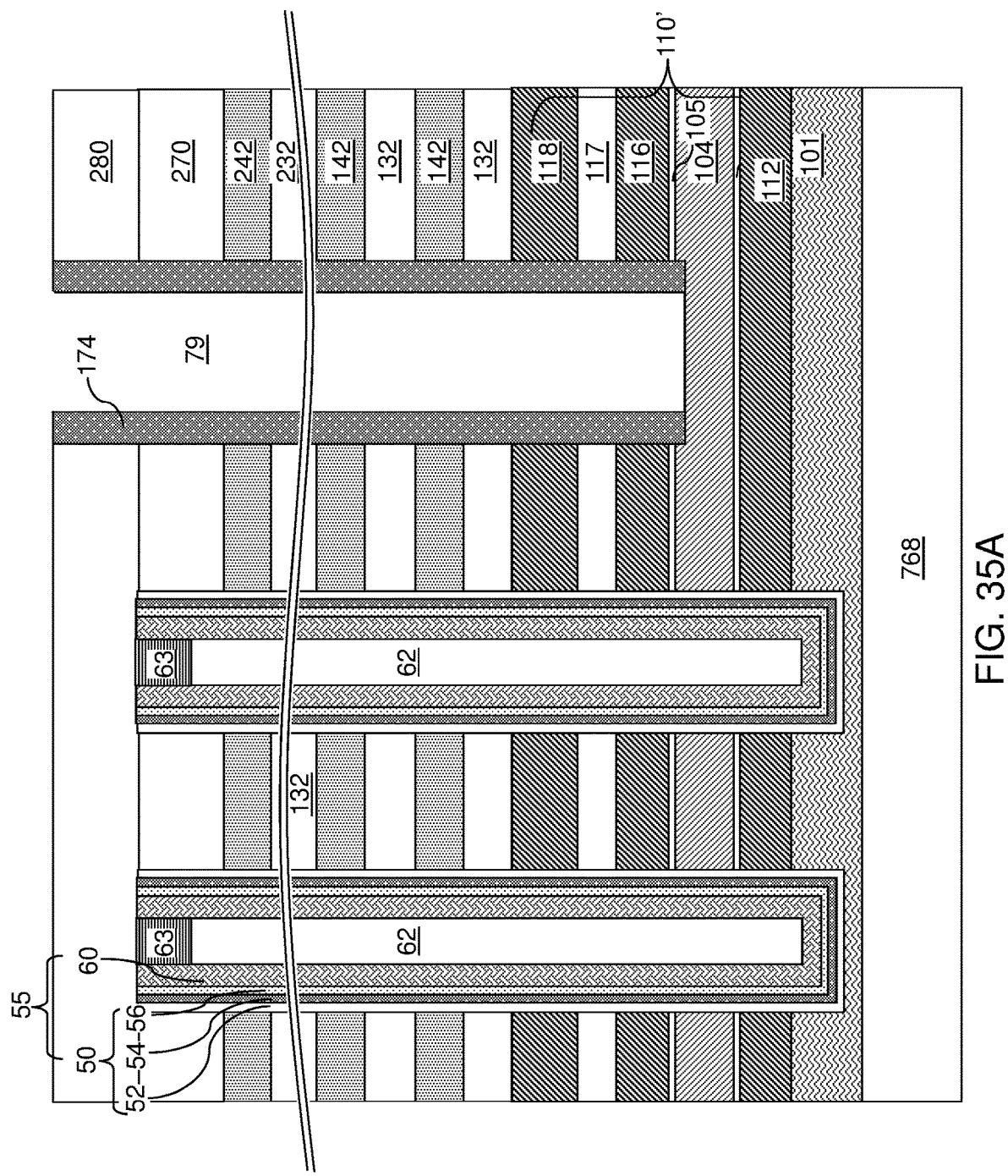
FIGS. 35A-35H illustrate sequential vertical cross-sectional views of memory opening fill structures and a backside trench during replacement of a source-level sacrificial layer and a planar sacrificial material layer with a source contact layer and a dielectric fill material layer, respectively, according to an embodiment of the present disclosure.

Referring to FIGS. 34 and 35A, a backside trench spacer 174 can be formed on sidewalls of each backside trench 79. For example, a conformal spacer material layer can be deposited in the backside trenches 79 and over the first contact level dielectric layer 280, and can be anisotropically etched to form the backside trench spacers 174. The backside trench spacers 174 include a material that is different from the material of the source-level sacrificial layer 104. For example, the backside trench spacers 174 can include silicon nitride.

Figure 35B:
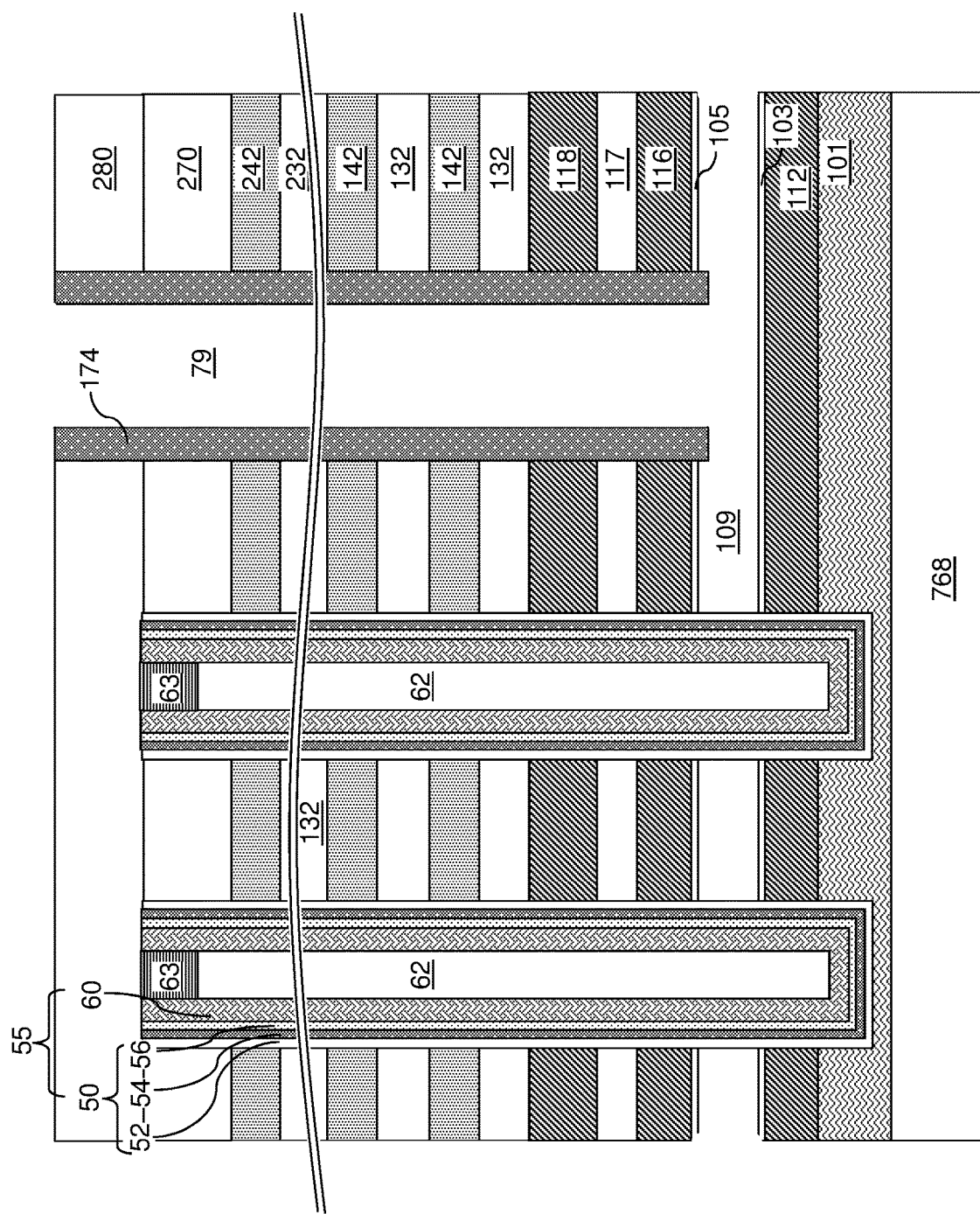

Referring to FIG. 35B, an etchant that etches the material of the source-level sacrificial layer 104 selective to the materials of the first-tier alternating stack (132, 142), the second-tier alternating stack (232, 242), the first and second insulating cap layers (170, 270), the first contact level dielectric layer 280, the upper sacrificial liner 105, and the lower sacrificial liner 103 can be introduced into the backside trenches in an isotropic etch process. For example, if the source-level sacrificial layer 104 includes undoped amorphous silicon or an undoped amorphous silicon-germanium alloy, the backside trench spacers 174 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) can be used to remove the source-level sacrificial layer 104 selective to the backside trench spacers 174 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the heavily doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 174, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and a bottom surface that are physically exposed to the source cavity 109.

Figure 35C:
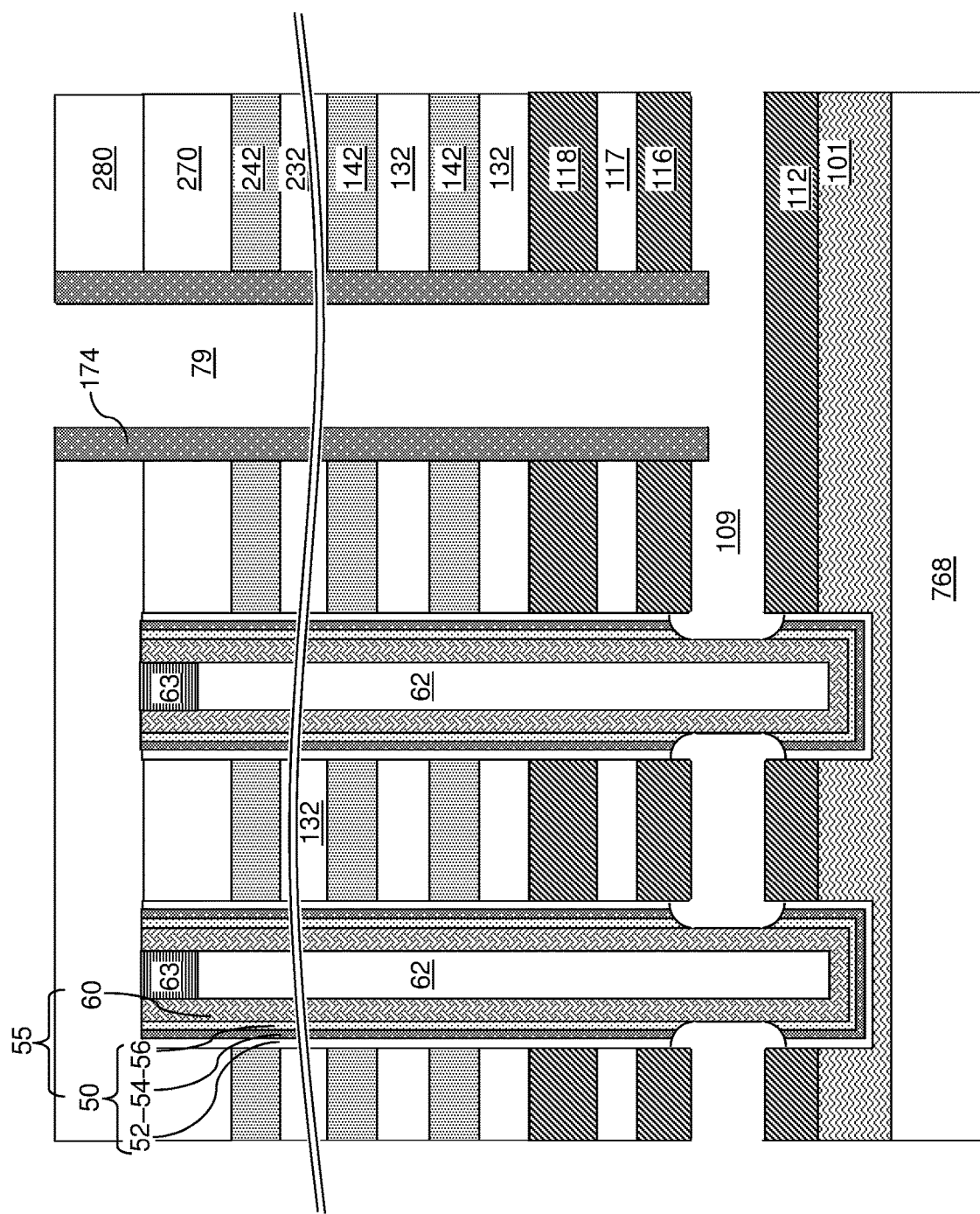

Referring to FIG. 35C, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. An annular portion of each memory film 50 can be removed to physically expose an outer sidewall of a respective underlying vertical semiconductor channel 60. A remaining portion of each memory film 50 underlying the removed annular portion of the memory film 50 is included in the lower source-level semiconductor layer 112 and the planar sacrificial material layer 101. The source cavity 109 can be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 can be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 35D:
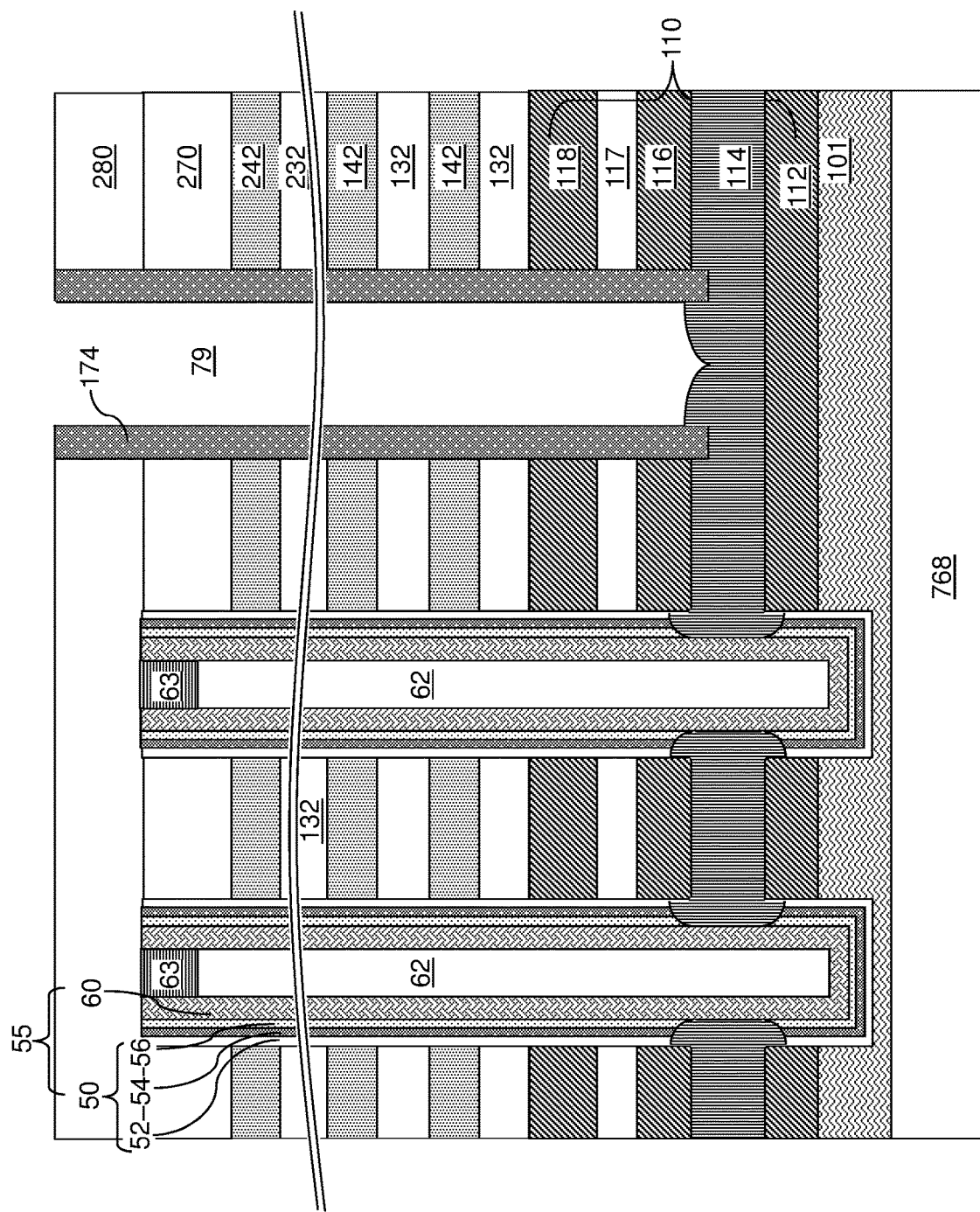

Referring to FIG. 35D, a doped semiconductor material having a doping of the second conductivity type can be deposited on the physically exposed semiconductor surfaces around the source cavity 109. The physically exposed semiconductor surfaces include bottom portions of outer sidewalls of the vertical semiconductor channels 60, a bottom surface of the upper source-level semiconductor layer 116, and a top surface of the lower source-level semiconductor layer 112. For example, the physically exposed semiconductor surfaces can include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material can be deposited on the physically exposed semiconductor surfaces around the source cavity 109 by a selective semiconductor deposition process. A semiconductor precursor gas, an etchant, and dopant precursor gas of the second conductivity type can be flowed concurrently into a process chamber including the exemplary structure during the selective semiconductor deposition process. For example, the semiconductor precursor gas can include silane, disilane, or dichlorosilane, and the etchant gas can include gaseous hydrogen chloride. In case the second conductivity type is n-type, the dopant precursor gas can include an n-type dopant gas such as phosphine, arsine, or stibine. In this case, the selective semiconductor deposition process grows a heavily doped semiconductor material from physically exposed semiconductor surfaces around the source cavity 109. The deposited doped semiconductor material forms a source contact layer 114, which can contact sidewalls of the vertical semiconductor channels 60. In one embodiment, the material of the source contact layer 114 comprises a doped semiconductor material having an atomic dopant concentration in a range from $5.0 \times 10^{19}/cm^3$ to $2.0 \times 10^{21}/cm^3$. The source-level sacrificial layer 104 and an annular portion of each memory film 50 are replaced with a source contact layer 114. The source contact layer 114 surrounds, and contacts a sidewall of, the vertical semiconductor channels 60. The source contact layer 114 as initially formed can consist essentially of semiconductor atoms and dopant atoms of the second conductivity type. Alternatively, at least one non-selective doped semiconductor material deposition process can be used to form the source contact layer 114. Optionally, one or more etch back processes may be used in combination with a plurality of selective or non-selective deposition processes to provide a seamless and/or voidless source contact layer 114.

The duration of the selective semiconductor deposition process can be selected such that the source cavity 109 is filled with the source contact layer 114, and the source contact layer 114 contacts bottom end portions of inner sidewalls of the backside trench spacers 174. In one embodiment, the source contact layer 114 can be formed by selectively depositing a heavily doped semiconductor material from semiconductor surfaces around the source cavity 109. In one embodiment, the doped semiconductor material can include doped polysilicon. Thus, the source-level sacrificial layer 104 can be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'. A portion of each memory film 50 underlying the removed annular portion of the memory film 50 is included in the lower source-level semiconductor layer 112 and the planar sacrificial material layer 101 upon replacement of the source-level sacrificial layer 104 with the source contact layer 114.

Figure 35E:
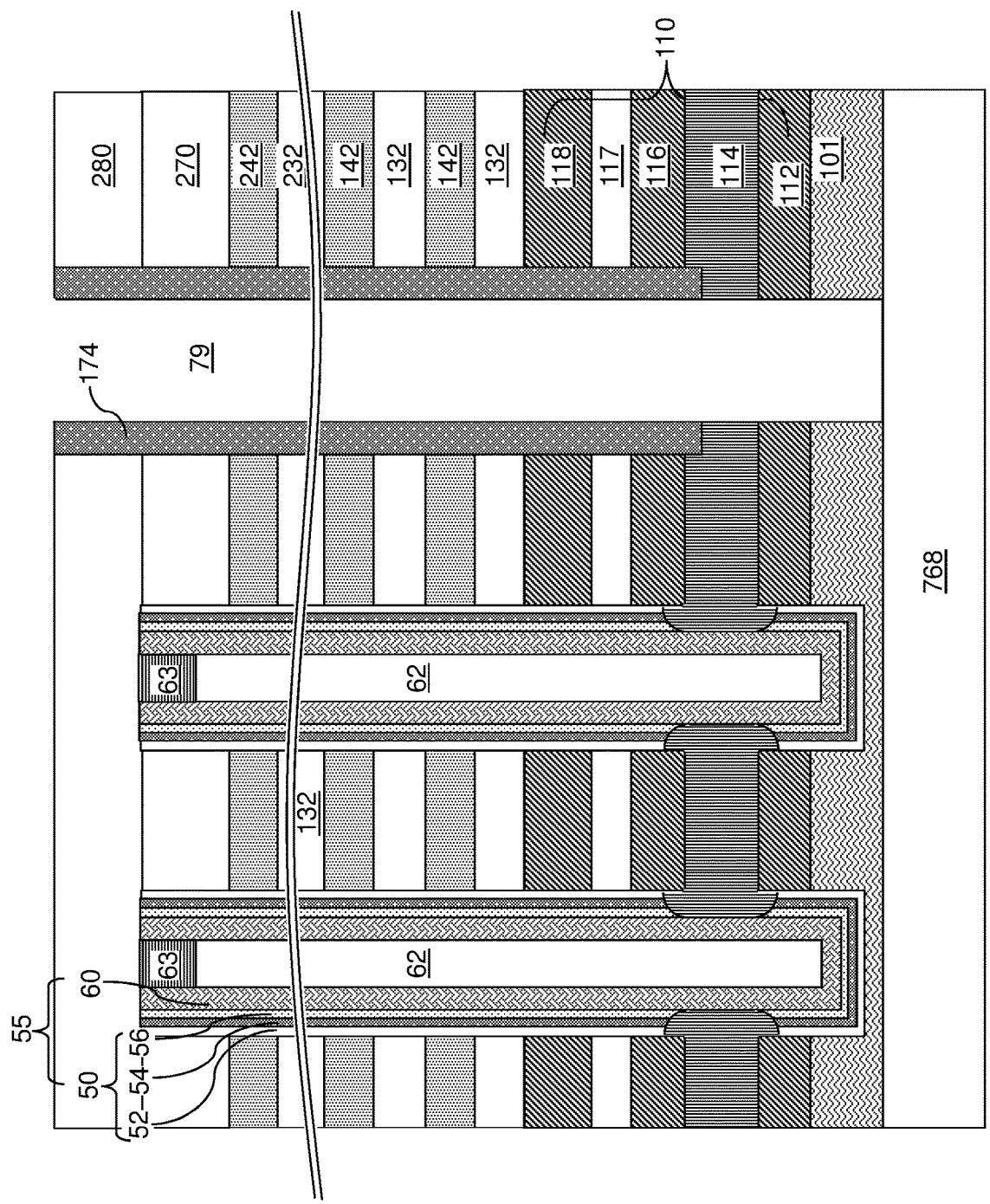

Referring to FIG. 35E, an anisotropic etch process can be performed to etch physically exposed portions of the source contact layer 114, the lower source-level semiconductor layer 112, and optionally the planar sacrificial material layer 101 selective to the materials of the first contact level dielectric layer 280 and the backside trench spacers 174. Each backside trench 79 is vertically extended into the planar sacrificial material layer 101.

Figure 35F:
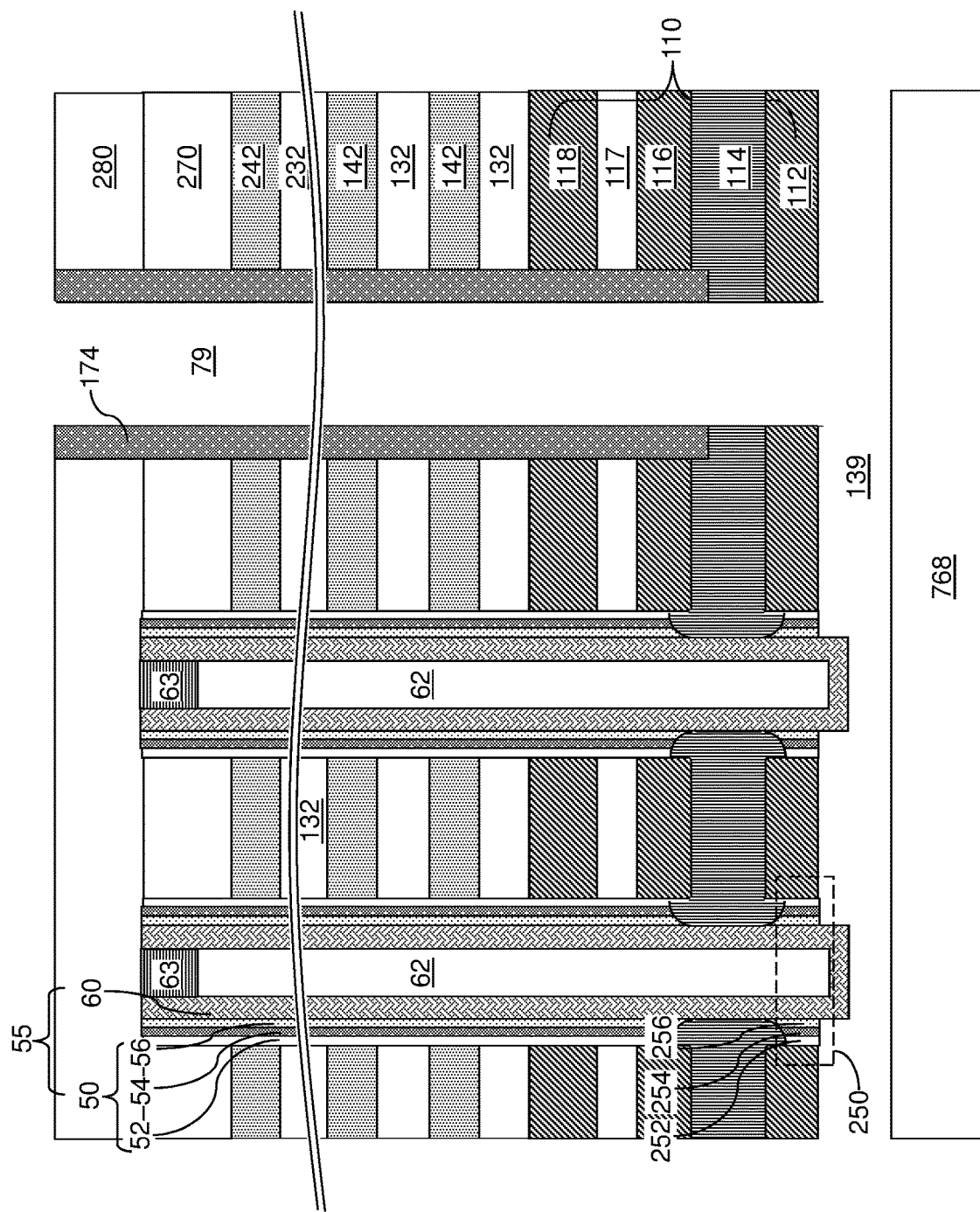

Referring to FIG. 35F, an isotropic etchant that etches the material of the planar sacrificial material layer 101 selective to the materials of the topmost layer of the at least one second dielectric layer 768, the lower source-level semiconductor layer 112, the source contact layer 114, the backside trench spacers 174, and the first contact level dielectric layer 280. In an illustrative example, if the planar sacrificial material layer 101 includes undoped amorphous silicon, a wet etch process that uses hot TMY and TMAH can be performed to etch the material of the planar sacrificial material layer 101. If the planar sacrificial material layer 101 includes borosilicate glass or organosilicate glass, a wet etch process using dilute hydrofluoric acid can be performed to etch the material of the planar sacrificial material layer 101. A laterally-extending cavity 139 is formed in the volume from which the planar sacrificial material layer 101 is removed.

A sequence of isotropic etchants, such as wet etchants, can be applied to the portions of the memory films 50 that are exposed to the laterally-extending cavity 139 to sequentially etch the various component layers of remaining portions of the memory films 50 included in the lower source-level semiconductor layer 112 from outside to inside, and to physically expose bottom surfaces of the vertical semiconductor channels 60 at the level of the laterally-extending cavity 139. A bottom portion of each remaining portion of the memory films 50 included in the lower source-level semiconductor layer 112 can be removed to physically expose the bottom surfaces of the vertical semiconductor channels 60. Each remaining portion of the memory films 50 that remains after physical exposure of bottom surfaces of the vertical semiconductor channels 60 to the laterally-extending cavity 139 constitutes an annular layer stack 250. Each annular layer stack 250 laterally surrounds a vertical semiconductor channel 60, is laterally surrounded by the lower source-level semiconductor layer 112, and contacts the source contact layer 114. Each annular layer stack 250 can include a nested layer stack, which can include, from outside to inside, a first cylindrical dielectric layer 252 having a same composition and thickness as a blocking dielectric layer 52, a second cylindrical dielectric layer 254 having a same composition and thickness as a charge storage layer 54, and a third cylindrical dielectric layer 256 having a same composition and thickness as a tunneling dielectric layer 256.

Figure 35G:
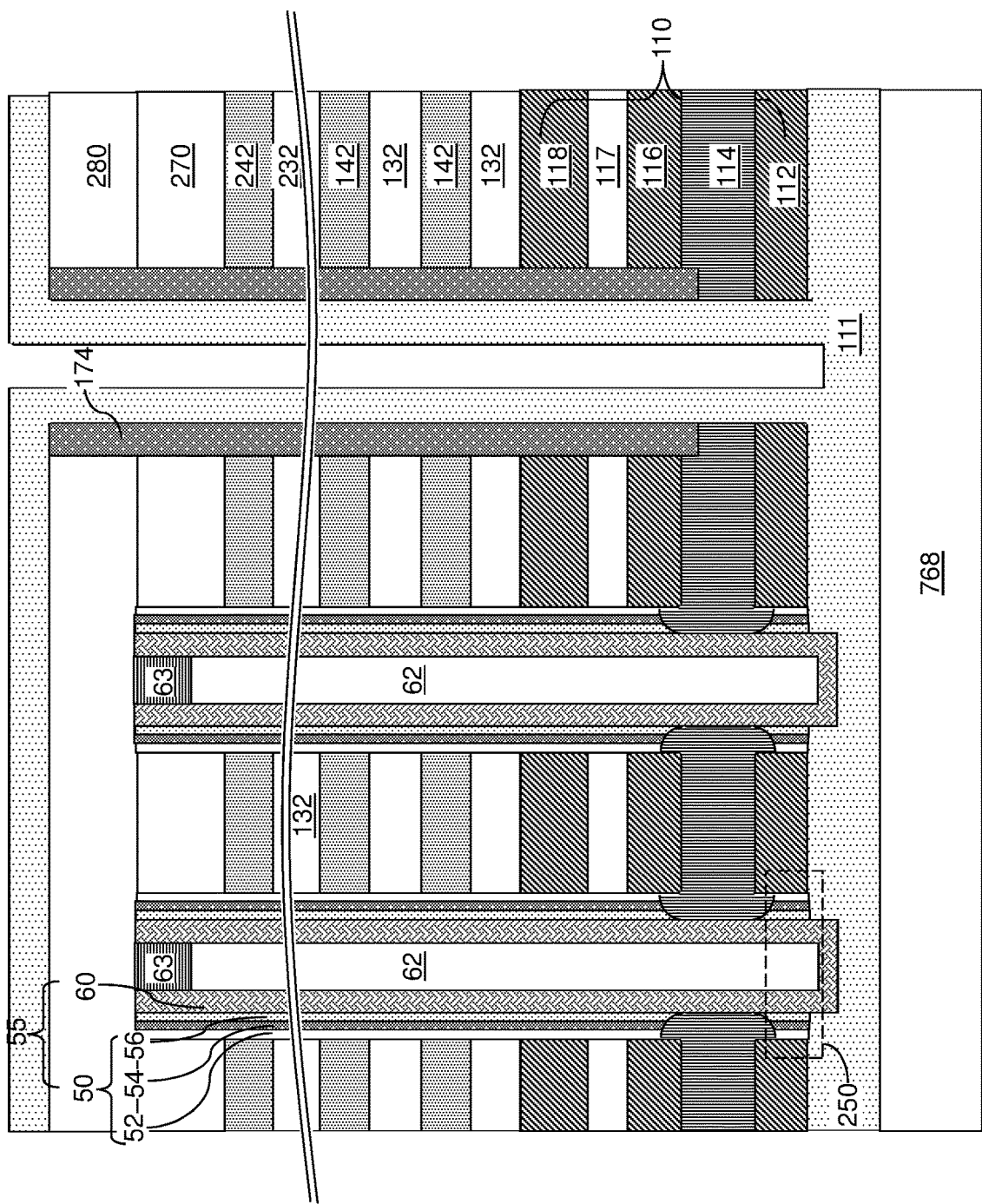

Referring to FIG. 35G, a dielectric fill material layer 111 is deposited in the laterally-extending cavity 139 by conformal deposition of a dielectric fill material having a lower Young's modulus than the semiconductor material of vertical semiconductor channels 60. Silicon is an anisotropic elasticity, and Young's modulus for silicon is in a range from 130 GPa to 170 GPa with orientation variations. Thermal silicon oxide has a Young's modulus of 66 GPa, which is lower than Young's modulus for silicon. Silicate glass materials deposited by chemical vapor deposition have lower Young's modulus values than Young's modulus values of thermal silicon oxide.

In one embodiment, the dielectric fill material layer 111 includes a dielectric fill material having a Young's modulus that is less than 70%, and/or less than 50%, of the Young's modulus of a material of the source contact layer 114. In one embodiment, the dielectric fill material of the dielectric fill material layer 111 can include a material selected from undoped silicate glass, a doped silicate glass, and organosilicate glass. The dielectric fill material can be deposited directly on the bottom surface of the vertical semiconductor channels 60, on the bottom surface of the lower source-level semiconductor layer 112, and on the top surface of the at least one second dielectric layer 768 to form the dielectric fill material layer 111. Each remaining portion of the memory films 50 that remains after replacement of the planar sacrificial material layer 101 with the dielectric fill material layer 111 comprises an annular layer stack 250 that laterally surrounds a respective vertical semiconductor channel 60, is laterally surrounded by the lower source-level semiconductor layer 112, and contacts the source contact layer 114 and the dielectric fill material layer 111.

The lower value of Young's modulus for the dielectric fill material layer 111 relative to the Young's modulus value of the source contact layer 114 enables greater vertical strain of the vertical semiconductor channels 60 because the bottom ends of the vertical semiconductor channels 60 are pressed against a material that deforms more easily than the material of the source contact layer 114 such as silicon. Thus, the vertical semiconductor channels 60 can be vertically expanded more under the effect of the vertical tensile strain induced by the electrically isolated cores 62 and/or by the stress memorization method that can be performed by a subsequent stress memorization anneal, which can be performed prior to, or after, replacement of the sacrificial material layers (142, 242) with electrically conductive layers.

Figure 35H:
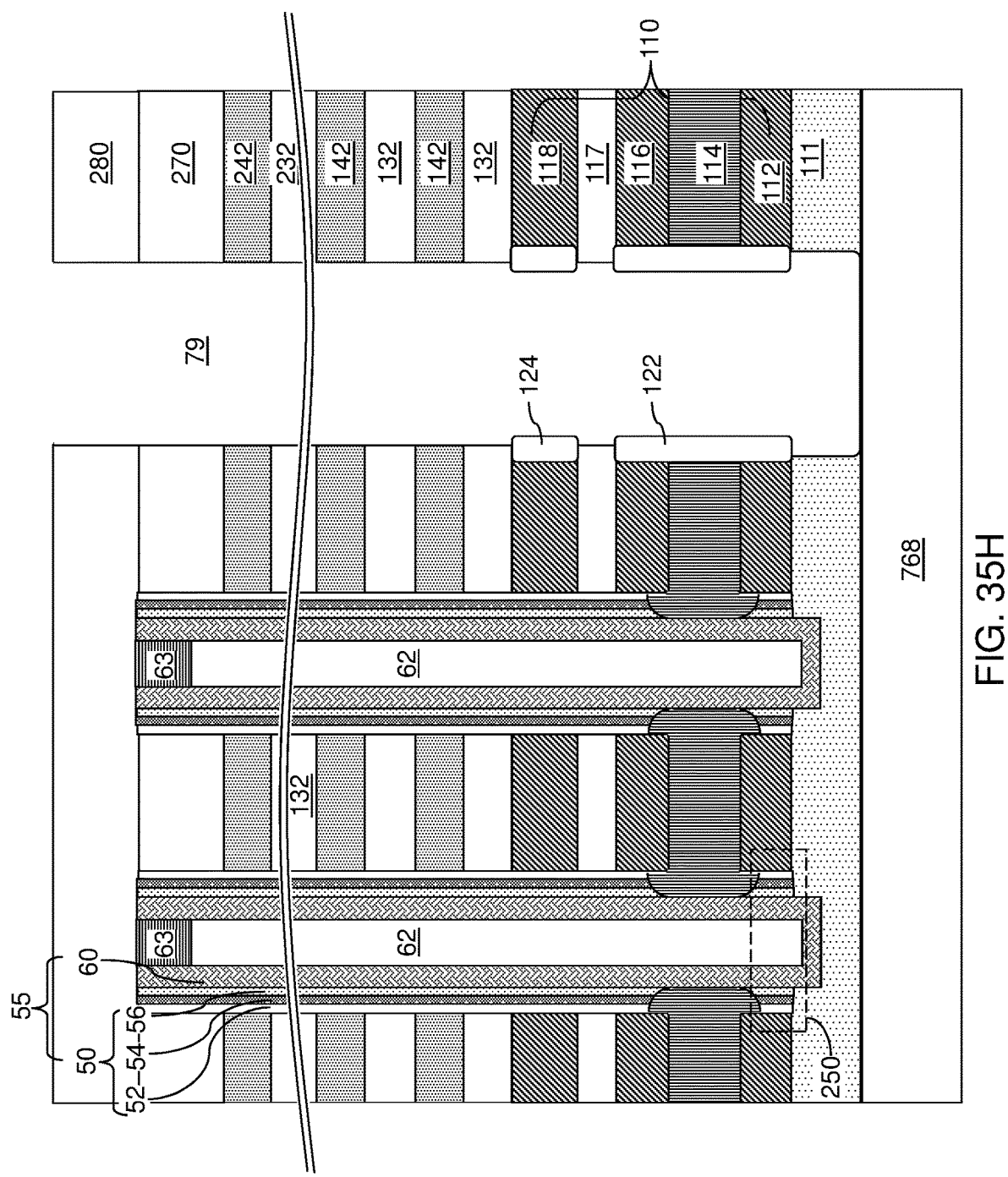
Figure 36:
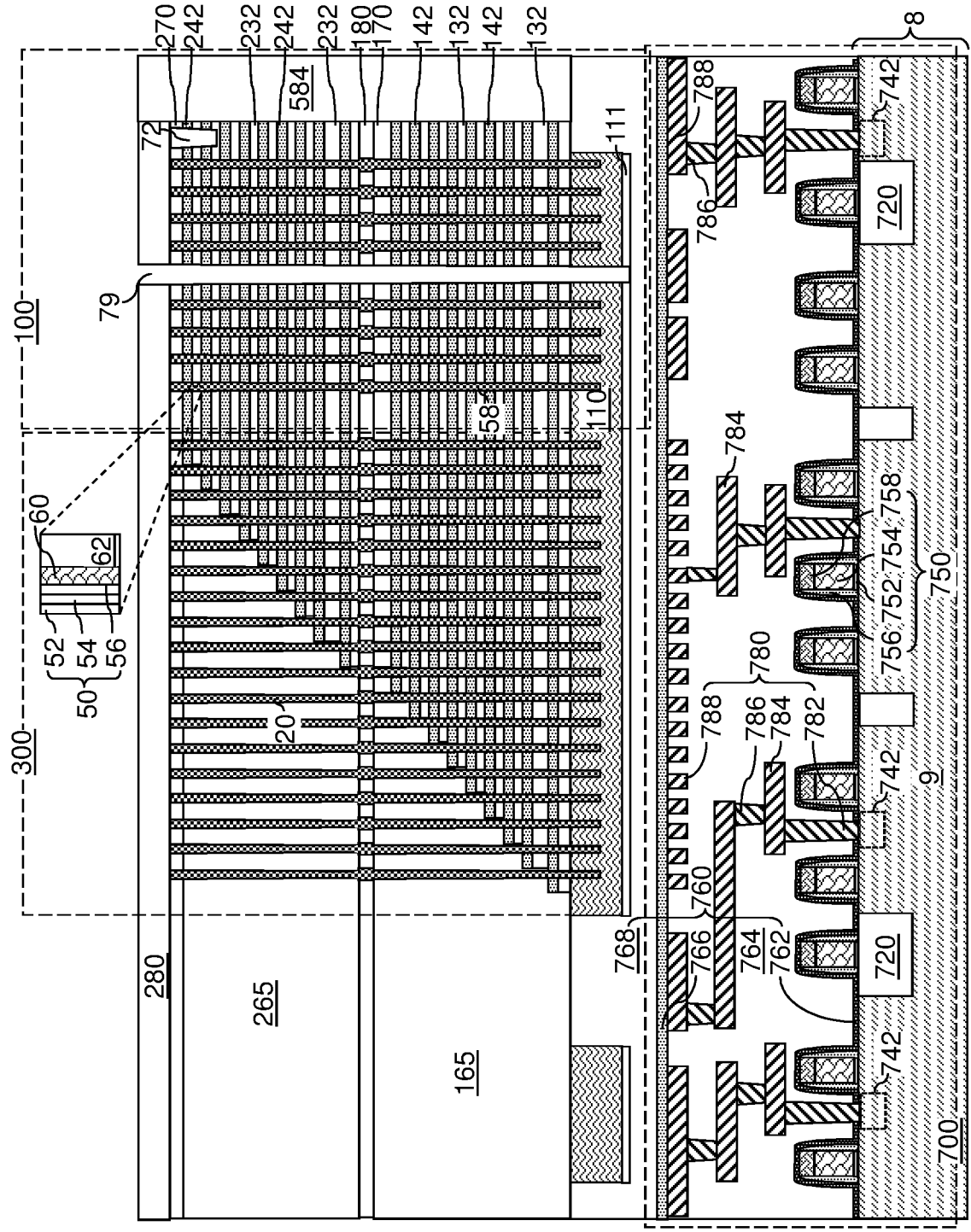
FIG. 36 is a vertical cross-sectional view of the fourth exemplary structure after formation of source-level material layers according to an embodiment of the present disclosure.

Referring to FIGS. 35H and 36, an isotropic etch process can be performed to remove portions of the dielectric fill material layer 111 located within the backside trenches 79 or above the top surface of the first contact level dielectric layer 280. For example, if the dielectric fill material layer 111 includes a silicate glass, a wet etch process using dilute hydrofluoric acid can be used to isotopically recess the dielectric fill material layer 111. The dielectric fill material layer 111 can remain in regions outside the backside trenches 79.

The backside trench spacers 174 can be removed selective to the insulating layers (132, 232), the first and second insulating cap layers (170, 270), the first contact level dielectric layer 280, and the source contact layer 114 using an isotropic etch process. For example, if the backside trench spacers 174 include silicon nitride, a wet etch process using hot phosphoric acid can be performed to remove the backside trench spacers 174. In one embodiment, the isotropic etch process that removes the backside trench spacers 174 can be combined with a subsequent isotropic etch process that etches the sacrificial material layers (142, 242) selective to the insulating layers (132, 232), the first and second insulating cap layers (170, 270), the first contact level dielectric layer 280, and the source contact layer 114.

An oxidation process can be performed to convert physically exposed surface portions of semiconductor materials into dielectric semiconductor oxide portions. For example, surfaces portions of the source contact layer 114 and the upper source-level semiconductor layer 116 can be converted into dielectric semiconductor oxide plates 122, and surface portions of the source-select-level conductive layer 118 can be converted into annular dielectric semiconductor oxide spacers 124.

Figure 37:
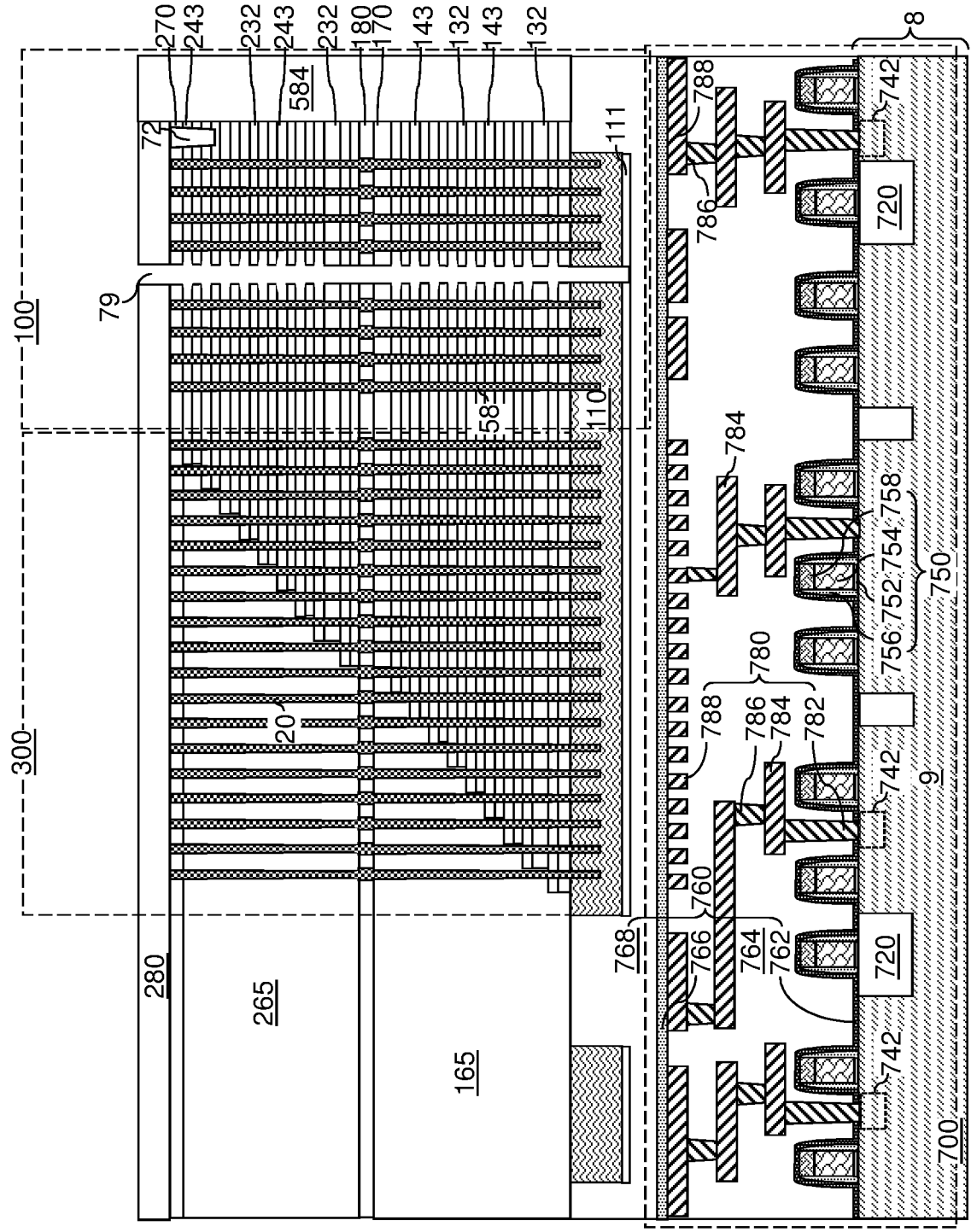
FIG. 37 is a vertical cross-sectional view of the fourth exemplary structure after formation of backside recesses according to an embodiment of the present disclosure.

Referring to FIG. 37, the sacrificial material layers (142, 242) can be removed selective to the insulating layers (132, 232), the first and second insulating cap layers (170, 270), the first contact level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 can be introduced into the backside trenches 79, for example, using an isotropic etch process. For example, the sacrificial material layers (142, 242) can include silicon nitride, the materials of the insulating layers (132, 232), the first and second insulating cap layers (170, 270), the retro-stepped dielectric material portions (165, 265), and the outermost layer of the memory films 50 can include silicon oxide materials.

The isotropic etch process can be a wet etch process using a wet etch solution, or can be a gas phase (dry) etch process in which the etchant is introduced in a vapor phase into the backside trench 79. For example, if the sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed.

The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) can be a laterally extending cavity having a lateral dimension that is greater than the vertical extent of the cavity. In other words, the lateral dimension of each of the backside recesses (143, 243) can be greater than the height of the respective backside recess (143, 243). A plurality of backside recesses (143, 243) can be formed in the volumes from which the material of the sacrificial material layers (142, 242) is removed. Each of the backside recesses (143, 243) can extend substantially parallel to the top surface of the substrate semiconductor layer 9. A backside recess (143, 243) can be vertically bounded by a top surface of an underlying insulating layer (132, 232) and a bottom surface of an overlying insulating layer (132, 232). In one embodiment, each of the backside recesses (143, 243) can have a uniform height throughout.

Figure 38:
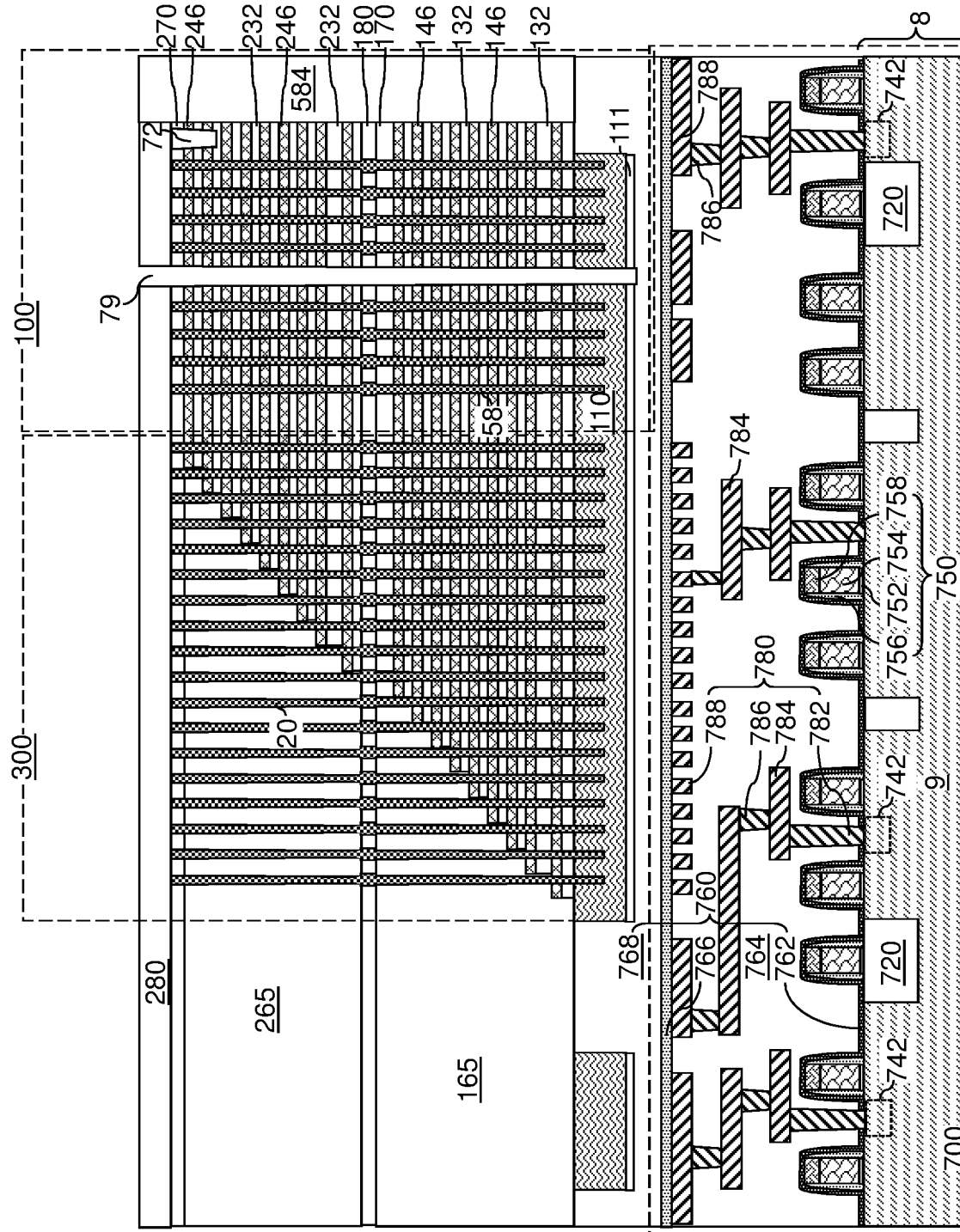
FIG. 38 is a vertical cross-sectional view of the fourth exemplary structure after formation of electrically conductive layers according to an embodiment of the present disclosure.
Figure 39A:
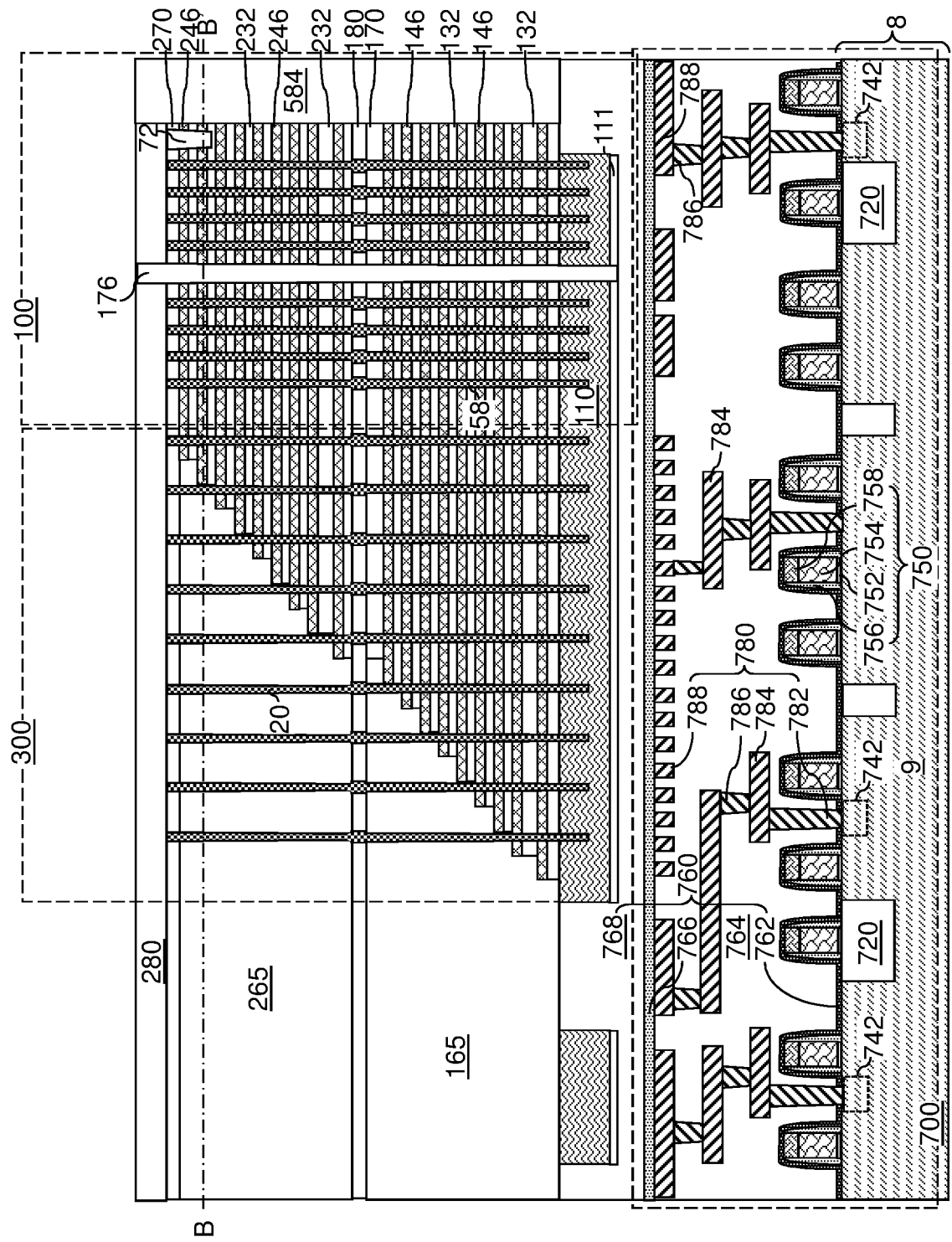
FIG. 39A is a vertical cross-sectional view of the fourth exemplary structure after formation of dielectric wall structures in the backside trenches according to an embodiment of the present disclosure.
Figure 39C:
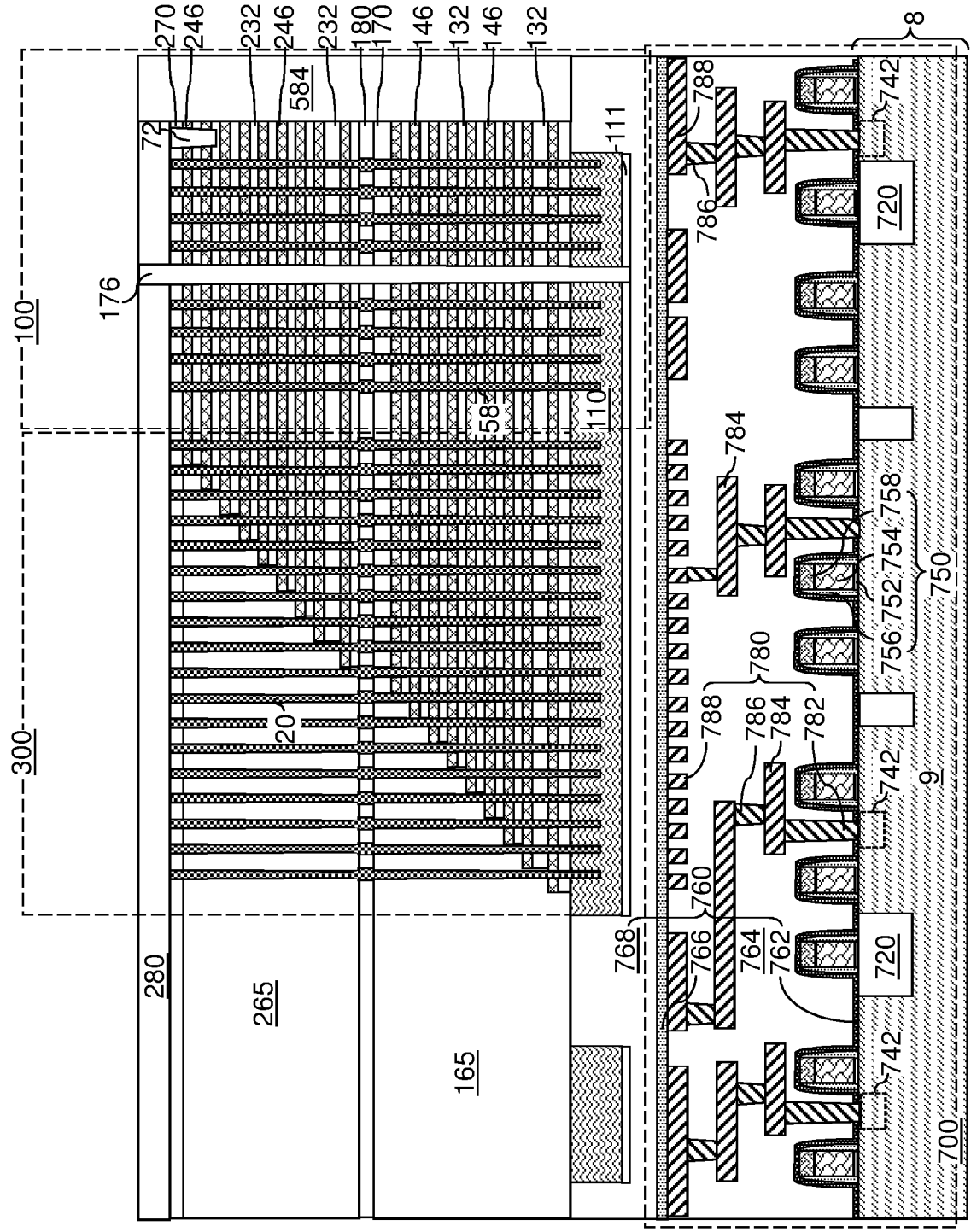
FIG. 39C is a vertical cross-sectional view of the fourth exemplary structure along the vertical plane C-C' of FIG. 39B.
Figure 39D:
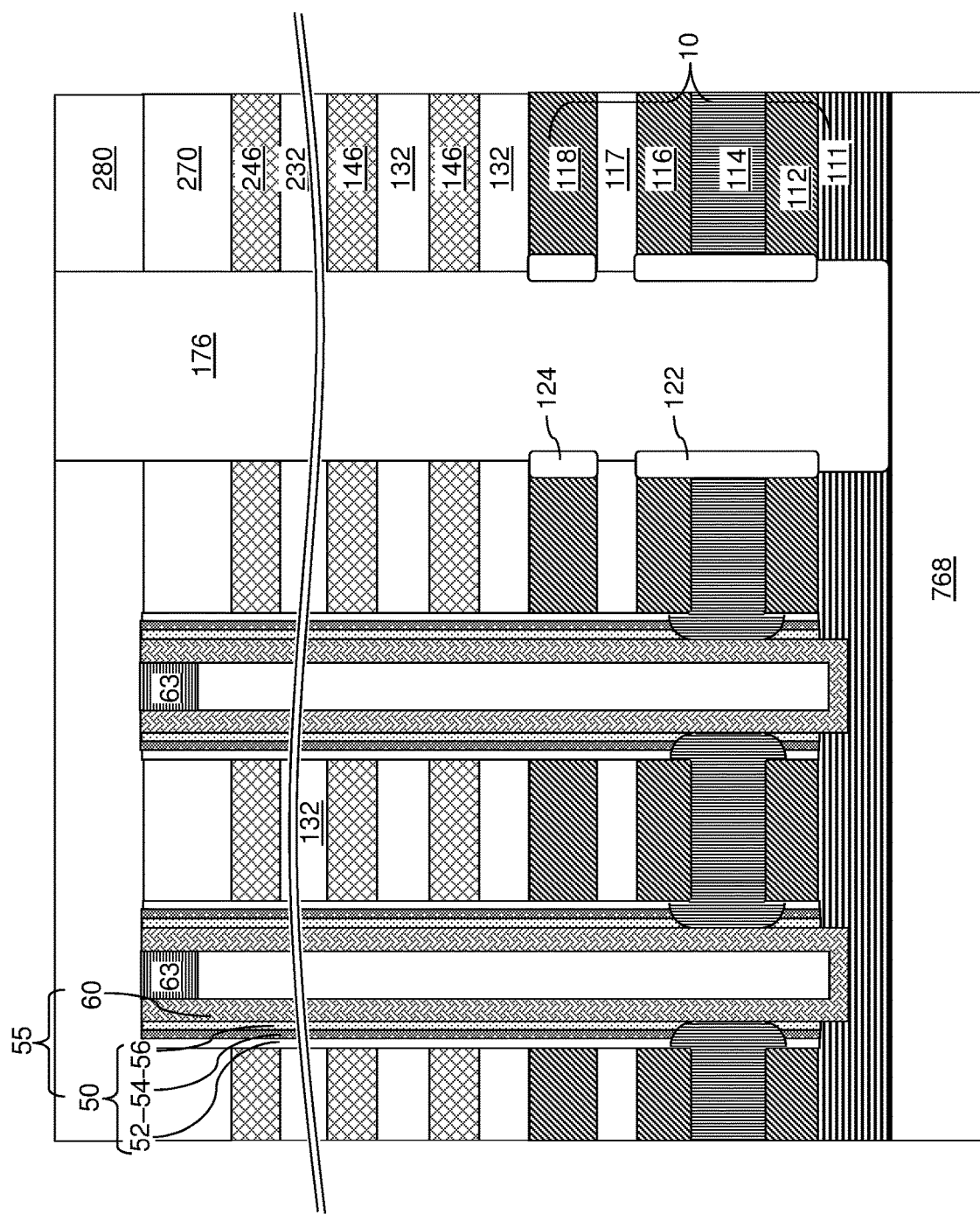
FIG. 39D is a vertical cross-sectional view of memory opening fill structures and a backside trench at the processing steps of FIGS. 39A-39C.

Referring to FIG. 38, a backside blocking dielectric layer (not shown) can be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer can include aluminum oxide. The backside blocking dielectric layer can be formed by a conformal deposition process such as atomic layer deposition or chemical vapor deposition. The thickness of the backside blocking dielectric layer can be in a range from 1 nm to 20 nm, such as from 2 nm to 10 nm, although lesser and greater thicknesses can also be used.

At least one conductive material can be deposited in the plurality of backside recesses (243, 243), on the sidewalls of the backside trenches 79, and over the first contact level dielectric layer 280. The at least one conductive material can be deposited by a conformal deposition method, which can be, for example, chemical vapor deposition (CVD), atomic layer deposition (ALD), electroless plating, electroplating, or a combination thereof. The at least one conductive material can include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material can include at least one metallic material, i.e., an electrically conductive material that includes at least one metallic element. Non-limiting exemplary metallic materials that can be deposited in the backside recesses (143, 243) include tungsten, tungsten nitride, titanium, titanium nitride, tantalum, tantalum nitride, cobalt, and ruthenium. For example, the at least one conductive material can include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) can be a combination of titanium nitride layer and a tungsten fill material.

Electrically conductive layers (146, 246) can be formed in the backside recesses (143, 243) by deposition of the at least one conductive material. A plurality of first electrically conductive layers 146 can be formed in the plurality of first backside recesses 143, a plurality of second electrically conductive layers 246 can be formed in the plurality of second backside recesses 243, and a continuous electrically conductive material layer (not shown) can be formed on the sidewalls of each backside trench 79 and over the first contact level dielectric layer 280. Each of the first electrically conductive layers 146 and the second electrically conductive layers 246 can include a respective conductive metallic nitride liner and a respective conductive fill material. Thus, the first and second sacrificial material layers (142, 242) can be replaced with the first and second electrically conductive layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous electrically conductive material layer.

Residual conductive material can be removed from inside the backside trenches 79. Specifically, the deposited metallic material of the continuous electrically conductive material layer can be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246.

Each electrically conductive layer (146, 246) can be a conductive sheet including openings therein. A first subset of the openings through each electrically conductive layer (146, 246) can be filled with memory opening fill structures 58. A second subset of the openings through each electrically conductive layer (146, 246) can be filled with the support pillar structures 20. Each electrically conductive layer (146, 246) can have a lesser area than any underlying electrically conductive layer (146, 246) because of the first and second stepped surfaces. Each electrically conductive layer (146, 246) can have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 39A-39D, a dielectric material is deposited in the backside trenches 79 to form dielectric wall structures 176. Each of the dielectric wall structures 176 can laterally extend along the first horizontal direction hd1 and can vertically extend through each layer of an alternating stack of the insulating layers (132, 232) and the electrically conductive layers (146, 246). Each dielectric wall structure 176 can contact sidewalls of the first and second insulating cap layers (170, 270).

In one embodiment, a vertical tensile stress within the vertical semiconductor channels 60 can be generated by using a compressive-stress-generating material for the electrically conductive layers (146, 246). In one embodiment, a stress memorization anneal process can be performed to transfer and stabilize the vertical tensile strain induced on the vertical semiconductor channels 60 by the vertical tensile stress and lateral compress stress generated by the electrically conductive layers (146, 246).

Figure 40A:
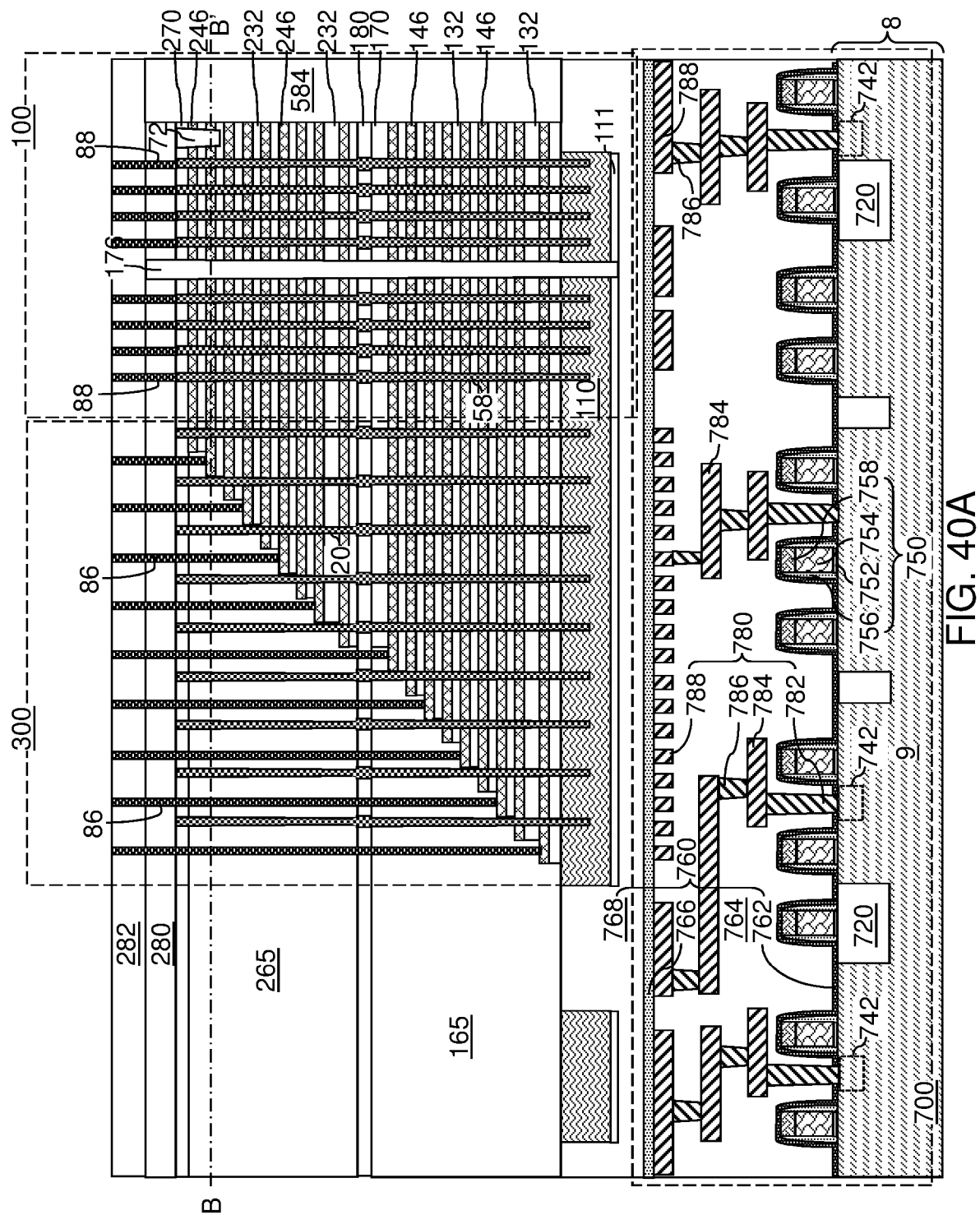
FIG. 40A is a vertical cross-sectional view of the fourth exemplary structure after formation of a second contact level dielectric layer and various contact via structures according to an embodiment of the present disclosure.
Figure 40B:
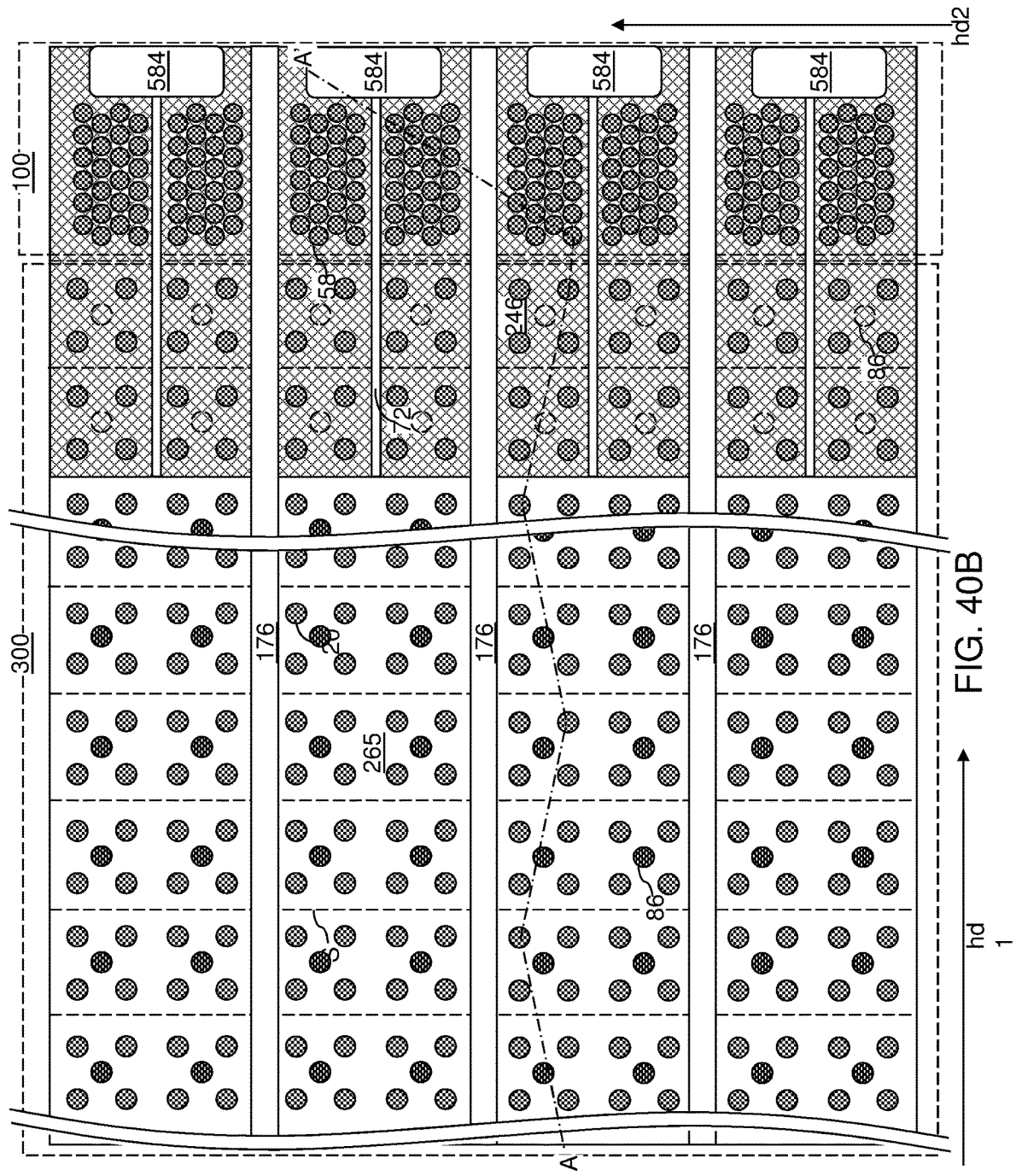
FIG. 40B is a horizontal cross-sectional view of the fourth exemplary structure along the vertical plane B-B' of FIG. 40A. The hinged vertical plane A-A' corresponds to the plane of the vertical cross-sectional view of FIG. 40A.

Referring to FIGS. 40A and 40B, a second contact level dielectric layer 282 may be formed over the first contact level dielectric layer 280. The second contact level dielectric layer 282 includes a dielectric material such as silicon oxide, and can have a thickness in a range from 100 nm to 600 nm, although lesser and greater thicknesses can also be used.

A photoresist layer can be applied over the second contact level dielectric layer 282, and can be lithographically patterned to form various contact via openings. For example, openings for forming drain contact via structures can be formed in the memory array region 100, and openings for forming staircase region contact via structures can be formed in the staircase region 300. An anisotropic etch process is performed to transfer the pattern in the photoresist layer through the second and first contact level dielectric layers (282, 280) and underlying dielectric material portions. The drain regions 63 and the electrically conductive layers (146, 246) can be used as etch stop structures. Drain contact via cavities can be formed over each drain region 63, and staircase-region contact via cavities can be formed over each electrically conductive layer (146. 246) at the stepped surfaces underlying the first and second retro-stepped dielectric material portions (165, 265). The photoresist layer can be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 can include drain select level contact via structures that contact a subset of the second electrically conductive layers 246 that function as drain select level gate electrodes. Further, the staircase-region contact via structures 86 can include word line contact via structures that contact electrically conductive layers (146, 246) that underlie the drain select level gate electrodes and function as word lines for the memory stack structures 55.

Figure 41:
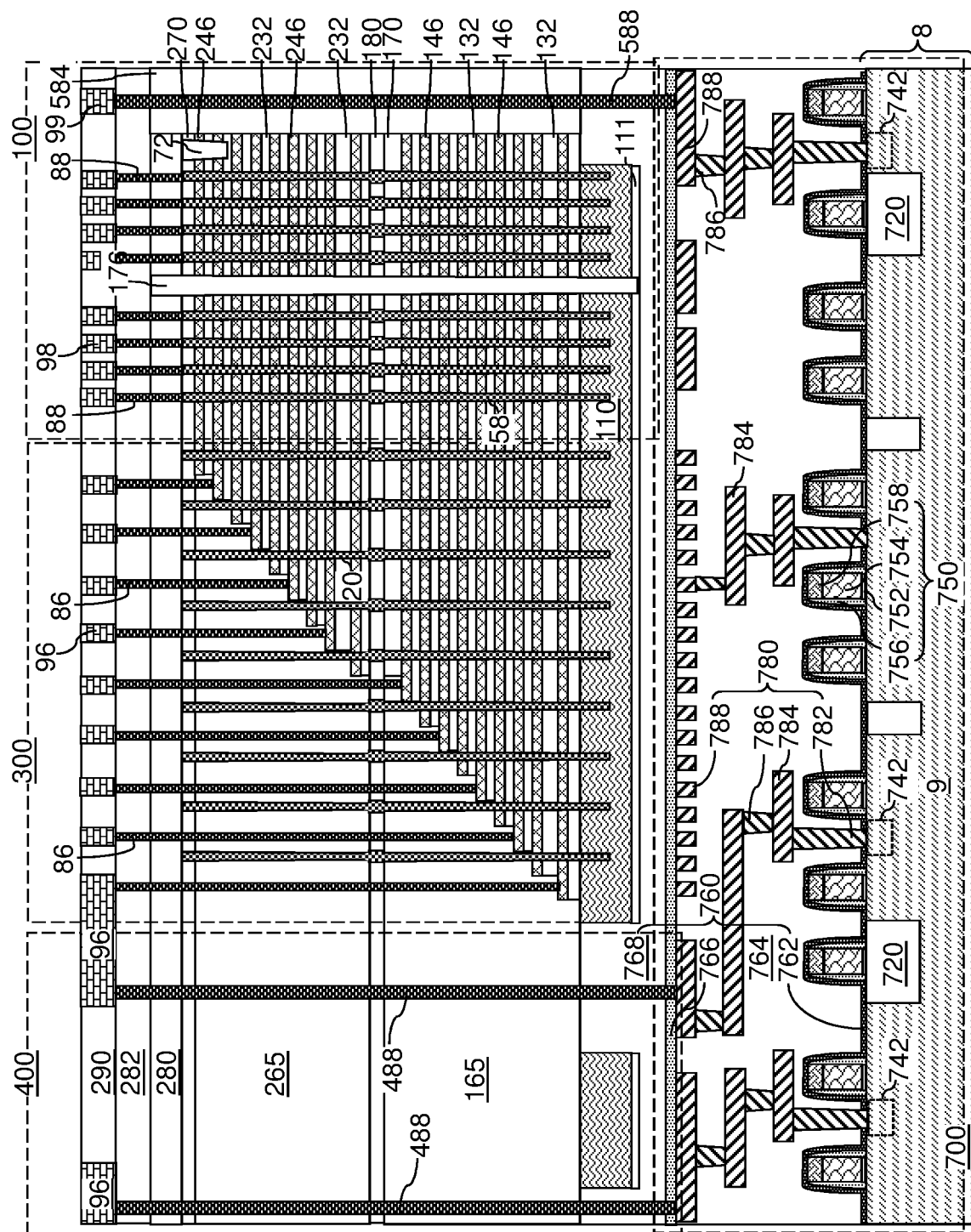
FIG. 41 is a vertical cross-sectional view of the fourth exemplary structure after formation of through-memory-level via structures and upper metal line structures according to an embodiment of the present disclosure.

Referring to FIG. 41, peripheral-region via cavities can be formed through the second and first contact level dielectric layers (282, 280), the second and first retro-stepped dielectric material portions (265, 165), and the at least one second dielectric layer 768 to top surfaces of the lower metal interconnect structure 780 in the peripheral region 400. Interconnection-region via cavities can be formed through the interconnection-region dielectric fill material portions 584 to a top surface of a respective one of the lower-level metal interconnect structures 780. At least one conductive material can be deposited in the peripheral-region via cavities to form peripheral-region contact via structures 488. At least one conductive material can be deposited in the interconnection-region via cavities to form interconnection-region contact via structures 588.

At least one additional dielectric layer can be formed over the contact level dielectric layers (280, 282), and additional metal interconnect structures (herein referred to as upper-level metal interconnect structures) can be formed in the at least one additional dielectric layer. For example, the at least one additional dielectric layer can include a line-level dielectric layer 290 that is formed over the contact level dielectric layers (280, 282). The upper-level metal interconnect structures can include bit lines 98 contacting, or electrically connected to, a respective one of the drain contact via structures 88, first interconnection line structures 96 contacting, and/or electrically connected to, at least one of the staircase-region contact via structures 86 and/or the peripheral-region contact via structures 488, and second interconnection line structures 98 contacting, and/or electrically connected to, a respective one of the interconnection-region contact via structures 588.

Referring to all drawings related to the fourth exemplary structure and according to various embodiments of the present disclosure, a three-dimensional memory device is provided, which comprises: an alternating stack of insulating layers (132, 232) and electrically conductive layers (146, 246) located over a substrate 8; a memory stack structure 55 vertically extending through the alternating stack, wherein the memory stack structure 55 comprises a memory film 50 that contains a vertical stack of memory elements located at levels of the electrically conductive layers 46 (for example, as annular portions of a charge storage layer 54), and a vertical semiconductor channel 60 that contacts the memory film 50; a source contact layer 114 underlying the alternating stack and laterally surrounding, and contacting a sidewall of, the vertical semiconductor channel 60; and a dielectric fill material layer 111 underlying the source contact layer 114 and including a dielectric fill material having a Young's modulus that is less than 70% of a Young's modulus of a material of the source contact layer 114.

In one embodiment, the vertical semiconductor channel 60 is under a vertical tensile stress.

In one embodiment, the electrically conductive layers (146, 246) comprise a compressive-stress-generating material that applies a lateral compressive stress to the vertical semiconductor channel 60. In one embodiment, the dielectric fill material layer 111 comprises a material selected from undoped silicate glass, a doped silicate glass, and organosilicate glass.

In one embodiment, the source contact layer 114 comprises a doped semiconductor material having an atomic dopant concentration in a range from $5.0 \times 10^{19}/cm^3$ to $2.0 \times 10^{21}/cm^3$.

In one embodiment, a lower source-level semiconductor layer 112 is provided, which includes another doped semiconductor material, contacts a bottom surface of the source contact layer 114, and contacts a top surface of the dielectric fill material layer 111.

In one embodiment, the memory film 50 comprises a first layer stack including a charge storage layer 54 and a tunneling dielectric layer 56; and an annular layer stack 250 laterally surrounds the vertical semiconductor channel 60, is laterally surrounded by the lower source-level semiconductor layer, and contacts the source contact layer 114 and the dielectric fill material layer 111, wherein the annular layer stack 250 comprises a material layer having a same composition and a same thickness as the charge storage layer 54 and another material layer having a same composition and a same thickness as the tunneling dielectric layer 56.

In one embodiment, the memory stack structure 55 comprises a vertical NAND string; the alternating stack comprises a terrace region in which each electrically conductive layer (146, 246) other than a topmost electrically conductive layer (146, 246) within the alternating stack laterally extends farther than any overlying electrically conductive layer (146, 246) within the alternating stack; the terrace region includes stepped surfaces of the alternating stack that continuously extend from a bottommost layer within the alternating stack to a topmost layer within the alternating stack; and the electrically conductive layers (146, 246) comprise word lines for the vertical NAND string.

The various embodiments of the present disclosure provide vertical semiconductor channels providing enhanced charge carrier mobility through vertical tensile strain induced by a primary lateral compressive stress and a secondary vertical tensile stress derived from the primary lateral compressive stress through Poisson effect. The enhanced charge carrier mobility can increase the on-current through the vertical semiconductor channels 60, thereby permitting vertical stacking of more electrically conductive layers and/or reduction of feature sizes in a three-dimensional memory device.

Although the foregoing refers to particular preferred embodiments, it will be understood that the claims are not so limited. Various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
a memory stack structure vertically extending through the alternating stack, wherein the memory stack structure comprises a memory film that contains a vertical stack of memory elements located at levels of the electrically conductive layers, and a vertical semiconductor channel that contacts the memory film;
a source contact layer underlying the alternating stack and laterally surrounding, and contacting a sidewall of, the vertical semiconductor channel; and
a dielectric fill material layer underlying the source contact layer and including a dielectric fill material having a Young's modulus that is less than 70% of a Young's modulus of a material of the source contact layer.

2. The three-dimensional memory device of claim 1, wherein the vertical semiconductor channel is under a vertical tensile stress.

3. The three-dimensional memory device of claim 2, wherein the electrically conductive layers comprise a compressive-stress-generating material that applies a lateral compressive stress to the vertical semiconductor channel.

4. The three-dimensional memory device of claim 1, wherein the dielectric fill material layer comprises a material selected from undoped silicate glass, a doped silicate glass, or organosilicate glass.

5. The three-dimensional memory device of claim 4, wherein the source contact layer comprises a doped semiconductor material having an atomic dopant concentration in a range from $5.0\times10^{19}/cm^3$ to $2.0\times10^{21}/cm^3$.

6. The three-dimensional memory device of claim 5, further comprising a lower source-level semiconductor layer comprising another doped semiconductor material, contacting a bottom surface of the source contact layer, and contacting a top surface of the dielectric fill material layer.

7. The three-dimensional memory device of claim 6, wherein:
the memory film comprises a first layer stack including a charge storage layer and a tunneling dielectric layer; and
an annular layer stack laterally surrounds the vertical semiconductor channel, is laterally surrounded by the lower source-level semiconductor layer, and contacts the source contact layer and the dielectric fill material layer, wherein the annular layer stack comprises a material layer having a same composition and a same thickness as the charge storage layer and another material layer having a same composition and a same thickness as the tunneling dielectric layer.

8. The three-dimensional memory device of claim 1, wherein:
the memory stack structure comprises a vertical NAND string;
the alternating stack comprises a terrace region in which each electrically conductive layer other than a topmost electrically conductive layer within the alternating stack laterally extends farther than any overlying electrically conductive layer within the alternating stack;
the terrace region includes stepped surfaces of the alternating stack that continuously extend from a bottommost layer within the alternating stack to a topmost layer within the alternating stack; and
the electrically conductive layers comprise word lines for the vertical NAND string.

* * * * *